United States Patent [19]
Moon

[11] Patent Number: 5,971,734
[45] Date of Patent: Oct. 26, 1999

[54] MOLD FOR BALL GRID ARRAY SEMICONDUCTOR PACKAGE

[75] Inventor: Young Yeob Moon, Kyungki-Do, Rep. of Korea

[73] Assignees: Anam Semiconductor Inc., Seoul, Rep. of Korea; Amkor Technology, Inc., Chandler, Ariz.

[21] Appl. No.: 08/934,315

[22] Filed: Sep. 19, 1997

[30] Foreign Application Priority Data

| Sep. 21, 1996 | [KR] | Rep. of Korea | 96-41469 |
| Sep. 21, 1996 | [KR] | Rep. of Korea | 96-41470 |
| Sep. 21, 1996 | [KR] | Rep. of Korea | 96-41471 |
| Sep. 21, 1996 | [KR] | Rep. of Korea | 96-41472 |
| Nov. 28, 1996 | [KR] | Rep. of Korea | 96-58810 |
| Nov. 28, 1996 | [KR] | Rep. of Korea | 96-58811 |
| Nov. 28, 1996 | [KR] | Rep. of Korea | 96-58815 |
| Nov. 28, 1996 | [KR] | Rep. of Korea | 96-58816 |

[51] Int. Cl.$^6$ .................... B29C 45/02; B29C 45/14
[52] U.S. Cl. .................... 425/121; 425/117; 425/127; 425/183; 264/272.17
[58] Field of Search .................... 425/116, 117, 425/125, 127, 183, 544, 121, 588; 249/102; 264/272.15, 272.17

[56] References Cited

U.S. PATENT DOCUMENTS

| 4,332,537 | 6/1982 | Slepcevic | 425/127 |
| 4,480,975 | 11/1984 | Plummer et al. | 264/272.17 |
| 4,615,857 | 10/1986 | Baird | 425/116 |
| 4,861,251 | 8/1989 | Moitzger | 425/116 |
| 5,316,463 | 5/1994 | Neu | 425/116 |
| 5,405,255 | 4/1995 | Neu | 425/116 |
| 5,409,362 | 4/1995 | Neu | 425/116 |
| 5,429,488 | 7/1995 | Neu | 425/116 |
| 5,645,864 | 7/1997 | Higuchi | 425/116 |
| 5,656,549 | 8/1997 | Woosley et al. | 264/272.17 |

FOREIGN PATENT DOCUMENTS

| 62-97339 | 5/1987 | Japan | 425/125 |
| 3-77335 | 4/1991 | Japan | 425/183 |

*Primary Examiner*—Robert Davis
*Attorney, Agent, or Firm*—Skjerven, Morrill, MacPherson, Franklin & Friel LLP

[57] ABSTRACT

A mold for BGA semiconductor packages which includes a height adjusting member adapted to adjust the height of the top cavity insert of the top mold or the bottom cavity insert of the bottom mold, an elastic member disposed between the height adjusting member and associated insert, clamping regions of different heights formed at its top or bottom cavity insert, or air vents having a width and depth of an optimum ratio to the area and depth of cavities, thereby being capable of maintaining an optimum and uniform clamping pressure between the top and bottom molds for a variety of PCB strips having a thickness deviation among different portions thereof or having various average thicknesses, upon molding resin encapsulants on those PCB strips, thereby achieving an improvement in the quality of finally produced packages while preventing a sweeping phenomenon of bonding wires electrically connecting a semiconductor chip to conductive traces.

29 Claims, 39 Drawing Sheets

MOLD FOR BALL GRID ARRAY SEMICONDUCTOR PACKAGE

BACKGROUND OF THE INVENTION

1. Field of the Invention

The present invention relates to a mold for ball grid array (BGA) semiconductor packages, and more particularly to a mold for BGA semiconductor packages which is capable of applying uniform and optimum clamping pressure to engaging surfaces of top and bottom molds upon molding a resin encapsulant in the portion of a printed circuit board (PCB) where a semiconductor chip is mounted, thereby preventing the PCB from being damaged while achieving an improvement in the quality of packages.

2. Description of the Prior Art

BGA semiconductor packages have been developed to overcome a limitation in fine pitch surface mounting. BGA semiconductor packages achieve a high integration of circuits because they can accommodate a maximum number of input/output terminals per unit area. Such BGA semiconductor packages also have a light, thin, simple and compact structure while exhibiting a superior electrical characteristic and a superior heat discharge characteristic. In addition, the BGA semiconductor packages have advantages in that they achieve a high productivity, an easy extension to multi-chip modules, and a minimized cycle from the designing step to the manufacturing step.

In this regard, BGA semiconductor packages have a high applicability obtained by their high-quality characteristic and high reliance, an easy applicability to a variety of electronic devices having a very compact size, and a high added value obtained by inexpensive manufacturing costs.

Such BGA semiconductor packages include a PCB having a semiconductor chip mounting plate at the upper surface of its central portion. Circuit patterns are formed on the upper and lower surfaces of the peripheral portion of the PCB, respectively. The circuit patterns are electrically connected to each other through via holes. A semiconductor chip is attached to the semiconductor chip mounting plate of the PCB. The circuit patterns of the PCB are also electrically connected to the circuit of the semiconductor chip by means of bonding wires. The BGA semiconductor packages also include a resin encapsulant molded to protect the semiconductor chip and bonding wires from the environment such as moisture, dust or impact, and a plurality of solder balls used as input/output terminals for electrically connecting the lower circuit pattern of the PCB to an external device.

The PCB has a multilayer structure essentially consisting of a flat, central resin layer made of a polymer resin such as polyimide or bismaleimidetriazine, signal layers comprised of metal thin films respectively formed over the upper and lower surfaces of the central resin layer while interposing coating layers therebetween, and insulating solder mask layers respectively formed over the signal layers while being externally exposed. The signal layers respectively formed over the upper and lower surfaces of the flat resin layer are electrically connected to each other through via holes. If necessary, the PCB may have at least two laminated flat resin layers on which signal layers are formed. Accordingly, the PCB has an optional thickness.

Typically, the fabrication of BGA semiconductor packages using PCB's having the above-mentioned structure is carried out in the unit of a PCB strip on which a plurality of unit PCB's are continuously arranged in such a manner that they are aligned with one another, taking into consideration the processing at each processing step and the package feeding efficiency between successive processing steps. The fabrication procedure of BGA semiconductor packages involves a semiconductor chip mounting step, a wire bonding step, a molding step, a solder ball fusing step, and a singulation step. At the semiconductor chip mounting step, semiconductor chips are mounted on respective semiconductor chip mounting plates of the unit PCB's of a PCB strip by bonding each semiconductor chip to the associated semiconductor chip mounting plate using an epoxy resin. At the wire bonding step, bond pads of each mounted semiconductor chip are bonded to conductive traces of the associated unit PCB by means of bonding wires, respectively, so that the associated semiconductor chip and PCB are electrically connected. At the molding step, a resin encapsulant is formed using a mold in order to protect each semiconductor chip and associated bonding wires from the environment. At the solder ball fusing step, a plurality of solder balls are fused as input/output terminals on the lower surface of each unit PCB. At the singulation step, the PCB strip processed at the above-mentioned steps is cut into individual unit packages.

Practically, it is very difficult for PCB strips used in the fabrication of BGA semiconductor packages to maintain a uniform thickness at all portions thereof during the package fabrication, in particular, at steps of laminating desired layers and steps of coating a solder mask layer. Each PCB strip has a relatively large thickness deviation because its portions disposed adjacent to cutting lines to be used at the cutting step have an increased thickness due to a generation of burrs, as compared to other portions. As a result, such PCB strips are problematic in that they have a relatively non-uniform flatness.

Since such PCB strips having a non-uniform flatness due to a thickness deviation exhibited among different portions thereof are used in the fabrication of BGA semiconductor packages, various problems occur. For instance, where low clamping pressure is used to engage top and bottom molds in a molding process for forming a cavity where a resin encapsulant is molded as a melted molding resin is injected into the cavity and then cured, the melted molding resin may be flashed between the top and bottom molds at a thinner portion of the PCB. On the other hand, where the clamping pressure is excessively high, a thicker portion of the PCB is severely depressed as compared to other portions of the PCB, thereby causing the PCB to be deformed. In this case, a sweeping caused by a short circuit of wires and a generation of cracks in packages may occur. Air vents may be blocked due to the deformation of the PCB. In this case, it is difficult to easily vent air left in the cavity, thereby resulting in a degradation in the quality of molded packages such as a formation of voids or blisters.

Now, a procedure for molding BGA packages in accordance with a conventional method will be described in conjunction with FIG. 33.

FIG. 33 is a schematic view illustrating a general automatic transfer type molding apparatus TMA having a conventional configuration. As shown in FIG. 33, the TMA includes a mold M comprising a top mold 10 and a bottom mold 20. A feeding unit F is disposed at a position spaced from the mold M by a desired distance. The feeding unit F serves to store PCB strips (denoted by the reference numeral 100 in FIG. 31) and to feed the stored PCB strips. The TMA also includes a transferring unit T for transferring a PCB strip stored in the feeding unit F to the mold M, a guide unit G for guiding the PCB strip during the transfer, and a receiving unit C for receiving molded PCB strips.

In the feeding unit F, PCB strips subjected to the semiconductor chip mounting and wire bonding steps are sequentially stacked. The transferring unit T transfers the PCB strips stacked in the feeding unit F one by one to the bottom mold 20 via the guide unit G. The PCB strip transferred to the bottom mold 20 is positioned in such a manner that its portions (namely, square regions indicated by dotted lines in FIG. 31), where resin encapsulants are to be formed, are received in cavities defined when the bottom mold 20 is engaged with the top mold 10, respectively. As a melted resin is injected into the cavities and then cured, resin encapsulants are formed on the PCB strip. PCB strips formed with resin encapsulants in the above-mentioned manner are sequentially stacked in the receiving unit C. Although not shown in the figures, the PCB strips stacked in the receiving unit C after the completion of the molding step are subsequently subjected to a solder ball fusing step so as to fuse solder balls as input/output terminals on the lower surface of each unit PCB. Subsequently, the PCB strips are subjected to a singulation step in order to cut each PCB strip into package units. Thus, BGA semiconductor packages are obtained.

FIG. 34 is a sectional view illustrating a typical configuration of the conventional automatic transfer type mold M. As shown in FIG. 34, a PCB strip 100, in which mounting of semiconductor chips 103 and bonding of wires 104 have been carried out, is interposed between the top and bottom molds 10 and 20 of the mold M in such a manner that the semiconductor chips 103 are positioned within cavities CA defined between the top and bottom molds 10 and 20. As a melted resin is injected into the cavities CA and then cured, resin encapsulants are formed on the PCB strip 100.

The top mold 10 includes a base 11 provided at the lower surface thereof with a longitudinally extending recess 12, a top center block 30 extending downwardly from the central portion of the lower surface of the base 11, and a top cavity insert 40 fitted in the recess 12 around the top center block 30.

The top cavity insert 40 has a plurality of clamping holes 502 respectively corresponding to a plurality of through holes 501 formed in the base 11 so that it is firmly coupled to the base 11 by clamping members B1 extending through the clamping holes 502 and through holes 501. A top drive plate DP is mounted on the top portion of the base 11 by means of a plurality of clamping members B.

Similarly to the top mold 10, the bottom mold 20 includes a base 21 provided at the upper surface thereof with a longitudinally extending recess 22, a bottom center block 30A extending upwardly from the central portion of the upper surface of the base 21, and a bottom cavity insert 40A fitted in the recess 22 around the bottom center block 30A.

The bottom center block 30A of the bottom mold 20 has a pot (not shown) adapted to melt a molding resin, and a runner (not shown) adapted as an elongated conduit for feeding the melted resin. The bottom cavity insert 40A fitted in the recess 22 around the bottom center block 30A has a plurality of concave portions 41 at the upper surface thereof.

FIG. 35 is a plan view illustrating a conventional configuration of the bottom cavity insert 40A included in the bottom mold. As shown in FIG. 35, the bottom cavity insert 40A has a base 211, a plurality of aligned concave portions 212 formed at the upper surface of the base 211 and adapted as resin encapsulant molding regions, and a plurality of clamping portions 213 extending upwardly from the upper surface of the base 211 at the peripheral edges of the concave portions 212 to have a uniform height. A PCB strip (not shown) to be subjected to a molding process is laid on a portion of the base 211 where the concave portions 212 and clamping portions 213 are formed.

When the bottom cavity insert 40A of the bottom mold is engaged with the top cavity insert (not shown) of the top mold, the concave portions 212 of the bottom cavity insert 40A form cavities which define resin encapsulant molding regions, respectively. A runner gate RG is formed at one corner of each concave portion 212 to provide a passage for injecting a melted molding resin into the associated cavity. Air vents are also formed at the remaining corners of each concave portion 212 in order to achieve a good filling of the molding resin. Each air vent AV has a predetermined width W2 and a predetermined depth D2 in order to achieve a good air ventilation while minimizing the leakage of the molding resin therethrough (FIG. 37).

FIG. 36 is a cross-sectional view taken along the line F—F of FIG. 35. Referring to FIG. 36, it can be found that the concave portions CV of the bottom cavity insert 40A are deeper than the clamping portions by a depth D1 (corresponding to the height of resin encapsulants) while the air vents AV have a depth D2.

The molding of resin encapsulants on PCB strips 100 using the TMA mentioned above in conjunction with FIG. 33 is carried out as follows. That is, when one of PCB strips 100 stacked in the feeding unit F is transferred to the bottom mold 20 in accordance with an operation of the transferring unit T, the bottom mold 20 is raised to clamp the chip-mounted and wire-bonded PCB strip 100 between the bottom and top molds 20 and 10. At this time, cavities CA are defined between the bottom and top molds 20 and 10 by the concave portions 41 of the bottom mold 20. Thereafter, a molding resin is injected into the cavities CA and then cured. Thus, the molding procedure is completed.

As shown in the enlarged portion of FIG. 34, the top cavity insert 40 is fitted in the recess 22 of the base 11 included in the top mold 10 in such a manner that its lower surface is higher than the lower surface of the base 11 by a height t, thereby forming a step. Accordingly, it is possible to prevent the PCB strip 100 laid on the bottom cavity insert 40A of the bottom mold 20 from being over-depressed when the top cavity insert 40 depresses the upper surface of the PCB strip 100.

However, such a PCB strip has a relatively large thickness deviation among different portions thereof. This is best shown in FIG. 14 and Table 2. As a result, clamping pressures respectively applied to different portions of the PCB strip 100 by the cavity inserts 40 and 40A of the clamped top and bottom molds 10 and 20 may be different. That is, non-uniform clamping pressure is applied to the PCB strip 100. This results in a plurality of locally deformed portions on a solder mask layer which is the uppermost layer of the PCB strip. Consequently, a generation of cracks or a degradation in the reliance of finally obtained semiconductor packages may occur.

Furthermore, portions of the PCB strip 100 disposed in the vicinity of the air vents AV of the bottom cavity insert 40A are not supported by the upper surface of the bottom cavity insert 40A during the application of clamping pressure to the PCB strip 100 by the top cavity insert 40. As a result, the PCB strip 100 may be severely deformed by the clamping pressure, thereby resulting in a sweeping phenomenon, namely, a short circuit of wires. In this case, the air vents AV may be partially or completely blocked, thereby resulting in a poor air ventilation of the cavities. As a result, a generation of blisters or voids may increase. When excessively high clamping pressure is applied to the PCB strip 100, the above-mentioned phenomenons are exhibited at all portions of the PCB strip 100.

FIG. 37 is a partially-enlarged plan view illustrating, in a perspective manner, a wire sweeping phenomenon generated in a semiconductor package due to a non-uniform application of clamping pressure upon molding a resin encapsulant (corresponding to an inner region indicated by the dotted line) using the conventional mold. In FIG. 37, the reference numeral 103 denotes a semiconductor chip, 102 conductive traces of a circuit pattern, and 104 bonding wires electrically connecting the conductive traces 102 to the semiconductor chip 103.

FIG. 38 is a schematic view illustrating a poor resin filling profile exhibited after molding a resin encapsulant by use of the conventional mold of FIG. 34 including the bottom cavity insert having the conventional configuration of FIG. 37. As shown in FIG. 38, portions of the PCB strip (not shown) disposed near air vents AV are in a severely deformed state due to clamping pressure applied to the PCB strip. As a result, the air vents AV may be partially or completely blocked. In this case, air left in the cavity concentrates toward air vents AV not blocked, so that venting pressure in the air vent AV increases, thereby generating voids or blisters. As a result, a poor resin filling profile is exhibited as shown in FIG. 38. That is, the quality of the finally produced package is degraded.

Where BGA semiconductor packages are fabricated using PCB strips having a structure including at least two laminated flat resin layers, on which signal layers are formed, it is difficult to adjust the height t of the step shown in the enlarged portion of FIG. 35 when the conventional mold is used. This is because the structure of the above PCB strips has a variable thickness. In this case, a PCB strip thickness less than the height t of the step results in an insufficient clamping pressure for coupling the top and bottom molds to each other. As a result, there is a serious problem in that the molding resin is flashed. On the contrary, where the PCB strip thickness is much greater than the height t of the step, the clamping pressure generated upon coupling the top and bottom molds is excessively high, thereby generating a deformation of the PCB strip or a sweeping phenomenon of bonding wires. Furthermore, the portions of the PCB strip disposed near the air vents AV of the bottom cavity insert 40A are severely deformed due to the clamping pressure from the top cavity insert 40 applied to the PCB strip because they are not supported by the upper surface of the bottom cavity insert 40A. As a result, the air vents AV may be partially or completely blocked, thereby generating voids or blisters.

Table 1 shows results obtained after resin encapsulants are molded on PCB strips having different average thicknesses, respectively, using the conventional mold of FIG. 34 in which its step has a constant height t.

TABLE 1

Result of Molding Test Depending on Average Thickness of PCB Strip

| Sample | PCB Th. (mm) | Molded State of Resin Encapsulant | | | State of Strip | | | Results |
|---|---|---|---|---|---|---|---|---|
| | | Void | Flash | Flister | Deform | Crack | Sweeping | |
| 1 | 0.336 | ○ | X | ○ | ○ | ○ | ○ | Bad |
| 2 | 0.339 | ○ | X | ○ | ○ | ○ | ○ | Bad |

TABLE 1-continued

Result of Molding Test Depending on Average Thickness of PCB Strip

| Sample | PCB Th. (mm) | Molded State of Resin Encapsulant | | | State of Strip | | | Results |
|---|---|---|---|---|---|---|---|---|
| | | Void | Flash | Flister | Deform | Crack | Sweeping | |
| 3 | 0.342 | ○ | ○ | ○ | ○ | ○ | ○ | Good |
| 4 | 0.345 | ○ | ○ | ○ | ○ | ○ | ○ | Good |
| 5 | 0.346 | ○ | ○ | ○ | ○ | ○ | ○ | Good |
| 6 | 0.360 | X | ○ | X | X | ○ | X | Bad |
| 7 | 0.360 | X | ○ | X | X | X | X | Bad |
| 8 | 0.363 | X | ○ | X | X | X | X | Bad |

Not Generated: ○
Generated: X
*Molding Condition for Resin Encapsulant
Step t: 0.220 mm
Molding Resin Injection Pressure: 80 kg/cm$^2$
Molding Time: 10 to 12 sec.
PCB Clamping Pressure: 200 to 250 kg/cm$^2$ As apparent from the above results, where the step between the lower surface of the top mold 10 and the lower surface of the top cavity insert 40 has a height t of 0.220 mm, the molded state of resin encapsulants is good only for PCB strips having an average thickness ranging from 0.342 mm to 0.346 mm. In this case, the PCB strips maintain a normal state. In the case of PCB strips having a thickness beyond the above-mentioned thickness range, undesirable results are obtained, as shown in Table 1.

FIG. 39 is a bottom view illustrating the top cavity insert 40 fitted in the recess 12 of the conventional top mold 10. Since the entire bottom surface including a packaging region PA of the top cavity insert 40 is roughly surface-treated in accordance with a sanding method, a molding resin outwardly leaked through the runner (not shown) of the bottom mold serving as a resin feeding conduit and air vents (not shown) may be firmly attached to the rough surface of the top cavity insert 40 during the molding process. For this reason, it may be difficult to separate a molded PCB strip 100 from the mold. As a result, the quality of finally obtained packages and the process efficiency are degraded.

Moreover, since the top cavity insert 40 has a configuration integral with the top center block 30, it is difficult to replace the top cavity insert 40 when the top cavity insert 40 is damaged or abraded at its portion corresponding to the packaging region PA. In this case, there is also a problem in that the top mold should be completely replaced by a new one. This results in an increase in costs.

FIG. 40 is an exploded perspective view of top and bottom molds constituting another conventional mold which has a manual transfer-type configuration. In this mold denoted by the reference character M, loading bars 330 are mounted on the bottom mold denoted by the reference numeral 20. A cavity plate 350 provided with cavities for molding resin encapsulants is mounted on each loading bar 330. The top mold, which is denoted by the reference numeral 10, is coupled to the bottom mold 20. The top mold 10 is formed with packaging regions PA.

FIG. 41 is an exploded perspective view of a PCB strip interposed between the loading bar and cavity plate in the conventional mold of FIG. 40 upon its molding. FIG. 42 is a lateral sectional view illustrating a loaded state of the PCB strip shown in FIG. 41.

As shown in FIGS. 41 and 42, the cavity plate 350 defines 4 sides of resin encapsulant molding regions on the PCB strip 100. The loading bar 330 is mounted in a recess 12A of the bottom mold 20. A plurality of uniformly space pins 332 are arranged on the loading bar in such a manner that they are longitudinally aligned with one another. The PCB strip 100 and cavity plate 350 have holes 106 and 351 corresponding in position to the pins 332, respectively. By such a configuration, the PCB strip 100 and cavity plate 350 can be sequentially mounted on the loading bar 330 in a manual manner. The basic configuration of this mold is identical to that of FIG. 34.

In the case of the conventional mold M having the configuration of FIG. 40, the loading bar 330, on which the PCB strip 100 and cavity plate 350 have been mounted, is manually mounted on the bottom mold 20. Thereafter, the bottom mold 20 is raised to be coupled to the top mold 10. In this state, a molding resin is supplied to the cavities defined in the cavity plate 350 and then cured. Thus, molding of resin encapsulants having a desired shape is completed.

In this case, however, it is difficult to manually mount the loading bar 330 on the bottom mold 20 because the loading bar 330 is very heavy due to its thick plate type structure. Since the pins 332 are integral with the loading bar 330, they may be easily damaged upon manually mounting the loading bar 330 on the bottom mold 20. In this case, there is an inconvenience in that the loading bar 330 should be re-machined. Furthermore, a higher clamping pressure is required upon coupling the molds 10 and 20 because of the use of the cavity plate 350. This may result in a deformation of the loading bar 330. Accordingly, a degradation in the stability occurs in the molding of packages.

Where the diameter of the holes 351 formed in the cavity plate 350 is unallowably larger than the diameter of the pins 332 inserted in the holes 351, it is impossible to obtain an accurate setting position, thereby resulting in a degradation in the quality of finally produced packages. Where the pins 332 and holes 351 have substantially identical diameters in order to solve the above-mentioned problem, it may be necessary to forcibly insert the pins 332 in the holes 351. In this case, it is difficult to easily separate the cavity plate 350 from the loading bar 330. Moreover, the pins 332 may be easily damaged.

SUMMARY OF THE INVENTION

The present invention has been made in view of the above-mentioned problems involved in the prior art and has various objects, as follows.

A first object of the invention is to provide a mold which includes a height adjusting member adapted to adjust the height of the top cavity insert of the top mold or the bottom cavity insert of the bottom mold in order to maintain an optimum clamping pressure between the top and bottom molds for a variety of PCB strips having a thickness deviation among different portions thereof or having various average thicknesses, upon molding resin encapsulants on those PCB strips, thereby achieving an improvement in the quality of finally produced packages while preventing a sweeping phenomenon.

A second object of the invention is to provide a mold which includes a height adjusting member adapted to adjust the height of the top cavity insert of the top mold or the bottom cavity insert of the bottom mold, and an elastic member disposed between the height adjusting member and associated insert, in order to maintain an optimum and uniform clamping pressure between the top and bottom molds for a variety of PCB strips having a thickness deviation among different portions thereof or having various average thicknesses, upon molding resin encapsulants on those PCB strips, thereby achieving an improvement in the quality of finally produced packages while preventing a sweeping phenomenon of bonding wires electrically connecting a semiconductor chip to conductive traces.

A third object of the invention is to provide a mold which has clamping regions having different heights at its top or bottom cavity insert for PCB strips having a thickness deviation among different portions thereof, in order to offset the thickness deviation of those PCB strips, so that an optimum and uniform clamping pressure is maintained between the top and bottom molds upon molding resin encapsulants on the PCB strips, thereby achieving an improvement in the quality of finally produced packages while preventing a sweeping phenomenon.

A fourth object of the invention is to provide a mold which includes a top or bottom cavity insert configured in such a manner that the width and depth of air vents has an optimum ratio to the area and depth of cavities, thereby achieving an improvement in the quality of molded resin encapsulants on a PCB strip.

A fifth object of the invention is to provide a mold which includes a cavity insert having a smooth surface at its portion except for the portions corresponding to packaging regions of the top or bottom cavities, namely, resin encapsulant molding regions, thereby achieving an improvement in the separability of a molded PCB strip from the mold after the molding and curing of resin encapsulants on the PCB strip and an improvement in the appearance of the molded resin encapsulants.

A sixth object of the invention is to provide a manual transfer type mold which includes a detachable liner mounted to its bottom mold in order to maintain an optimum clamping pressure between the top and bottom molds for a variety of PCB strips having a thickness deviation among different portions thereof or having various average thicknesses, upon molding resin encapsulants on those PCB strips, thereby achieving an improvement in the quality of finally produced packages while preventing a sweeping phenomenon.

A seventh object of the invention is to provide a manual transfer type mold which includes a loading bar having a longitudinally extending block at the upper surface thereof and a wide recess at the lower surface thereof, and a cavity plate provided with stopper holes at its opposite ends and adapted to ensure an accurate position setting, in order to reduce the weight of the loading bar, thereby achieving an improvement in the workability upon molding resin encapsulants on PCB strips while preventing a deformation of the loading bar.

In accordance with one aspect, the present invention provides a mold for fabricating ball grid array semiconductor packages, the mold including a top mold and a bottom mold to mold resin encapsulants on portions of a printed circuit board (PCB) strip respectively including semiconductor chip mounting regions, the PCB strip being mounted with a plurality of semiconductor chips at the semiconductor chip mounting regions, respectively, and bonded with wires adapted to electrically connect respective circuit patterns of the semiconductor chips to conductive traces, wherein: the top mold comprises a top mold base provided at a lower surface thereof with a longitudinally extending recess, a top center block centrally disposed in the recess beneath the top mold base, a pair of detachable height adjusting members respectively disposed in the recess in opposite sides of the top center block, the height adjusting members having a flat plate shape, and a pair of top cavity inserts respectively disposed in the recess just beneath the height adjusting members; each of the top cavity inserts has a lower surface positioned at a higher level than flush lower surfaces of the top mold and the top center block, thereby forming a step having a desired height; the bottom mold comprises a bottom mold base provided at an upper surface thereof with a longitudinally extending recess, a bottom center block centrally disposed in the recess on the bottom mold base, and a pair of bottom cavity inserts respectively disposed in the recess in opposite sides of the bottom center block; the bottom center block has a pot adapted to melt a molding resin, and a runner adapted as an elongated conduit for feeding the melted resin, and each of the bottom cavity inserts is provided at an upper surface thereof with a plurality of concave portions and clamping regions respectively disposed around the concave portions to define the concave portions, each of the concave portions communicating with the runner at one of the corners thereof while having air vents at the remaining corners thereof; the clamping regions of the bottom cavity insert define, along with a lower surface of the top cavity insert, resin encapsulant molding cavities in which the semiconductor chips mounted on the PCB strip and electrically connected to the conductive traces are received, respectively, when the top and bottom molds are coupled to carry out a molding process; and each of the detachable height adjusting members has a thickness selected to provide the step defined between the lower surface of the top cavity insert and the lower surfaces of the top mold base and the top center block so that an optimum clamping pressure is applied to the PCB strip between the top and bottom molds in the molding process where the PCB strip has a thickness deviation among different portions thereof.

In accordance with another aspect, the present invention provides a mold for fabricating ball grid array semiconductor packages, the mold including a top mold and a bottom mold to mold resin encapsulants on portions of a PCB strip respectively including semiconductor chip mounting regions, the PCB strip being mounted with a plurality of semiconductor chips at the semiconductor chip mounting regions, respectively, and bonded with wires adapted to electrically connect respective circuit patterns of the semiconductor chips to conductive traces, wherein: the top mold comprises a top mold base provided at a lower surface thereof with a longitudinally extending recess, a top center block centrally disposed in the recess beneath the top mold base, a pair of detachable height adjusting members respectively disposed in the recess in opposite sides of the top center block, the height adjusting members having a flat plate shape, and a pair of top cavity inserts respectively disposed in the recess just beneath the height adjusting members while being spaced from the height adjusting members, a pair of elastic members respectively disposed in spaces defined between the height adjusting members and the associated top cavity inserts by mounting members, and a plurality of clamping members adapted to mount the top cavity inserts to the top mold base in such a manner that the top cavity inserts are vertically slidable with respect to the top mold base; each of the top cavity inserts has a lower surface positioned at a higher level than lower surfaces of the top mold and the top center block, thereby forming a step having a desired height; the bottom mold comprises a bottom mold base provided at an upper surface thereof with a longitudinally extending recess, a bottom center block centrally disposed in the recess on the bottom mold base, and a pair of bottom cavity inserts respectively disposed in the recess in opposite sides of the bottom center block; the bottom center block has a pot adapted to melt a molding resin, and a runner adapted as an elongated conduit for feeding the melted resin, and each of the bottom cavity inserts is provided at an upper surface thereof with a plurality of concave portions and clamping regions respectively disposed around the concave portions to define the concave portions, each of the concave portions communicating with the runner at one of corners thereof while having air vents at the remaining corners thereof; the clamping regions of the bottom cavity insert define, along with a lower surface of the top cavity insert, resin encapsulant molding cavities in which the semiconductor chips mounted on the PCB strip and electrically connected to the conductive traces are received, respectively, when the top and bottom molds are coupled to carry out a molding process; and an optimum and uniform clamping pressure is applied to the PCB strip between the top and bottom molds in the molding process where the PCB strip has a thickness deviation among different portions thereof, by virtue of the step defined between the lower surface of each of the top cavity inserts and the lower surfaces of the top mold base and the top center block by the associated detachable height adjusting member, the clamping members adapted to mount the top cavity inserts to the top mold base in such a manner that the top cavity inserts are vertically slidable with respect to the top mold base, and the mounting and clamping members elastically supporting the top cavity inserts.

In accordance with another aspect, the present invention provides a mold for fabricating ball grid array semiconductor packages, the mold including a top mold and a bottom mold to mold resin encapsulants on portions of a printed circuit board (PCB) strip respectively including semiconductor chip mounting regions, the PCB strip being mounted with a plurality of semiconductor chips at the semiconductor chip mounting regions, respectively, and bonded with wires adapted to electrically connect respective circuit patterns of the semiconductor chips to conductive traces, wherein: the mold comprises the top and bottom molds, loading bars for mounting PCB strips, and cavity plates for supporting the PCB strips in cooperation with the loading bars in such a manner that each of the PCB strips is interposed between the associated loading bar and cavity plate; the top mold comprises a top mold base provided at a lower surface thereof with a longitudinally extending recess, a top center block centrally disposed in the recess beneath the top mold base, and a pair of top cavity inserts respectively disposed in the recess in opposite sides of the top center block, each of the top cavity inserts having a plurality of packaging regions at a lower surface thereof; the bottom mold comprises a bottom mold base, a pot centrally disposed on the bottom mold base in such a manner that it extends longitudinally, the pot serving to melt a molding resin, and a runner adapted to feed the melted molding resin; each of the loading bars is mounted on the bottom mold base in opposite sides of the central portion of the bottom mold base extending in a longitudinal direction, and the loading bar is provided with at least one groove at one longitudinal edge portion of an upper surface thereof, on which a PCB strip is laid, a fixing pin upwardly protruded from a bottom surface of the groove and adapted to fix the PCB strip and the cavity plate laid on the PCB strip, and support blocks arranged along the longitudinal edge portion of the loading bar at portions of the loading bar except for the portion where the groove is disposed; each of the cavity plates has at least one hole adapted to receive the pin formed on the associated loading bar, and a plurality of cavity regions respectively having cavity openings for molding resin encapsulants, and each of the cavity regions has a runner for feeding the melted resin and air vents; and a plurality of cavities, in which resin encapsulants are molded, are defined by the upper surface of the PCB strip mounted on each of the loading bars, surfaces of the associated cavity plate defining the cavity openings, and the packaging regions of the associated top cavity insert, respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
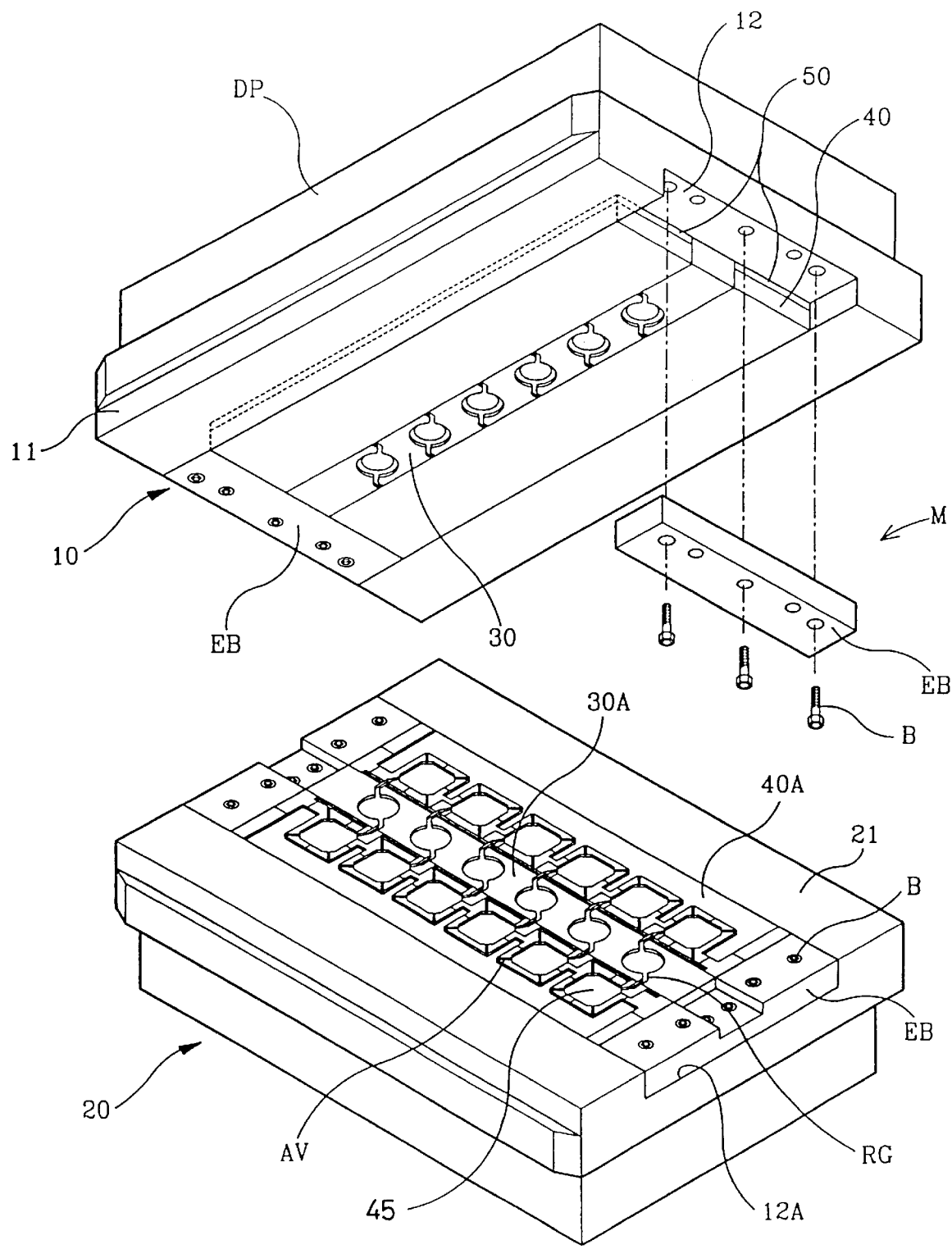
FIG. 1 is an exploded perspective view illustrating a mold including top and bottom molds in accordance with a first embodiment of the present invention.

FIG. 1 is an exploded perspective view illustrating an automatic transfer type mold including top and bottom molds in accordance with a first embodiment of the present invention. In FIG. 1, the mold is denoted by the reference character M whereas the top and bottom molds are denoted by the reference numerals 10 and 20, respectively. As shown in FIG. 1, a pair of height adjusting members 50 are mounted on the top mold 10. Bottom cavity inserts 40A are mounted on the bottom mold 20. Each bottom cavity insert 40A has concave portions 45 which serve as resin encapsulant molding regions.

A top drive plate DP is mounted on the upper surface of the top mold 10. The top mold 10 also has a base 11 provided with a longitudinally extending recess 12 at the central portion of its lower surface. A top center block 30 is laid on the central portion of the recess 12. The height adjusting members 50 are laid on portions of the recess 12 respectively disposed in opposite sides of the top center block 30. In the recess 12, a pair of top cavity inserts 40 are laid on the height adjusting members 50, respectively. In order to fix the top center block 30 and top cavity inserts 40 to the top mold 10, end blocks EB are fixedly mounted to the lower surface of the base 11 at opposite ends of the top center block 30 and top cavity inserts 40 by means of clamping members B, respectively.

Figure 2:
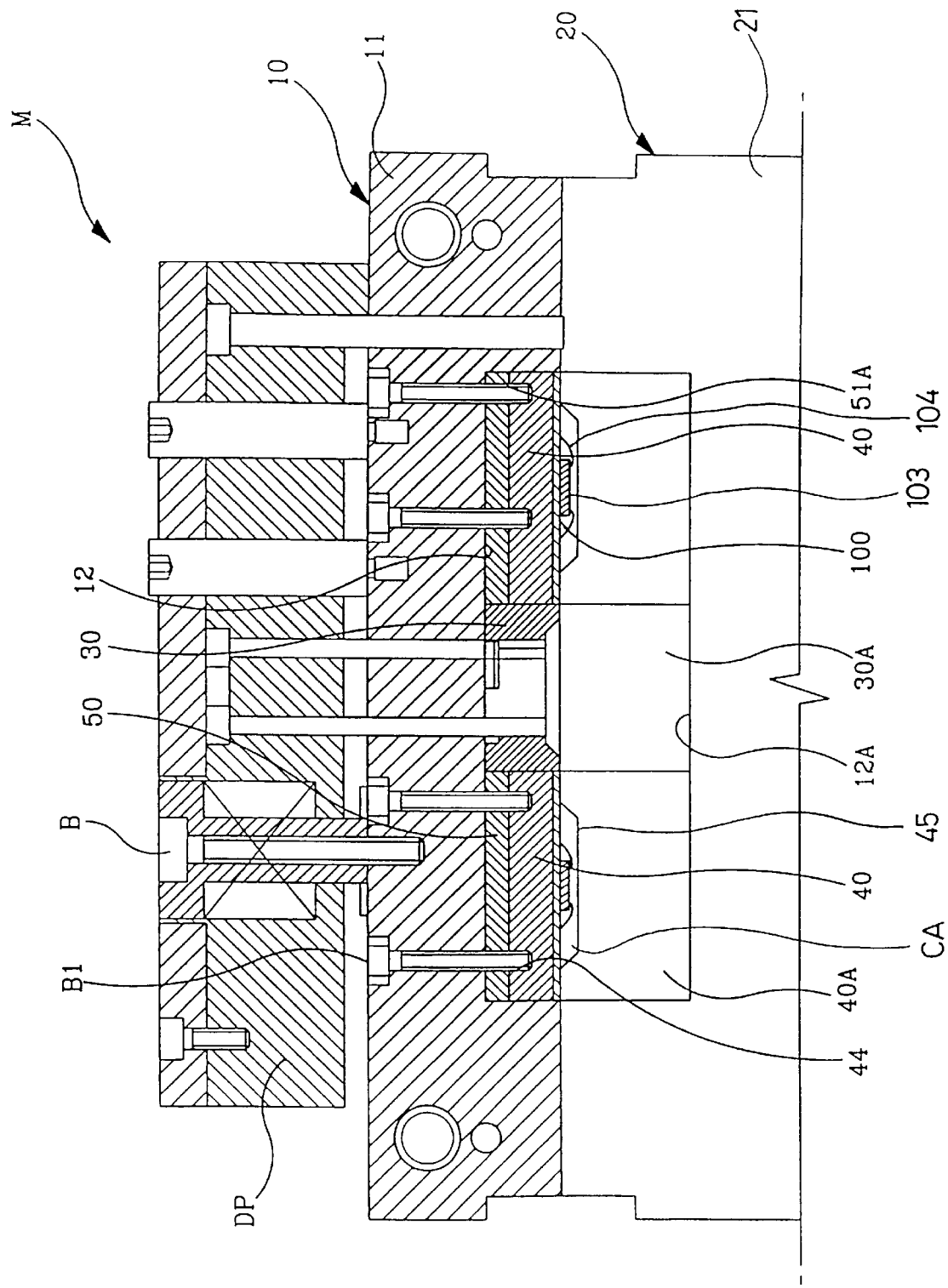
FIG. 2 is a sectional view illustrating a coupled state of the top and bottom molds in accordance with the first embodiment of the present invention.
Figure 3:
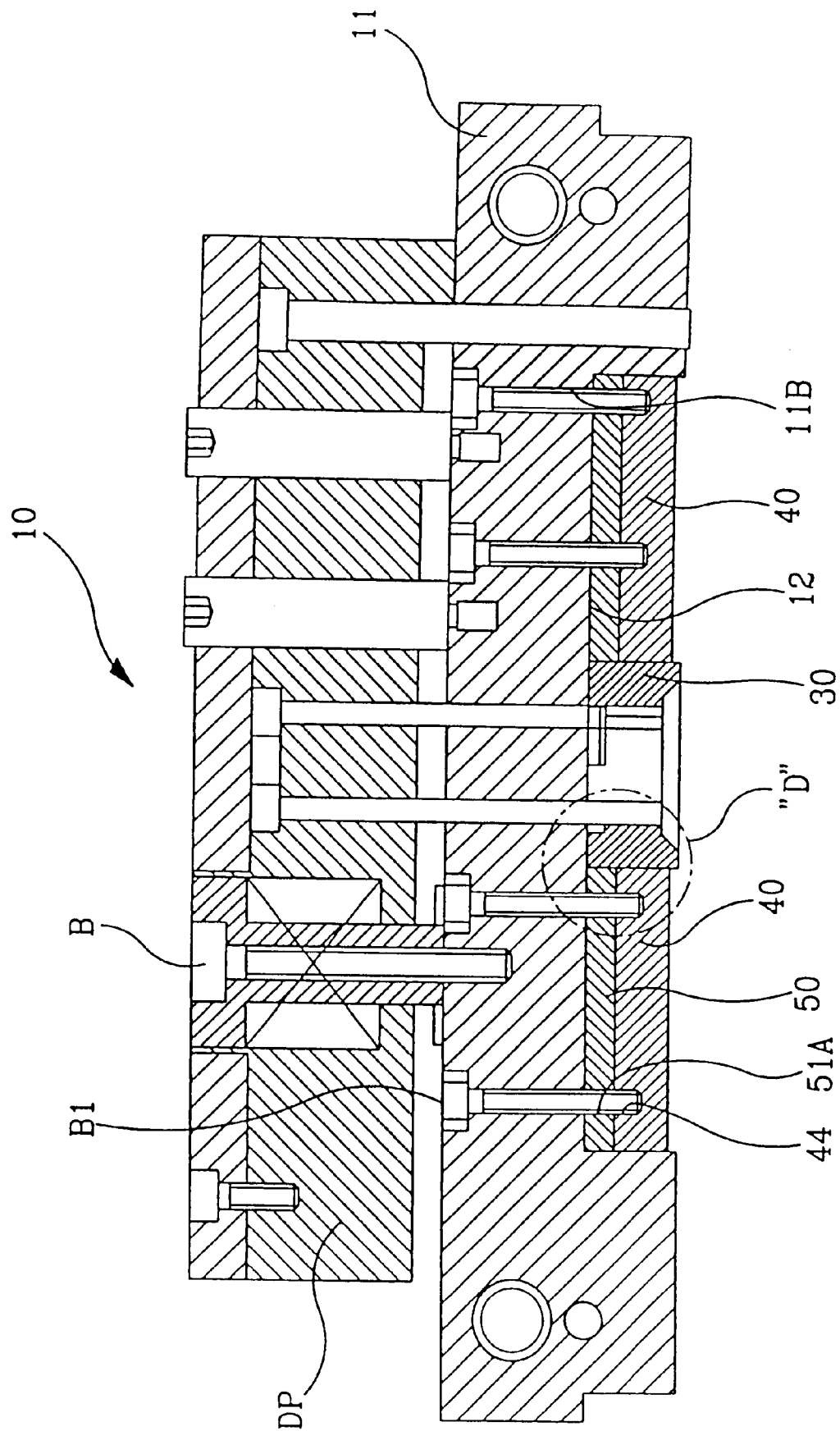
FIG. 3 is a sectional view illustrating the top mold according to the first embodiment of the present invention.

FIG. 2 is a sectional view illustrating a coupled state of the top and bottom molds 10 and 20 in the automatic transfer type mold M whereas FIG. 3 is a sectional view illustrating the top mold 10 shown in FIG. 2.

As shown in FIGS. 2 and 3, a PCB strip 100, in which mounting of semiconductor chips 103 and bonding of wires 104 have been carried out, is interposed between the top and bottom molds 10 and 20 in such a manner that the semiconductor chips 103 are positioned within cavities CA defined between the top and bottom molds 10 and 20. As a melted resin is injected into the cavities CA and then cured, resin encapsulants are formed on the PCB strip 100.

As apparent from the above description, the top mold 10 basically includes the base 11 provided at the lower surface thereof with the longitudinally extending recess 12, the top center block 30 disposed beneath the base 11 at the central portion of the base 11, the height adjusting members 50 respectively disposed in the recess 12 in opposite sides of the top center block 30, and the top cavity inserts 40 respectively disposed in the recess 12 just beneath the height adjusting members 50.

Each top cavity insert 40 has a plurality of clamping holes 44 respectively corresponding to a plurality of through holes 11B formed in the base 11 and a plurality of through holes 51A formed in the associated height adjusting member 50 so that it is firmly coupled to the base 11 along with the height adjusting member 50 by clamping members B1 extending through the clamping holes 44 and through holes 11B and 51A. The top drive plate DP is mounted on the top portion of the base 11 by means of a plurality of clamping members B.

Similarly to the top mold 10, the bottom mold 20 includes a base 21 provided at the upper surface thereof with a longitudinally extending recess 12A, and a bottom center block 30A extending upwardly from the central portion of the upper surface of the base 21. The bottom cavity inserts 40A, which are also included in the bottom mold 20, are disposed in the recess 12A in opposite sides of the bottom center block 30A, respectively.

The bottom center block 30A of the bottom mold 20 has a pot (not shown) adapted to melt a resin, and a runner (not shown) adapted as an elongated conduit for feeding the melted resin. Each bottom cavity insert 40A disposed in the recess 12A in each side of the bottom center block 30A has a plurality of concave portions 45 at the upper surface thereof.

Figure 4:
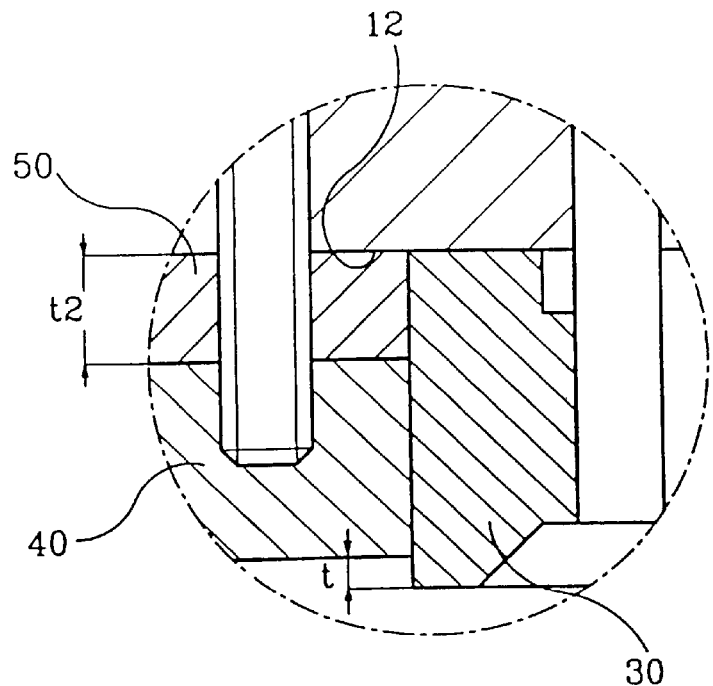
FIG. 4 is an enlarged sectional view showing the portion D of FIG. 3.

FIG. 4 is an enlarged sectional view showing the portion D of FIG. 3. The top center block 30 centrally arranged in the recess 12 has a lower surface flush with the lower surface of the base 11 (best shown in FIG. 3). As shown in FIG. 4, in opposite sides of the top center block 30, the top cavity inserts 40 and height adjusting members 50 having a thickness of t2 are arranged in an overlapped manner, respectively, so that the lower surface of each top cavity insert 40 is higher than the lower surface of the top center block 30 by a height t, thereby forming a step.

The height t of the step is appropriately selected to apply an optimum clamping pressure to a PCB strip clamped between the top and bottom molds 10 and 20.

Figure 5:
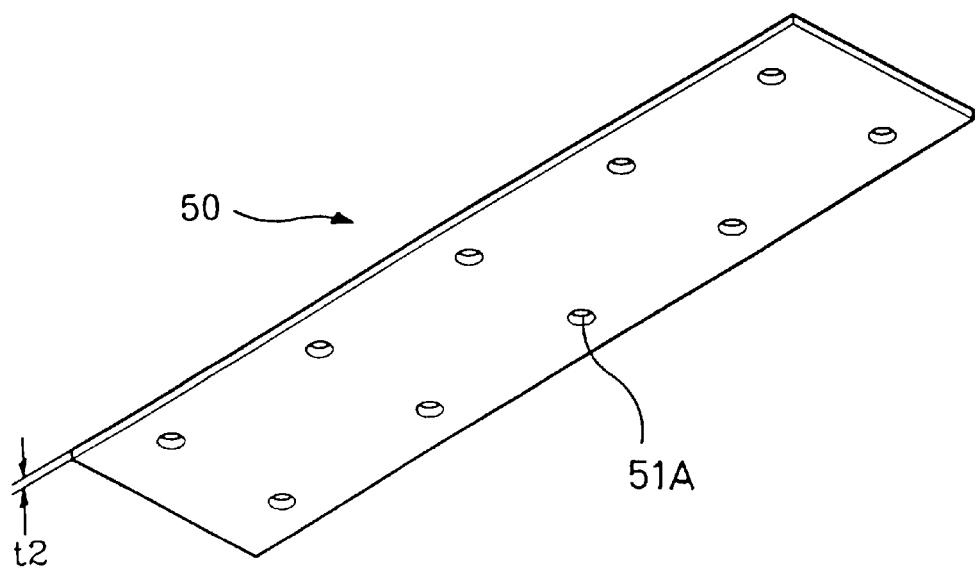
FIG. 5 is a perspective view illustrating a height adjusting member according to the first embodiment of the present invention.

FIG. 5 is a perspective view of the height adjusting member 50 according to the first embodiment of the present invention. As shown in FIG. 5, the height adjusting member 50 is provided with a plurality of through holes 51A. These through holes 51A are formed at positions respectively corresponding to those of the through holes 11B formed in the base 11 and clamping holes 44 formed in the associated top cavity insert 40. As mentioned above, the clamping members B1 extend through the associated through holes 51A, through holes 11B and clamping holes 44, respectively, to firmly couple each top cavity insert 40 to the base 11 along with the associated height adjusting member 50.

In accordance with the illustrated embodiment of the present invention, a plurality of height adjusting members having a variety of thicknesses are prepared in order to select height adjusting members 50 having a thickness t2 capable of providing an optimum clamping pressure in a molding process, depending on the thickness t1 of a PCB strip 100 laid on the bottom mold 20.

Although the height adjusting members 50 have been described as being arranged in the top mold 10 in the illustrated case, they may be arranged in the bottom mold 20.

Where the mold M including the height adjusting members 50 according to the first embodiment of the present invention is used, it is possible to maintain an optimum clamping pressure between the top and bottom molds 10 and 20 for a variety of PCB strips having a thickness deviation among different portions thereof or having various average thicknesses, upon molding resin encapsulants on those PCB strips, thereby achieving an improvement in the quality of finally produced packages while preventing a sweeping phenomenon. This will be described in more detail.

Figure 17:
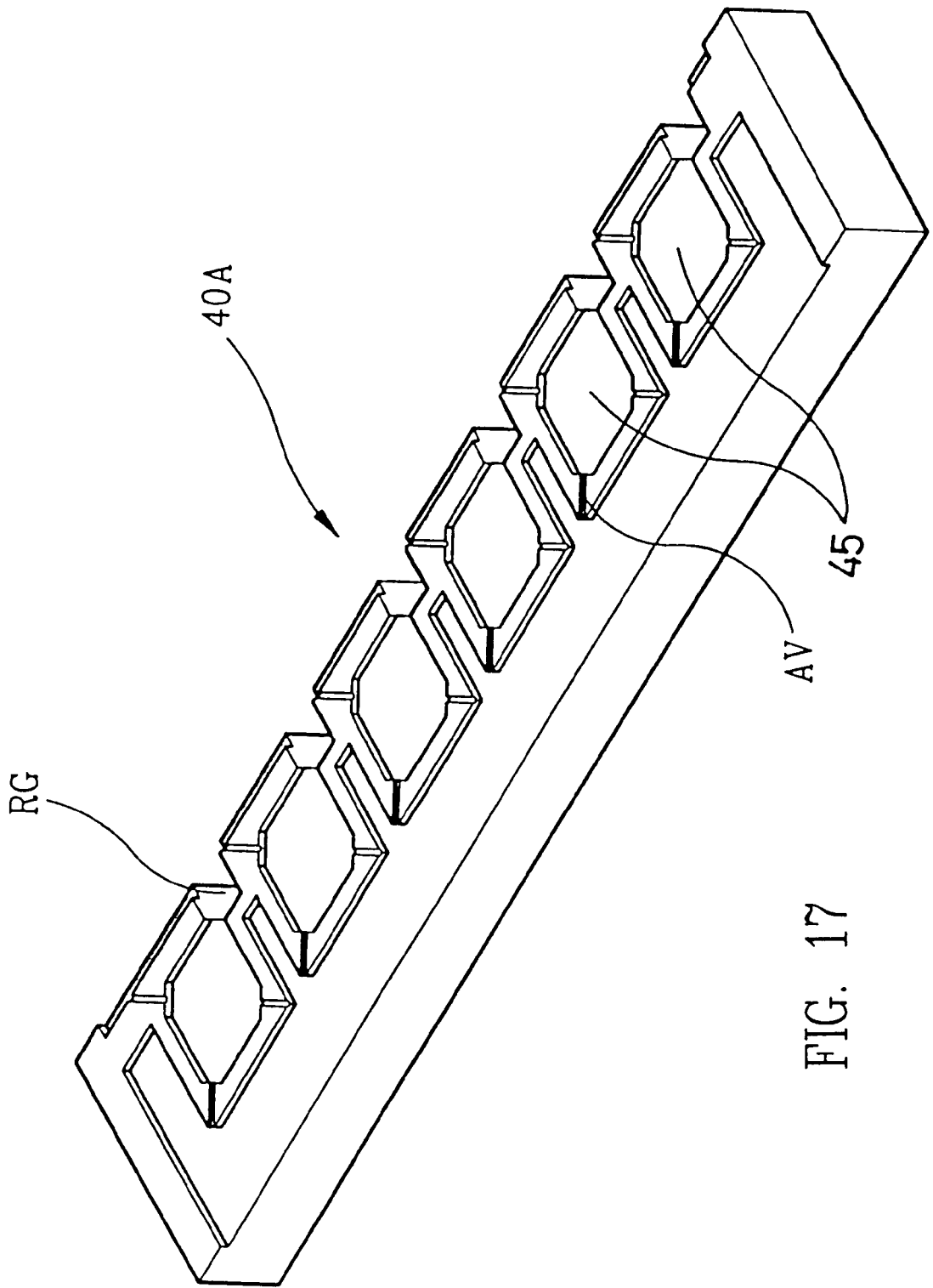
FIG. 17 is a perspective view illustrating a bottom cavity insert mounted in a bottom mold included in a mold according to a fourth embodiment of the present invention.
Figure 21:
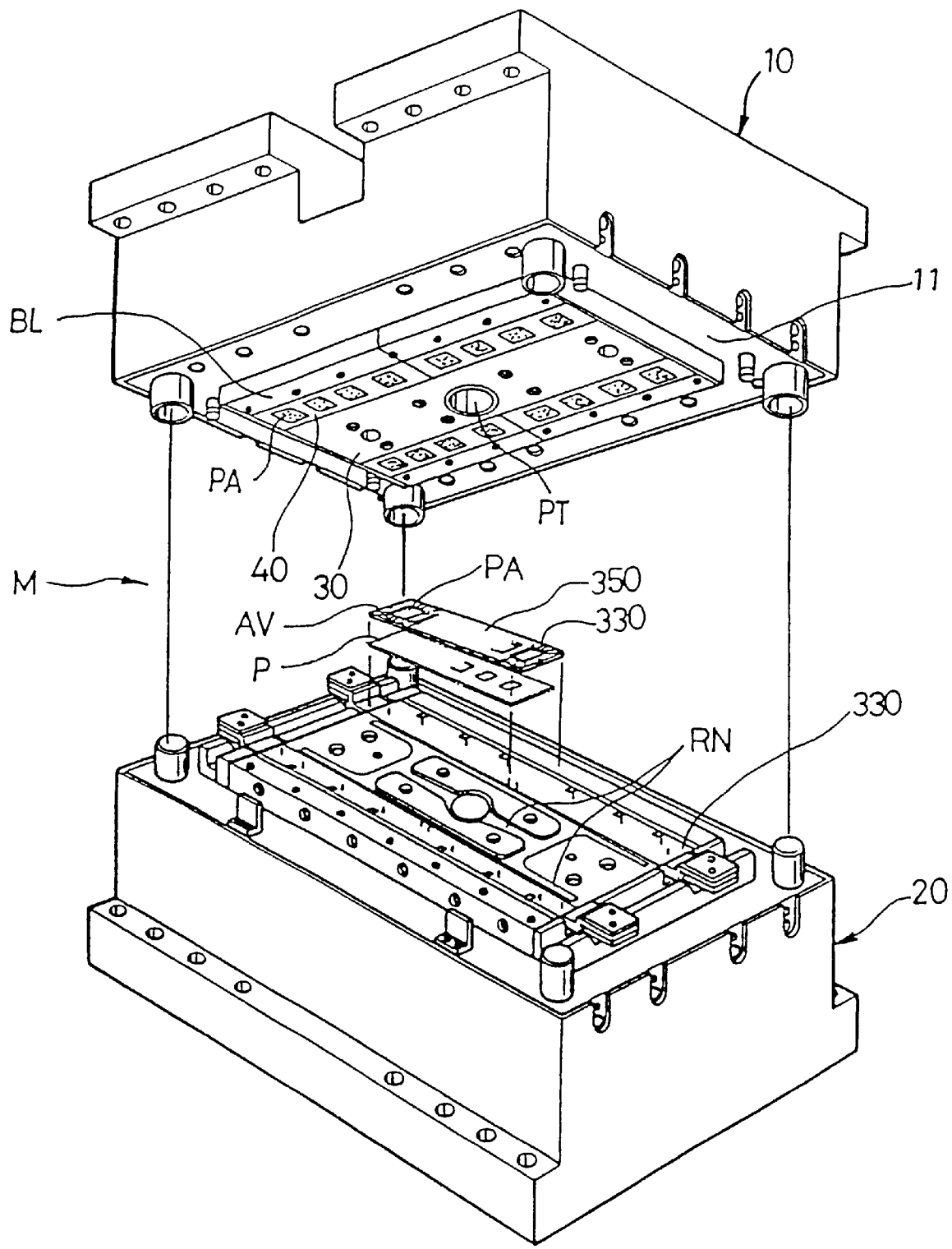
FIG. 21 is an exploded perspective view illustrating a mold including top and bottom molds according to a fifth embodiment of the present invention.

Since each top cavity insert 40 of the top mold 10 is mounted in such a manner that a step having an optimum height t is defined between the lower surface of the top cavity insert 40 and the lower surfaces of the base 11 and top center block 30 by the associated height adjusting member 50, it is possible to select an optimum clamping pressure applied to a PCB strip 100 between the coupled top and bottom molds 10 and 20. The height t of the step depends on the thickness of the PCB strip 100. By virtue of the application of such an optimum clamping pressure, it is possible to prevent the generation of cracks resulting from a deformation of the PCB strip 100 and the generation of a wire sweeping phenomenon such as a wire short circuit resulting from a deformation of bonding wires 104 electrically connecting a semiconductor chip 103 to conductive traces 102 of a circuit pattern. In addition, there is no phenomenon that air vents AV are partially or completely blocked. Accordingly, air existing in cavities CV can be easily vented through the air vents AV by a pressure generated upon filling the cavities CV with a molding resin to mold resin encapsulants 105. Therefore, it is possible to prevent a formation of voids or blisters in the resin encapsulants 105, thereby preventing a degradation in the quality of molded packages (FIGS. 17 and 21).

Figure 6:
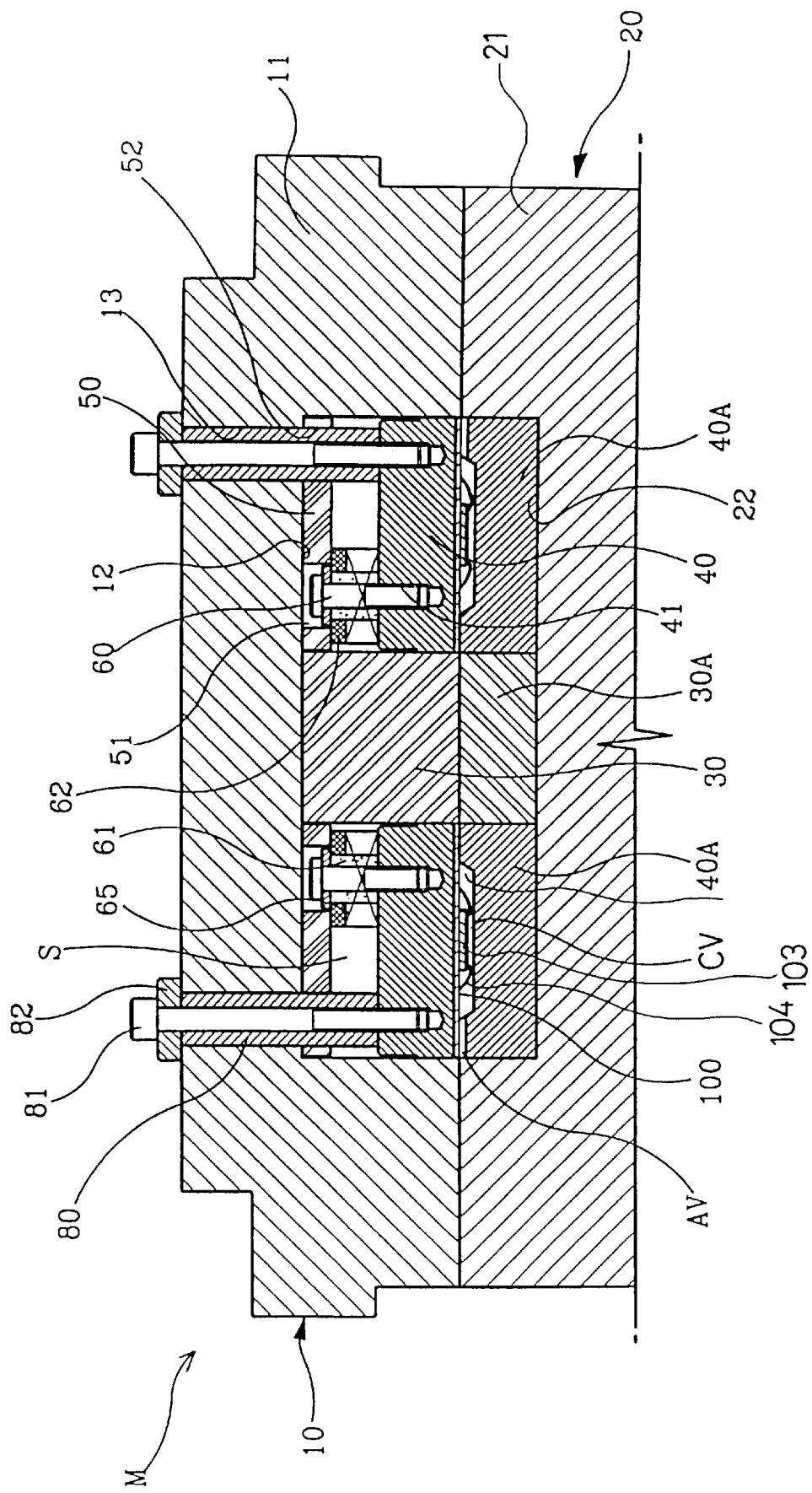
FIG. 6 is a sectional view illustrating a coupled state of top and bottom molds according to a second embodiment of the present invention.
Figure 7:
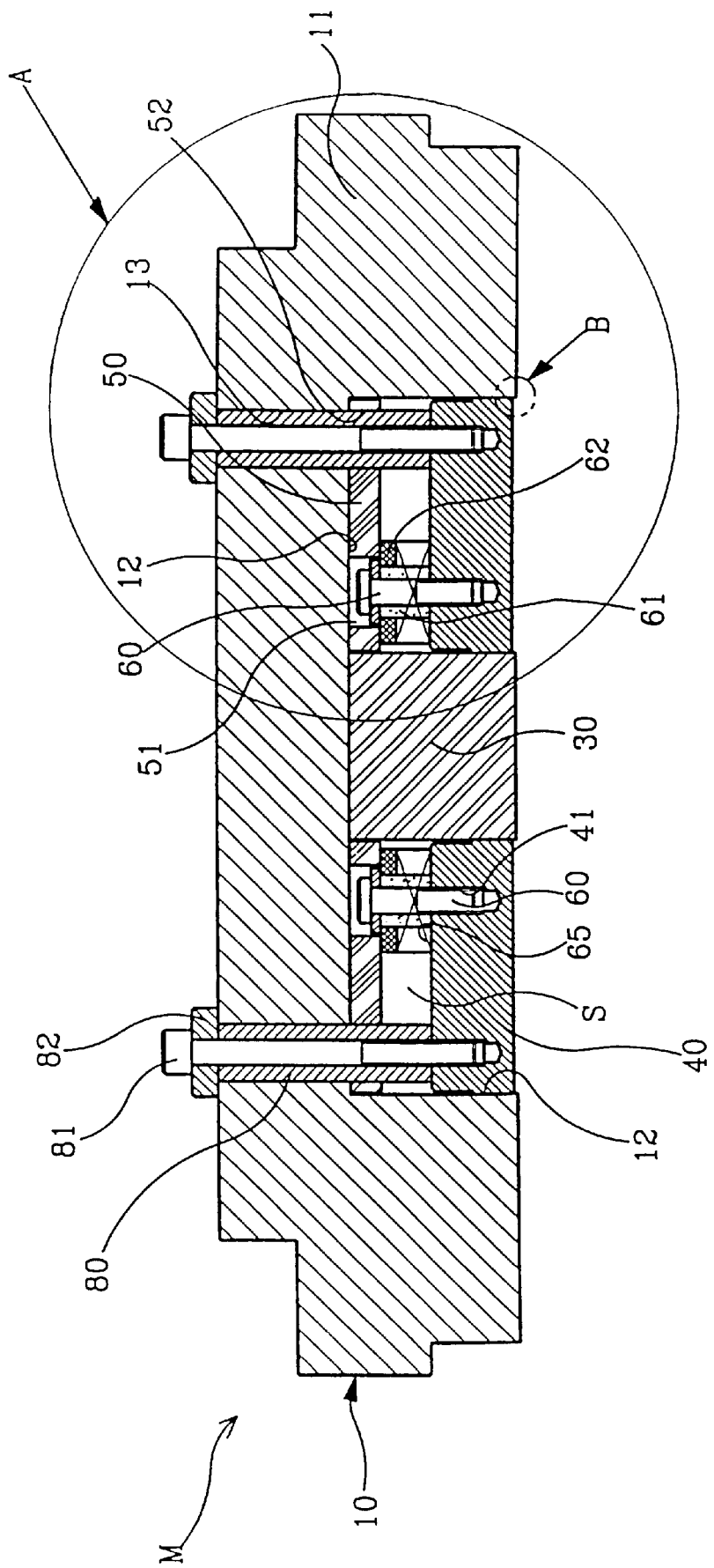
FIG. 7 is a sectional view illustrating the top mold according to the second embodiment of the present invention.

FIG. 6 is a sectional view illustrating a mold having a configuration according to a second embodiment of the present invention. In FIG. 6, a coupled state of top and bottom molds 10 and 20 included in the mold M is shown. FIG. 7 is a sectional view illustrating the top mold 10 shown in FIG. 6. In this embodiment, constituting elements respectively corresponding to those in the first embodiment are denoted by the same reference numerals or characters.

As shown in FIGS. 6 and 7, the top mold 10 basically includes a base 11 provided at the lower surface thereof with the longitudinally extending recess 12, a top center block 30 disposed beneath the base 11 at the central portion of the base 11, height adjusting members 50 respectively disposed in the recess 12 in opposite sides of the top center block 30, and top cavity inserts 40 respectively disposed in the recess 12 just beneath the height adjusting members 50. Each height adjusting member 50 has through holes 51 and 52. The top mold 10 also includes elastic members 65 each disposed in a space S defined between the associated height adjusting member 50 and top cavity insert 40 and adapted to elastically support the top cavity insert 40, and a plurality of clamping members 81 adapted to fix each top cavity insert 40 to the base 11. Each elastic member 65 is mounted to the associated top cavity insert 40 by means of mounting members 60.

The head of each mounting member 60, which is provided with a bush 61 and washer 62, is received in an associated one of the through holes 51 formed in the associated height adjusting member 50 adjacent to the top center block 30. The mounting member 60 extends through an associated one of clamping holes 41 formed in the associated top cavity insert 40 and respectively corresponding to the through holes 51, so that it is threadedly coupled to the top cavity insert 40.

Each clamping member 81 extends through a spacer 80 slidably fitted in an associated one of through holes 52 formed in the associated height adjusting member 50 adjacent to the base 11 and an associated one of holes 13 formed in the base so that it is threadedly coupled to an associated one of the clamping holes 41 formed in the associated top cavity insert 40. Thus, each clamping member 81 supports an associated one of the top cavity insert 40. A washer 82 is interposed between the head of each clamping member 81 and the upper surface of the base 11.

Each elastic member 65, which is disposed in the space S defined between the associated height adjusting member 50 and top cavity insert 40, comprises an elastic means such as a disc spring. Each bush 61 is fitted in an associated one of the elastic members 65. Each mounting member 60 extends through an associated one of the bushes 61 to mount an associated one of the elastic members 65 to the associated top cavity insert 40. Each washer 62 is interposed between the head of each mounting member 61 and the upper surface of the associated elastic member 65.

Meanwhile, the bottom mold 20 includes a base 21 provided at the upper surface thereof with a longitudinally extending recess 21, and a bottom center block 30A disposed over the base 21 at the central portion of the base 21, and bottom cavity inserts 40A respectively disposed in the recess 21 in opposite sides of the bottom center block 30A. Each bottom cavity insert 40A is provided at the upper surface thereof with a plurality of concave portions 45 serving as resin encapsulant molding regions. Each concave portion 45 has air vents AV.

Figure 8:
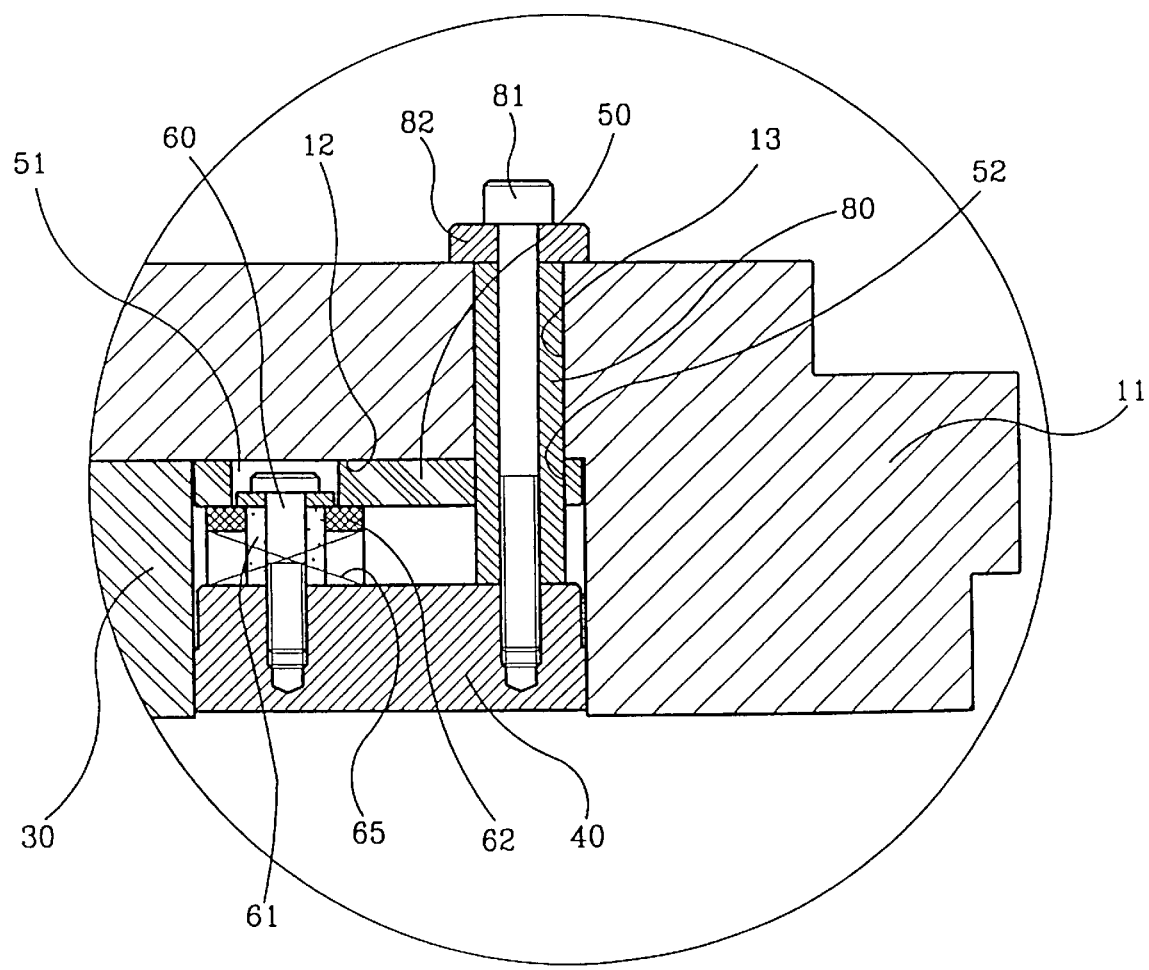
FIG. 8 is an enlarged sectional view showing the portion A of FIG. 7.
Figure 9:
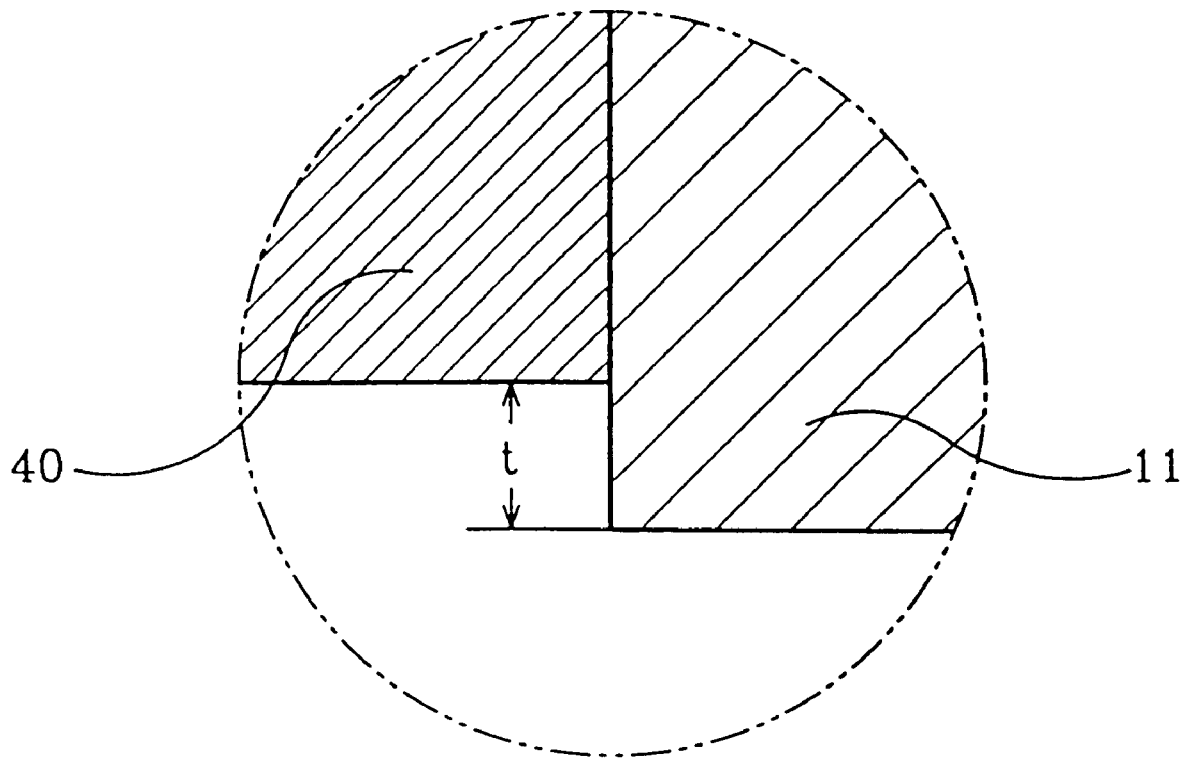
FIG. 9 is an enlarged sectional view showing the portion B of FIG. 7.

FIG. 8 is an enlarged sectional view showing the portion A of FIG. 7 whereas FIG. 9 is an enlarged sectional view showing the portion B of FIG. 7. As shown in FIGS. 7 and 8, each top cavity insert 40 is supported on the base 11 by the associated clamping members 81 in such a manner that it is upwardly slidable while being elastically supported by the associated mounting members 60 and elastic member 65. The lower surface of the top cavity insert 40 is higher than the lower surfaces of the top mold 10 and top center block 30 by a height t, thereby forming a step. By virtue of the step having a height t, an optimum clamping pressure is applied to a PCB strip clamped between the top and bottom molds 10 and 20.

As in the first embodiment, the height t of the step can be appropriately selected to apply ant optimum clamping pressure to a PCB strip clamped between the top and bottom molds 10 and 20. However, the range of the step height selection in the second embodiment is wider than that in the first embodiment, because of the use of the elastic members 65.

Now, the procedure of molding resin encapsulants on a PCB strip 100 using the mold M according to the second embodiment of the present invention will be described in conjunction with FIG. 6.

When a PCB strip 100 is fed to the bottom mold 20, the bottom mold 20 is raised to be coupled to the upper mold 10. As the bottom mold 20 is coupled to the upper mold 10, the PCB strip 100 is depressed by an associated one of the top cavity inserts 40 of the upper mold 10. As the top cavity insert 40 clamps the PCB strip 100, it moves upwardly against the elastic force of the associated elastic member 65 by an appropriate distance. Thus, the clamping pressure applied to the PCB strip 100 is maintained in an optimum state.

In accordance with the second embodiment of the present invention, accordingly, it is possible to maintain an optimum clamping pressure between the top and bottom molds 10 and 20 for a variety of PCB strips having various thicknesses in a relatively wide range, upon molding resin encapsulants on those PCB strips, by virtue of the elastic force of the elastic members 65. This will be described in more detail.

When a PCB strip 100 laid on the bottom mold 20 is clamped between the top and bottom molds 10 and 20 as the top and bottom molds 10 and 20 are clamped to each other, the top cavity insert 40 moves upwardly against the elastic force of the associated elastic member 65 due to the thickness t1 of the PCB strip 100. By virtue of the upward movement of the top cavity insert 40 along with the associated clamping it members 81 and spacers 80 due to the thickness t1 of the PCB strip 100, the clamping pressure applied to the PCB strip 100 is maintained in an optimum state without being insufficient or excessive.

Consequently, it is possible to prevent damage to the PCB strip 100 and a flash of the molding resin because the clamping pressure applied to the PCB strip 100 is maintained in an optimum state depending on the thickness of the PCB strip 100.

In the mold configuration according to the second embodiment of the present invention, the portion of the top cavity insert 40 disposed beneath the elastic member 65 clamps portions of the PCB strip 100 disposed near runner gates. Since the portions of the PCB strip 100 have a thickness smaller than other portions of the PCB strip 100 (FIG. 15 and Table 2), such a thickness deviation of the PCB strip 100 can be effectively offset by the clamping effect.

In addition, it is possible to easily carry out the molding for PCB strips 100 having various thicknesses in a considerably wide range by selecting height adjusting members 50 having an appropriate thickness. As apparent from the above description, the height adjusting members 50 can be easily mounted and separated.

Figure 10:
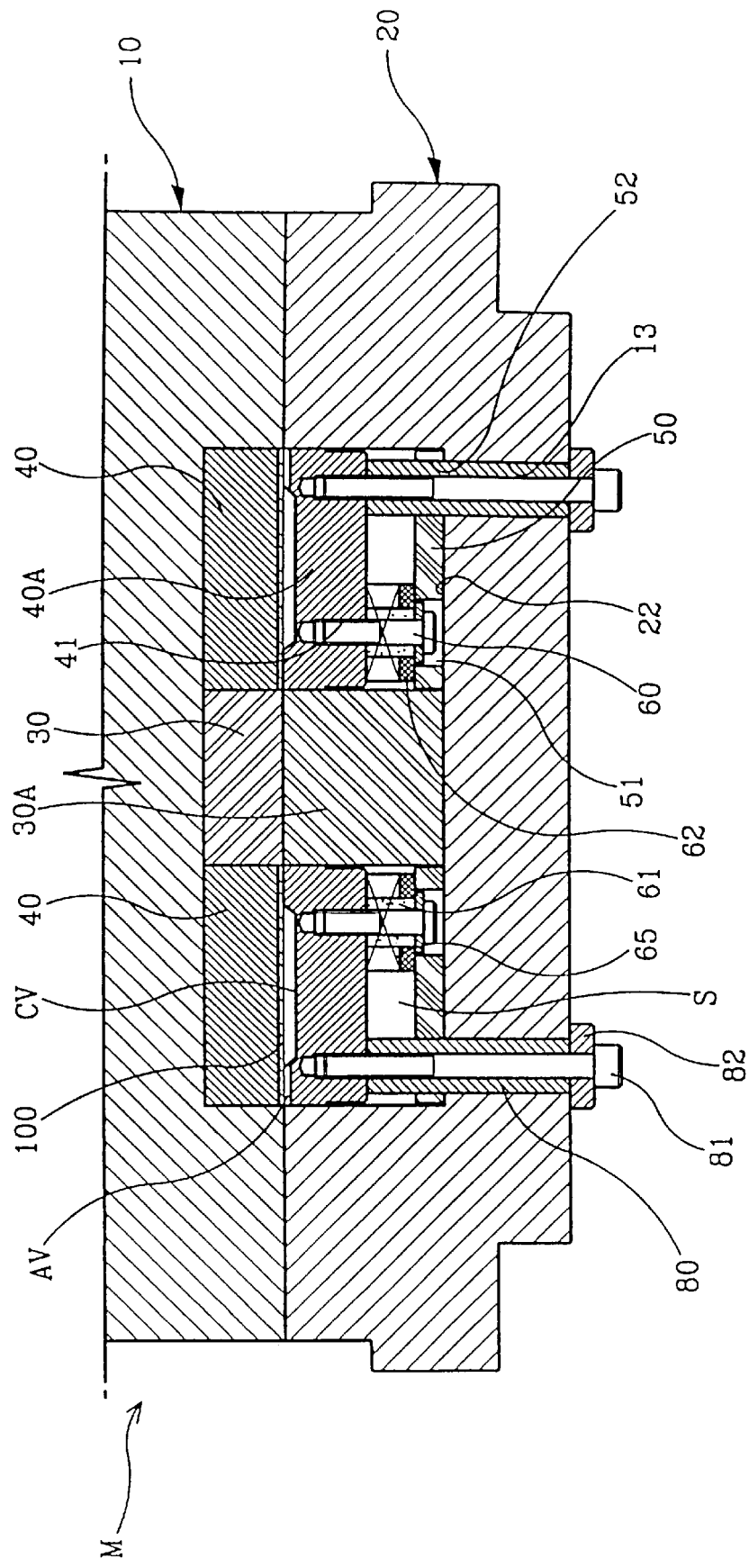
FIG. 10 is a sectional view illustrating a modification of the second embodiment of the present invention.

FIG. 10 is a sectional view illustrating a modification of the second embodiment of the present invention. In this case, the height adjusting members 50 and elastic members 65 are installed in the bottom mold 20, as shown in FIG. 10. In this case, the clamping members 81 serve to fixedly mount the bottom cavity inserts 40A to the base 21 of the bottom mold 20. Since the remaining configurations are identical to those in the case of FIG. 6, no detailed description thereof will be made.

Where the mold M including height adjusting members and elastic members in accordance with the second embodiment of the present invention is used, it is possible to maintain an optimum and uniform clamping pressure between the top and bottom molds for a variety of PCB strips having a thickness deviation among different portions thereof or having various average thicknesses, upon molding resin encapsulants on those PCB strips, thereby achieving an improvement in the quality of finally produced packages while preventing a sweeping phenomenon of bonding wires electrically connecting a semiconductor chip to conductive traces.

Figure 11:
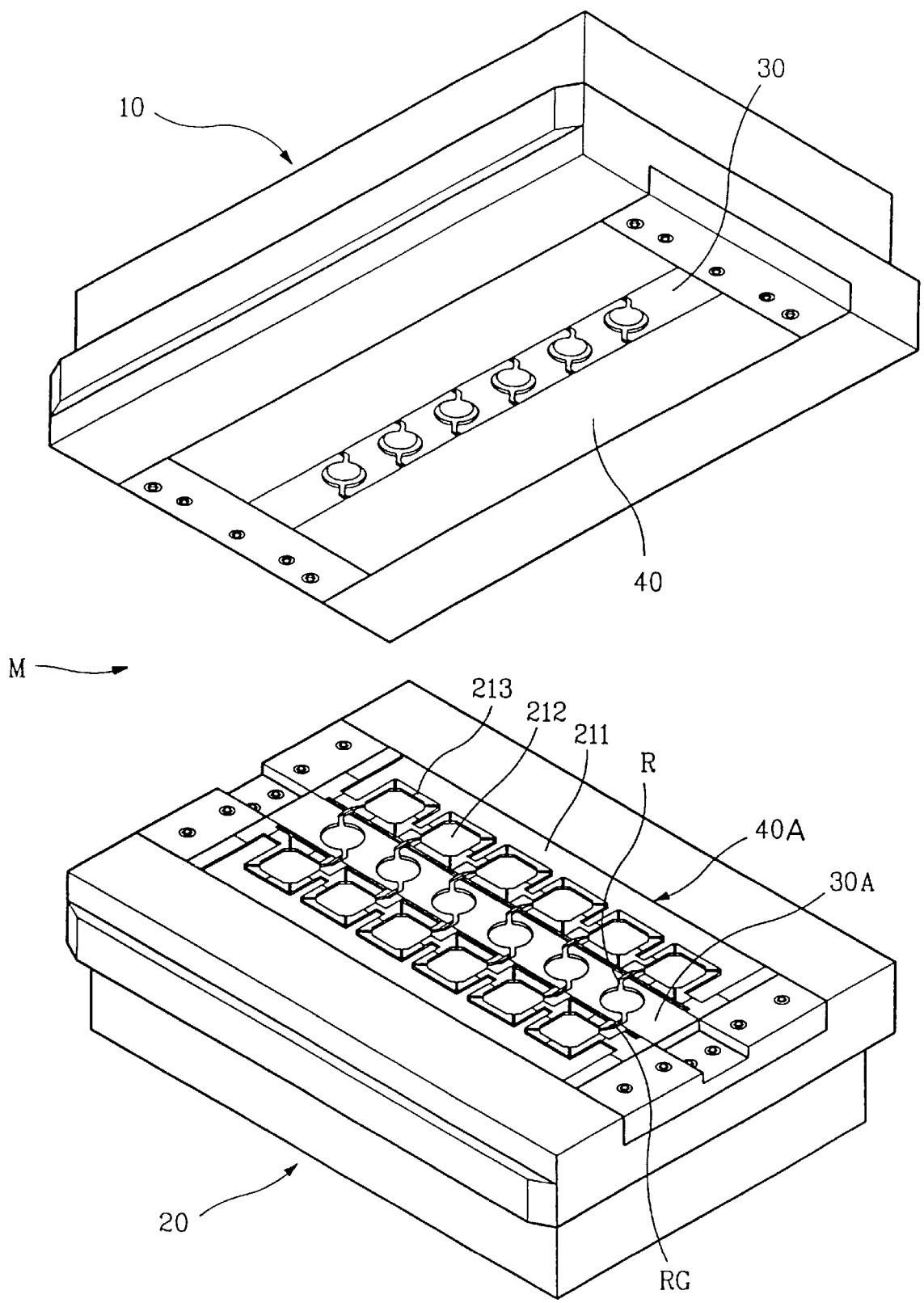
FIG. 11 is an exploded perspective view illustrating a mold including top and bottom molds according to a third embodiment of the present invention.

FIG. 11 is an exploded perspective view illustrating a manual transfer type mold according to a third embodiment of the present invention. The mold M according to the third embodiment has the same basic configuration as that of FIG. 1 except that it includes clamping regions 213 having different heights to offset a thickness deviation among different portions of a PCB strip. Accordingly, no detailed description will be made for the basic configuration. In this embodiment, constituting elements respectively corresponding to those in the first embodiment are denoted by the same reference numerals or characters.

Before describing the mold configuration according to the third embodiment in conjunction with FIGS. 12 and 13, a thickness deviation among different portions of a PCB strip 100 for BGA semiconductor packages will be described in conjunction with FIG. 14. As shown in FIG. 14, the PCB strip 100, which has a multilayer structure, is provided with a plurality of molding regions (indicated by the dotted lines in FIG. 14). The regions a to h of the PCB strip 100 have different thicknesses because of, for example, a solder mask layer coated over the substrate of the PCB strip in such a manner that the thickness at both ends thereof is larger than that at the other portions.

The following Table 2 shows the thicknesses of different portions of the PCB strip 100.

TABLE 2

Thicknesses of Different Regions of PCB strip

Unit: mm

| NO. | a | b | c | d | e | f | g | h | MIN | MAX | Avg |
|---|---|---|---|---|---|---|---|---|---|---|---|
| 1 | 0.360 | 0.350 | 0.348 | 0.348 | 0.342 | 0.341 | 0.342 | 0.342 | 0.341 | 0.360 | 0.347 |
| 2 | 0.351 | 0.352 | 0.344 | 0.345 | 0.342 | 0.340 | 0.341 | 0.340 | 0.340 | 0.352 | 0.344 |
| 3 | 0.348 | 0.347 | 0.340 | 0.345 | 0.338 | 0.339 | 0.340 | 0.340 | 0.338 | 0.348 | 0.342 |
| 4 | 0.340 | 0.342 | 0.330 | 0.332 | 0.330 | 0.298 | 0.331 | 0.331 | 0.298 | 0.342 | 0.329 |
| 5 | 0.372 | 0.358 | 0.342 | 0.345 | 0.340 | 0.340 | 0.343 | 0.341 | 0.340 | 0.358 | 0.348 |
| 6 | 0.352 | 0.347 | 0.343 | 0.342 | 0.340 | 0.340 | 0.340 | 0.338 | 0.338 | 0.352 | 0.343 |
| 7 | 0.370 | 0.362 | 0.361 | 0.355 | 0.358 | 0.350 | 0.351 | 0.352 | 0.350 | 0.370 | 0.358 |
| 8 | 0.360 | 0.357 | 0.352 | 0.352 | 0.349 | 0.345 | 0.346 | 0.352 | 0.345 | 0.360 | 0.351 |
| 9 | 0.350 | 0.353 | 0.347 | 0.345 | 0.340 | 0.341 | 0.340 | 0.340 | 0.340 | 0.353 | 0.345 |
| 10 | 0.360 | 0.372 | 0.360 | 0.368 | 0.358 | 0.358 | 0.358 | 0.365 | 0.358 | 0.372 | 0.363 |
| MIN | 0.340 | 0.342 | 0.330 | 0.332 | 0.330 | 0.298 | 0.331 | 0.331 | | | |
| MAX | 0.372 | 0.372 | 0.361 | 0.368 | 0.358 | 0.358 | 0.358 | 0.365 | | | |
| Avg | 0.356 | 0.354 | 0.347 | 0.348 | 0.344 | 0.339 | 0.343 | 0.344 | | | |

As shown in Table 2, the PCB strip 100 has the greatest thickness at both end regions a and b thereof while having gradually reduced thicknesses at resin encapsulant molding regions (indicated by the dotted lines) at the end regions, namely, regions c and d facing respective degating regions D which are molding regions for surplus molding resin, at regions e and h disposed near the degating regions D respectively associated with the end resin encapsulant molding regions, at a region g facing a degating region D for the central resin encapsulant molding region, and at a runner region f.

Accordingly, the PCB 100 has a great thickness at both end regions and regions facing degating regions D.

Figure 12:
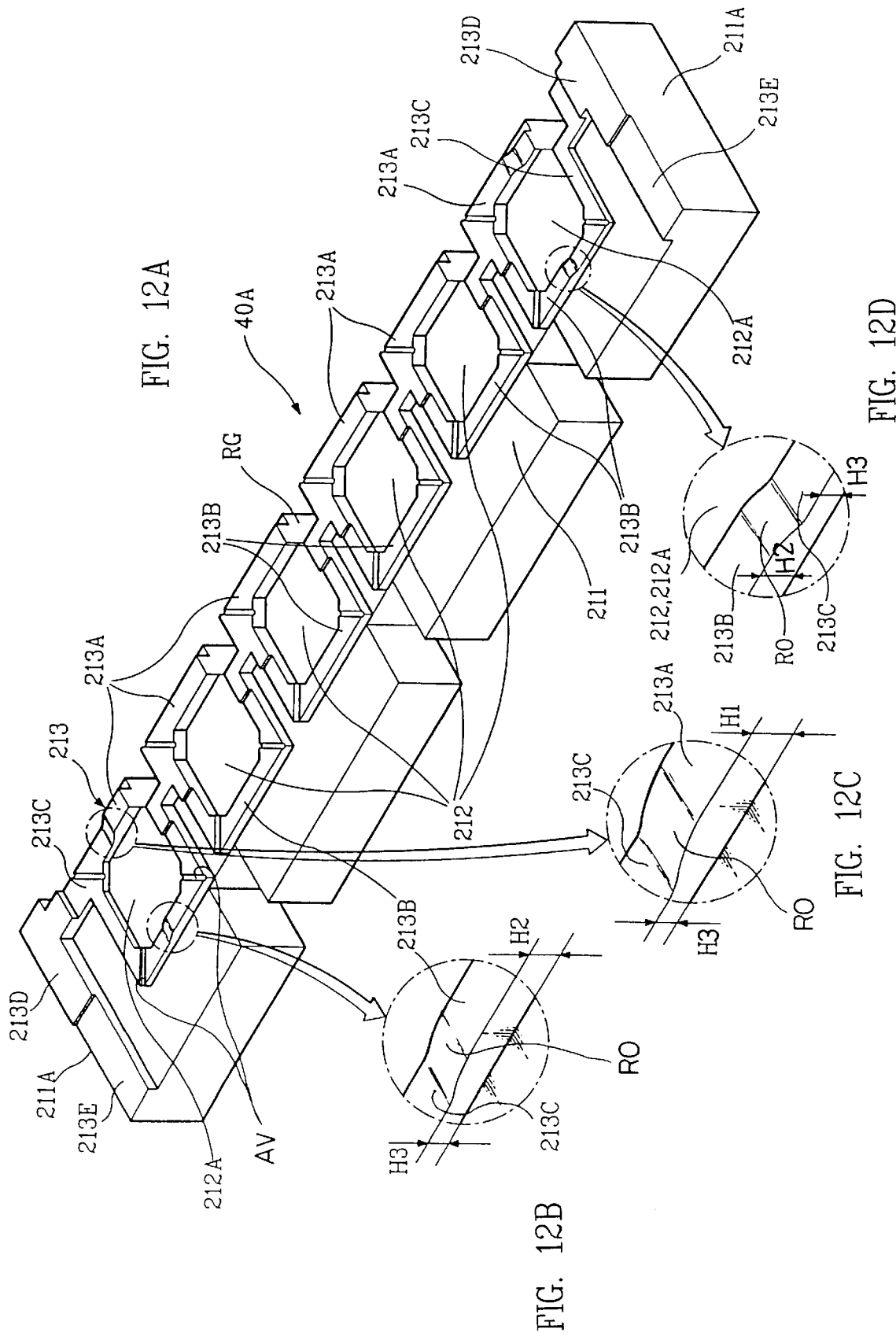
FIG. 12 is a perspective view illustrating a bottom cavity insert mounted in the bottom mold according to the third embodiment of the present invention.

FIG. 12 is a perspective view illustrating a bottom cavity insert 40A mounted in the bottom mold 20 according to the third embodiment of the present invention. As shown in FIG. 12, the bottom cavity insert 40A includes a base 211, a plurality of central and end concave portions 212 and 212A longitudinally arranged on the upper surface of the base 211, and a plurality of peripheral clamping regions 213 defining the concave portions 212 and 212A.

Each of the central and end concave portions 212 and 212A is provided at one corner thereof with a runner gate RG serving as a passage for a melted resin in a molding process. 25 Air vents AV are formed at the remaining three corners of each concave portion, respectively.

Clamping regions 213 are formed along outer edges of each concave portion 212 or 212A. Each clamping region 213 has a protrusion extending upwardly from the upper surface of the base 211 to a desired height. The clamping regions 213 associated with each concave portion 212 or 212A comprise a first clamping region 213A having the greatest height H1, a second clamping region 213B having a medium height H2, and a third clamping region 213C having the least height H3. The junction or boundary between adjacent clamping regions has a smooth gradient. That is, round portions RO are formed at the junction or boundaries of clamping regions, respectively. The bottom cavity insert 40A is also provided, at its upper surface portion adjacent to the opposite ends 211A, with a protrusion 213D having the same height as the first clamping regions 213A having the greatest height H1 and a protrusion 213E having the same height as the second clamping regions 213B having the medium height H2.

Figure 13:
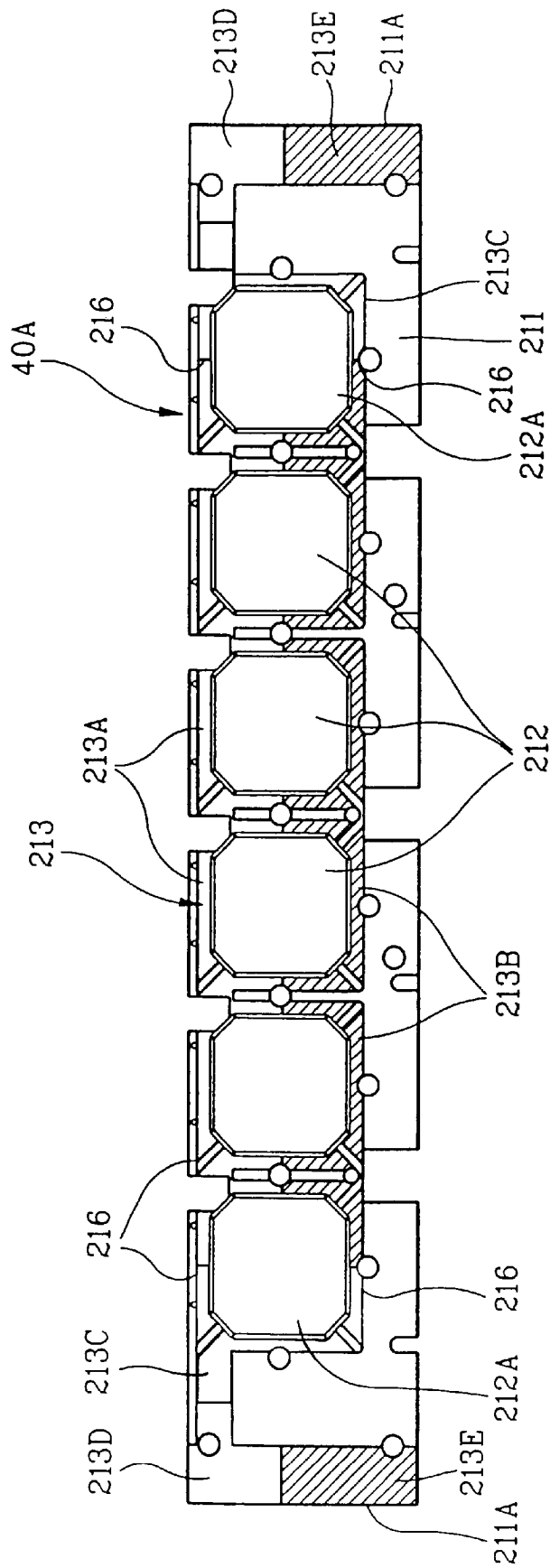
FIG. 13 is a plan view illustrating a protruded state of the bottom cavity insert shown in FIG. 12.
Figure 14:
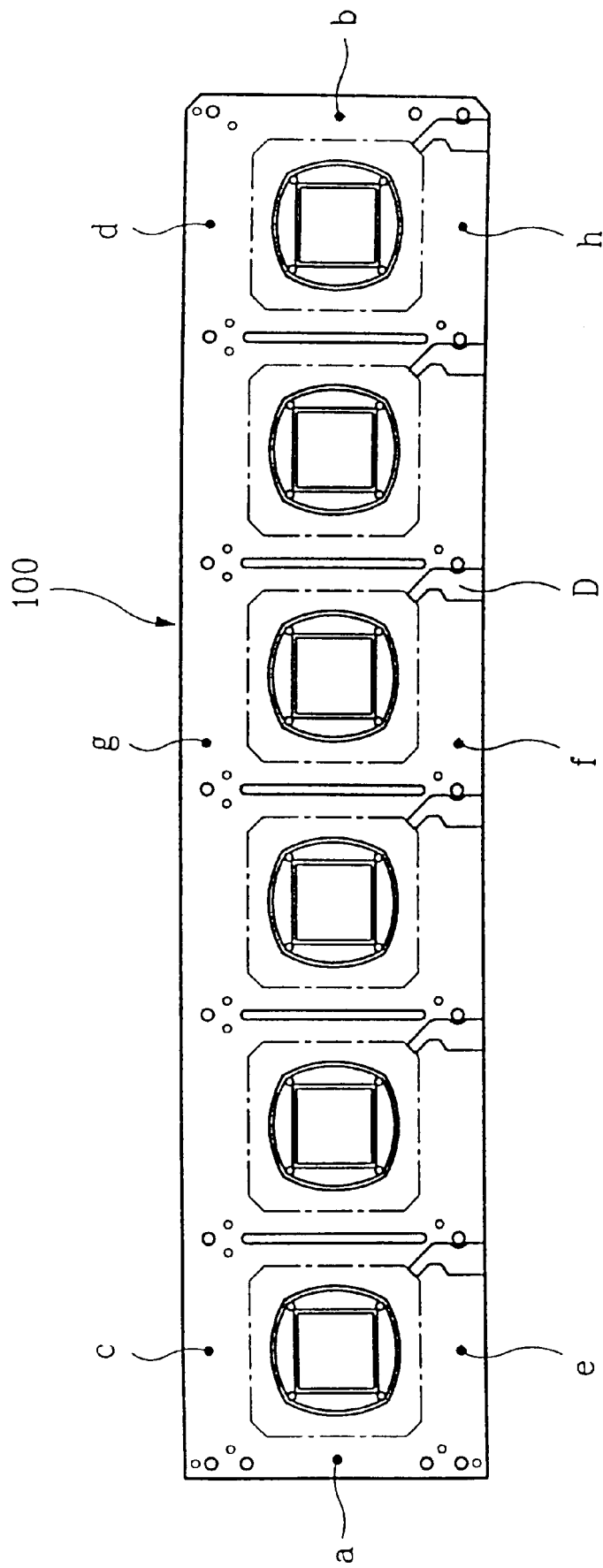
FIG. 14 is a plan view illustrating a thickness deviation of different portions of a PCB strip for BGA semiconductor packages.

FIG. 13 is a plan view illustrating the protruded state of the bottom cavity insert shown in FIG. 12.

Now, the procedure of molding resin encapsulants on a PCB strip 100 having a thickness deviation among different portions thereof using the mold M including the bottom cavity insert 40A provided with the clamping regions 213A to 213C having different heights in accordance with the third embodiment of the present invention will be described in conjunction with FIG. 13.

When a PCB strip 100 is fed to the bottom mold 20, it is laid on the bottom cavity insert 40A in such a manner that the thinnest portions e, f and h thereof adjacent to the degating region D are positioned on the first clamping regions 213A (corresponding to the white portions disposed on the outside of the concave portions 212 and 212A) having the greatest height H1, that the regions c, g and d thereof facing the degating region D and having a thickness slightly larger than the thickness of the regions e, f, and h are positioned on the second clamping regions 213B (corresponding to the shaded portions) having the medium height H2, and that the thickest end regions a and b thereof are positioned on the third clamping regions 213C (corresponding to the black portions) having the least height H3 and disposed on the outside of the end concave portions 212A.

When the PCB strip 100 is laid on the bottom cavity insert 40A in the above-mentioned manner, the bottom mold 20 is raised to be coupled to the upper mold 10. As the bottom mold 20 is coupled to the upper mold 10, the PCB strip 100 is depressed by an associated one of the top cavity inserts 40 of the upper mold 10. At this time, a uniform clamping pressure is applied over the whole portion of the PCB strip 100, which has a thickness deviation among different portions thereof, because the bottom cavity insert 40A has clamping regions 213A to 213C having different heights to offset the thickness deviation.

In other words, the clamping regions 213A to 213C of the bottom cavity insert 40A have height deviations respectively corresponding to the thickness deviations of the PCB strip 100 so as to offset those thickness deviations. Accordingly, a uniform clamping pressure from the bottom cavity insert 40A is applied over the whole portion of the PCB strip 100.

Since the bottom cavity insert 40A has the round portions RO at the boundaries of the clamping regions 213A to 213C, as mentioned above, it is possible to prevent the PCB strip 100 from being damaged during the application of the clamping pressure.

Although the clamping regions having different heights to offset a thickness deviation among different portions of the PCB strip has been described as being provided at the bottom cavity insert of the bottom mold, the third embodiment of the present invention is not limited thereto. If necessary, such clamping regions may be provided at the top cavity insert of the top mold.

Where the mold provided with clamping regions having different heights at its top or bottom cavity insert is used to mold PCB strips having a thickness deviation among different portions thereof, it is possible to offset the thickness deviation of those PCB strips, so that an optimum and uniform clamping pressure is maintained between the top and bottom molds upon molding resin encapsulants on the PCB strips, thereby achieving an improvement in the quality of finally produced packages while preventing a sweeping phenomenon.

Figure 15A:
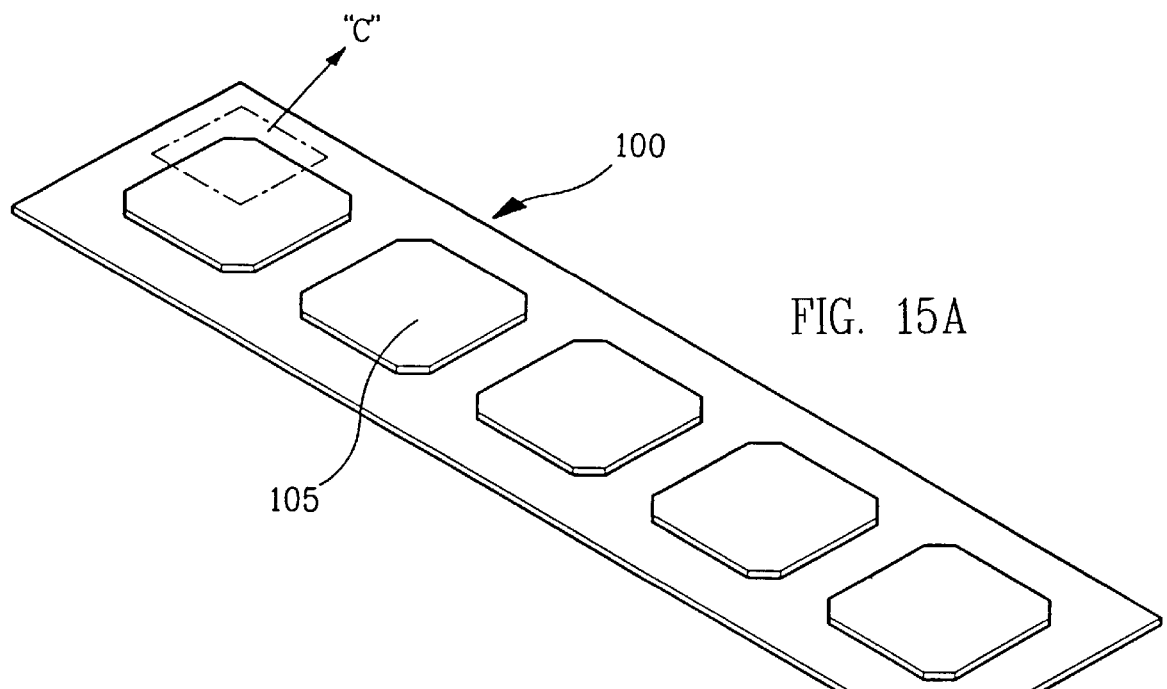
FIG. 15 is a perspective view illustrating a PCB strip which has been mounted with semiconductor chips and molded with resin encapsulants by use of the mold according to the present invention.
Figure 15B:
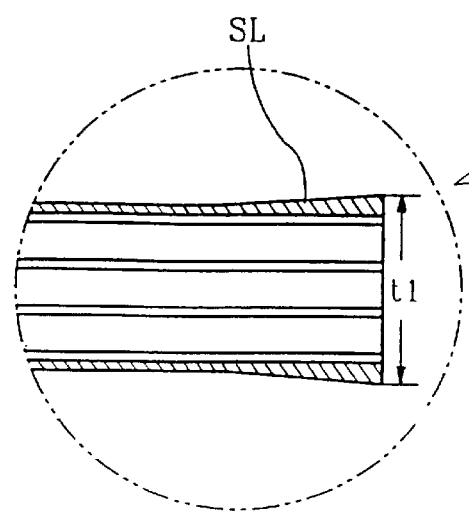

FIG. 15 is a perspective view illustrating a PCB strip 100 which has been mounted with semiconductor chips and molded with resin encapsulants 105 by use of the mold M according to 11 one of the first, second and third embodiments of the present invention. Individual regions of the PCB strip 100 including molded resin encapsulants 105 are unit PCB's. As shown in the enlarged portion of FIG. 15, the PCB strip 100 has an increased thickness at its cut end due to burrs generated in a cutting process.

Figure 16:
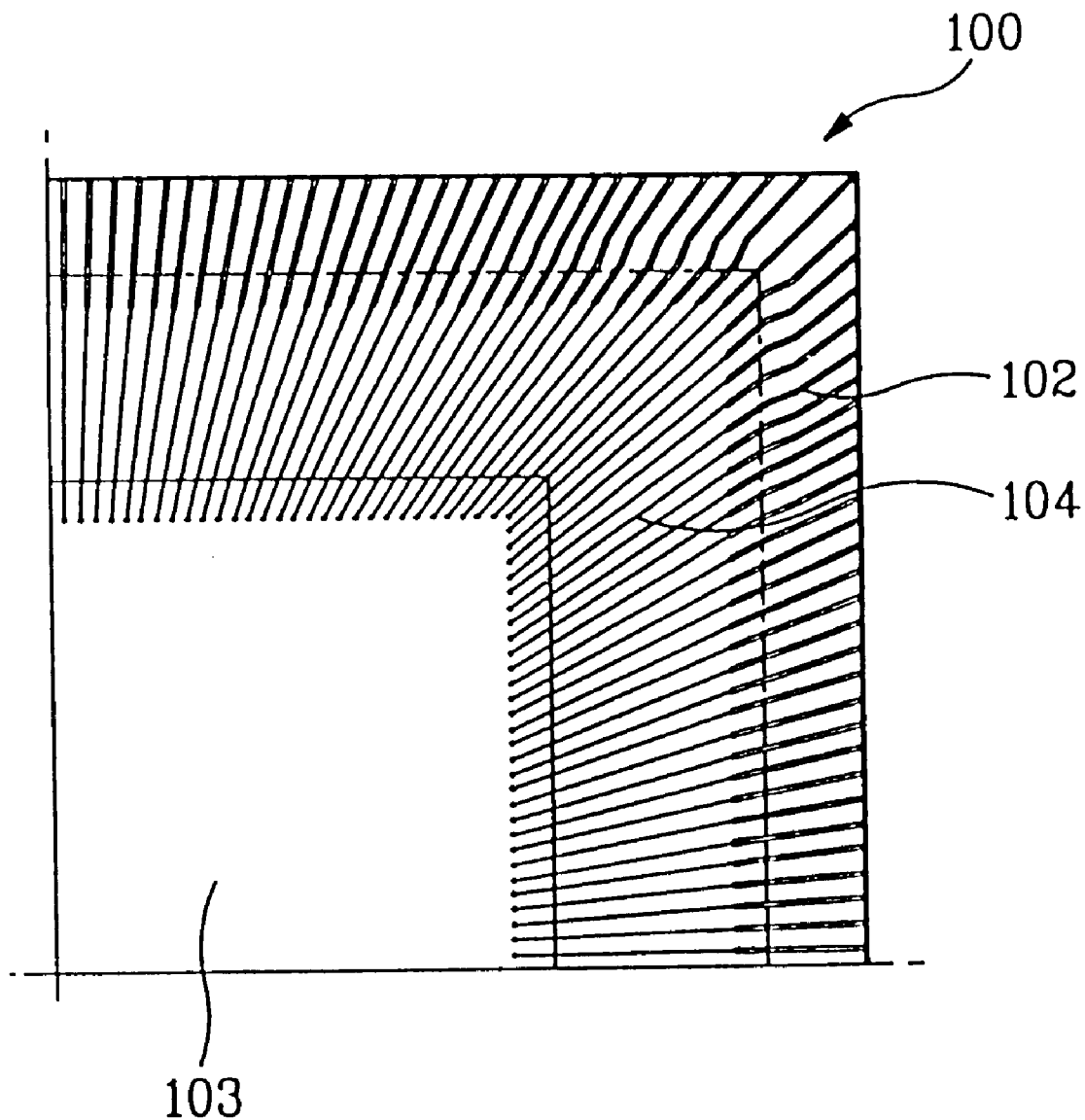
FIG. 16 is a partially-enlarged plan view illustrating the portion C of FIG. 15 in a perspective manner.

FIG. 16 is a partially-enlarged plan view illustrating the portion C of FIG. 15 in a perspective manner. Referring to FIG. 16, it can be found that bonding wires 104, which electrically connect a semiconductor chip 103 to conductive traces 102 of a circuit pattern, are maintained in a uniformly spaced state without any wire sweeping phenomenon because an optimum clamping pressure is applied to the PCB strip between the top and bottom molds upon molding resin encapsulants (regions indicated by the dotted line).

Figure 22:
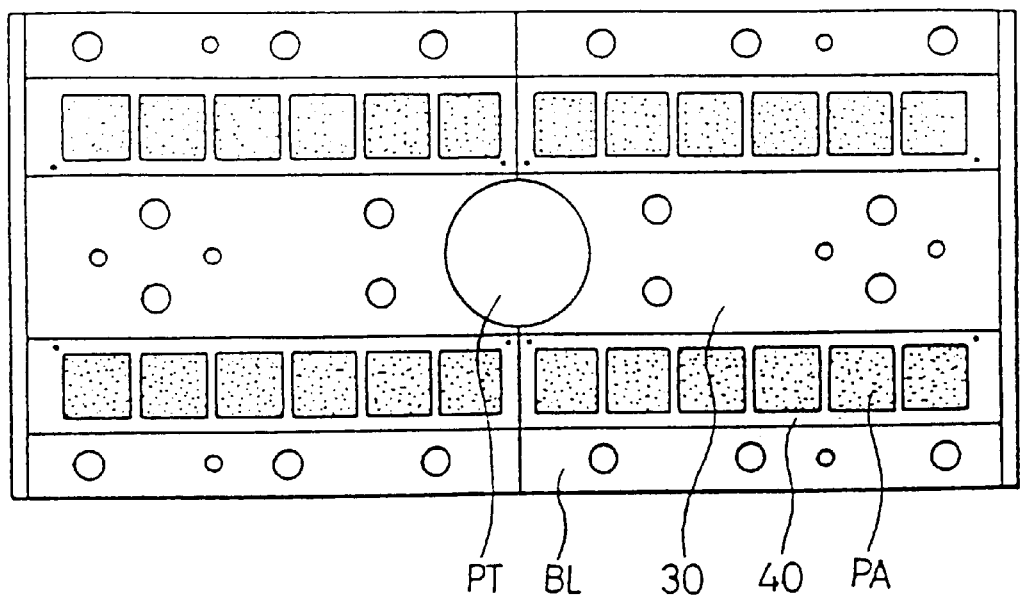
FIG. 22 is a bottom view illustrating the top mold according to the fifth embodiment of the present invention.

Since a uniform and optimum clamping pressure is applied to the PCB strip 100 between the bottom and top molds, it is possible to prevent the PCB strip 100 from being deformed. Accordingly, there is no blocking of air vents AV. As a result, air existing in cavities CV are smoothly and uniformly vented when a melted molding resin of high temperature and pressure is introduced into the cavities CV through runner gates RG. That is, a desirable resin filling profile is exhibited. Consequently, the quality of the finally produced package is superior (FIG. 22).

FIG. 17 is a perspective view illustrating a bottom cavity insert 40A mounted in a bottom mold 20 included in a mold M according to a fourth embodiment of the present invention. In this embodiment, constituting elements respectively corresponding to those in the first embodiment are denoted by the same reference numerals or characters. As shown in FIG. 17, the bottom cavity insert 40A has a plurality of aligned concave portions 45. Each of the concave portions 45 is provided at one corner thereof with a runner gate RG communicating with a bottom center block (not shown). Air vents AV are formed at the remaining three corners of each concave portion 45, respectively. Since these configurations are the same as those in the above-mentioned embodiments of the present invention, no detailed description thereof will be made.

Figure 18A:
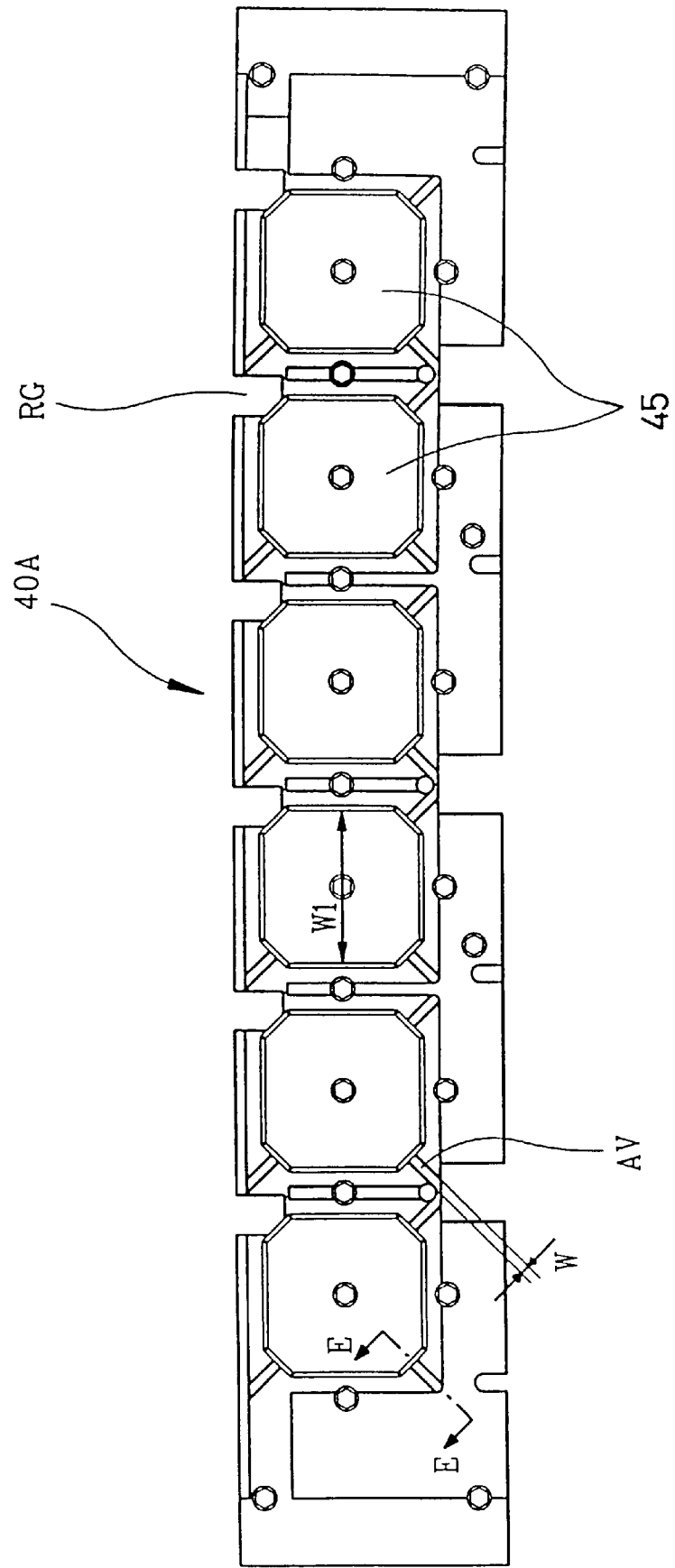
FIGS. 18A and 18B are plan views respectively illustrating the bottom cavity insert according to the fourth embodiment of the present invention.
Figure 18B:
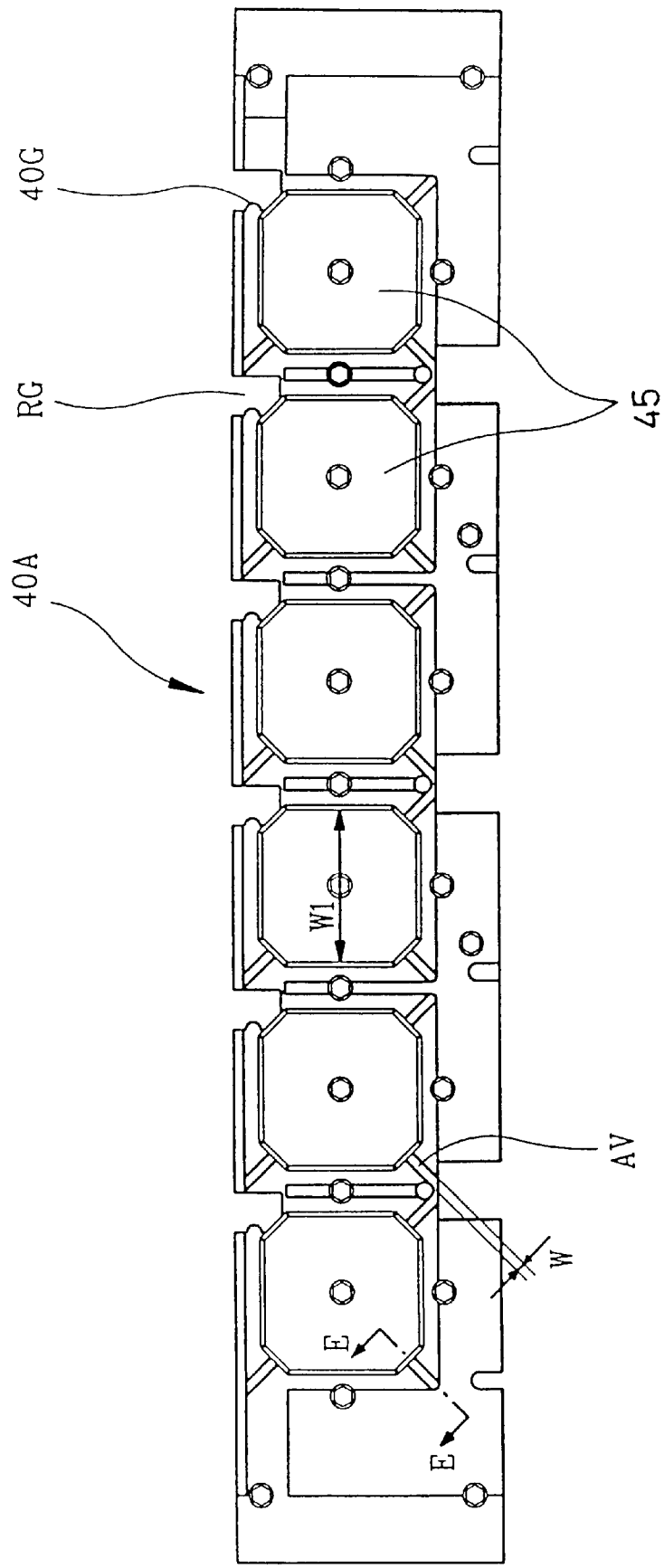
Figure 19:
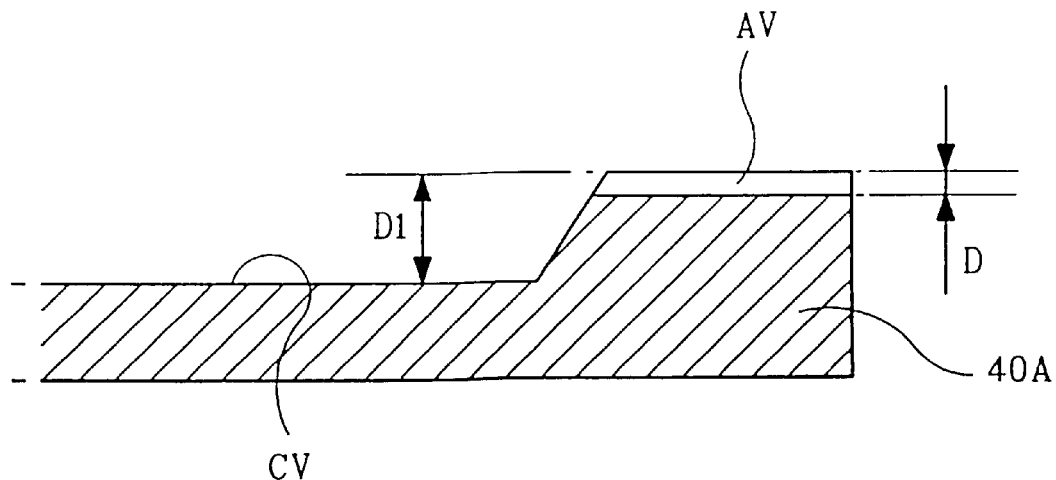
FIG. 19 is a cross-sectional view taken along the line E—E of FIG. 18A or 18B.

FIGS. 18A and 18B are plan views respectively illustrating the bottom cavity insert 40A according to the fourth embodiment of the present invention whereas FIG. 19 is a cross-sectional view taken along the line E—E of FIG. 18A or 18B.

The width W of the air vents AV respectively formed at the corners of each concave portion 45 except for the corner formed with the runner gate RG corresponds to about 3 to 20% of the width Wl of the concave portion 45. The depth D of each air vent AV corresponds to about 0.5 to 15% of the depth D1 of the concave portion 45.

Air existing in cavities CV are smoothly and uniformly vented through the air vents AV when a melted molding resin is introduced into the cavities CV through the runner gate RG. Accordingly, a desirable resin filling profile is exhibited. That is, the quality of the finally produced resin encapsulants is superior, as shown in FIG. 22.

Although the air vents AV have been described as being formed at the corners of each concave portion 45 included in the bottom mold 20, they may be formed at the top mold 10.

Table 3 shows results obtained after resin encapsulants are molded using the mold which is provided with the air vents AV having the above-mentioned dimensions in accordance with the present invention.

The mold M used to mold resin encapsulants has a step having a height of 0.22 mm.

TABLE 3

Result of Molding Test Depending on Average Thickness of PCB Strip

| Sample | PCB Th. (mm) | Molded State of Resin Encapsulant | | | State of Strip | | | Results |
|---|---|---|---|---|---|---|---|---|
| | | Void | Flash | Flister | Deform | Crack | Sweeping | |
| 1 | 0.336 | ○ | Δ | ○ | ○ | ○ | ○ | Good |
| 2 | 0.339 | ○ | ○ | ○ | ○ | ○ | ○ | Good |
| 3 | 0.342 | ○ | ○ | ○ | ○ | ○ | ○ | Good |
| 4 | 0.345 | ○ | ○ | ○ | ○ | ○ | ○ | Good |
| 5 | 0.346 | ○ | ○ | ○ | ○ | ○ | ○ | Good |
| 6 | 0.352 | ○ | ○ | ○ | ○ | ○ | ○ | Good |
| 7 | 0.360 | ○ | ○ | ○ | ○ | ○ | ○ | Good |
| 8 | 0.363 | X | ○ | Δ | X | ○ | Δ | Bad |

Not Generated: ○
Unclear: Δ
Generated: X
*Molding Condition for Resin Encapsulant
Molding Resin Injection Pressure: 80 kg/cm$^2$
Molding Time: 10 to 15 sec.
PCB Clamping Pressure: 200 to 250 kg/cm$^2$ As apparent from the above results, where the step between the lower surface of the top mold base and the lower surface of the top cavity insert 40 has a height t of 0.22 mm, molded states of resin encapsulants 105 molded on integrated circuits respectively included in units of individual PCB strips 100 depend on the average thicknesses of those PCB strips 100. That is, a slight flash phenomenon occurs in the case of a PCB strip 100 of 0.336 mm having a great average thickness. In the case of a PCB strip of 0.363 mm, a generation of voids and a degradation in the quality due to a deformation of the PCB strip are experienced. Desirable molded states of resin encapsulants 105 are obtained for the remaining PCB strips 100 having thicknesses different from those of the above-mentioned samples. Accordingly, it is possible to improve the quality of finally produced BGA semiconductor packages while minimizing a production of degraded packages.

As shown in FIG. 18B, a protrusion 40G may be inwardly protruded from one side surface of each runner gate RG formed in the bottom cavity insert 40A. The protrusion 40G serves to prevent a molding resin from being leaked from a runner R when the molding resin fills a cavity under pressure.

Figure 20:
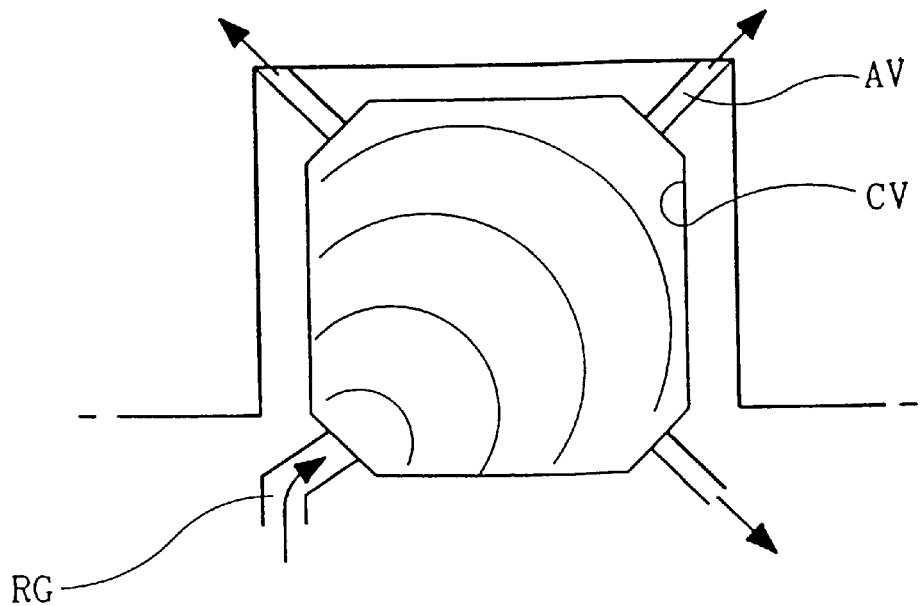
FIG. 20 is a schematic view illustrating a desirable resin filling profile exhibited after molding a resin encapsulant by use of the mold according to the fourth embodiment of the present invention.

FIG. 20 is a schematic view illustrating a desirable resin filling profile exhibited after molding a resin encapsulant by use of the mold according to the fourth embodiment of the present invention. In the mold according to the fourth embodiment, air existing in cavities CV is smoothly and uniformly vented when a melted molding resin is introduced under pressure into the cavities CV through runner gates RG. That is, a desirable resin filling profile is exhibited, as shown in FIG. 20.

Thus, in accordance with the fourth embodiment of the present invention, it is possible to achieve an improvement in the quality of resin encapsulants molded on PCB strips by using a mold including a top or bottom cavity insert having air vents configured to have a width and a depth appropriately determined with regard to the area and depth of the cavity.

FIG. 21 is an exploded perspective view illustrating a manual transfer type mold according to a fifth embodiment of the present invention. In this embodiment, constituting elements respectively corresponding to those in the first embodiment are denoted by the same reference numerals or characters. The mold M according to the fifth embodiment includes a bottom mold 20 and a top mold 10 which are upwardly and downwardly movable with respect to each other.

Runners RN are arranged on the upper surface of the bottom mold 20. A molding resin passes through each runner RN. Loading bars 330 are mounted on the upper surface of the bottom mold 20.

Figure 23:
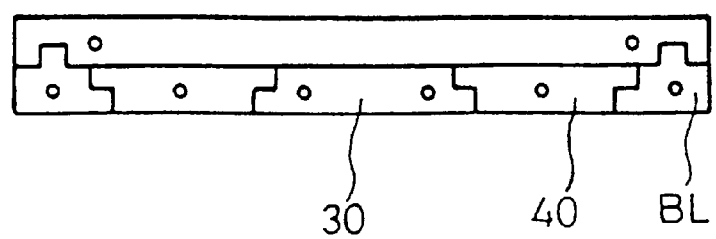
FIG. 23 is a sectional view illustrating the top mold of FIG. 22.

As shown in the bottom view of FIG. 22 and the sectional view of FIG. 23, the top mold 10, which is disposed above the bottom mold 20, includes a base 11, and a top center block 30 arranged at the central portion of the base 11 and provided with a pot PT. A plurality of top cavity inserts 40 are arranged in opposite sides of the top center block 30. Each top cavity insert 40 has concave portions 45 each having a rough surface formed by a discharge treatment process. Each top cavity insert 40 has a smooth surface formed by a polishing process at portions thereof other than the concave portion 45. A plurality of blocks BL are mounted to the base 11 on the outside of the top cavity inserts 40.

In accordance with the fifth embodiment of the present invention, as shown in FIG. 21, a PCB strip 100 and a cavity plate 350 are sequentially laid on each loading bar 330. The resulting assembly is fixedly mounted to the upper surface of the bottom mold 20.

When the bottom mold 20 is raised to the top mold 10 after the above-mentioned mounting procedure, the PCB strip 100 and cavity plate 350 are clamped between the top and 20 bottom molds 10 and 20. At the same time, a molding resin from the pot PT is supplied to packaging regions PA of the cavity plate 350 via each runner RN, so that resin encapsulants are molded on the PCB strip 100. After the resin encapsulants are cured, the bottom mold 20 moves downwardly to 25 separate the molded PCB strip 100 therefrom. Thus, the resin encapsulants of the PCB strip 100 are separated from the packaging regions PA of the associated top cavity insert 40 included in the top mold 10.

Since each top cavity insert 40 has a smooth surface formed by the polishing process at portions thereof other than the portions corresponding to the packaging regions PA, a surplus cured resin leaked from each runner RN and air vents AV can be easily separated from the top cavity insert 40. Accordingly, an improvement in the workability is achieved in the package molding process.

Where the top cavity insert 40 has damaged or abraded packaging regions PA, it should be replaced by a new one.

This replacement is easily achieved because the damaged or abraded top cavity insert 40 can be easily separated from the base 11 of the top mold 10 by virtue of the use of individually separable blocks BL.

As apparent from the above description, where the mold of the fifth embodiment is used, which includes cavity inserts each having a smooth surface formed by the polishing process at portions thereof other than the portions corresponding to the packaging regions, it is possible to achieve an easy separation of the top and bottom molds after molding resin encapsulants on PCB strips, thereby achieving an improvement in the workability and an improvement in the appearance of molded products.

Figure 24:
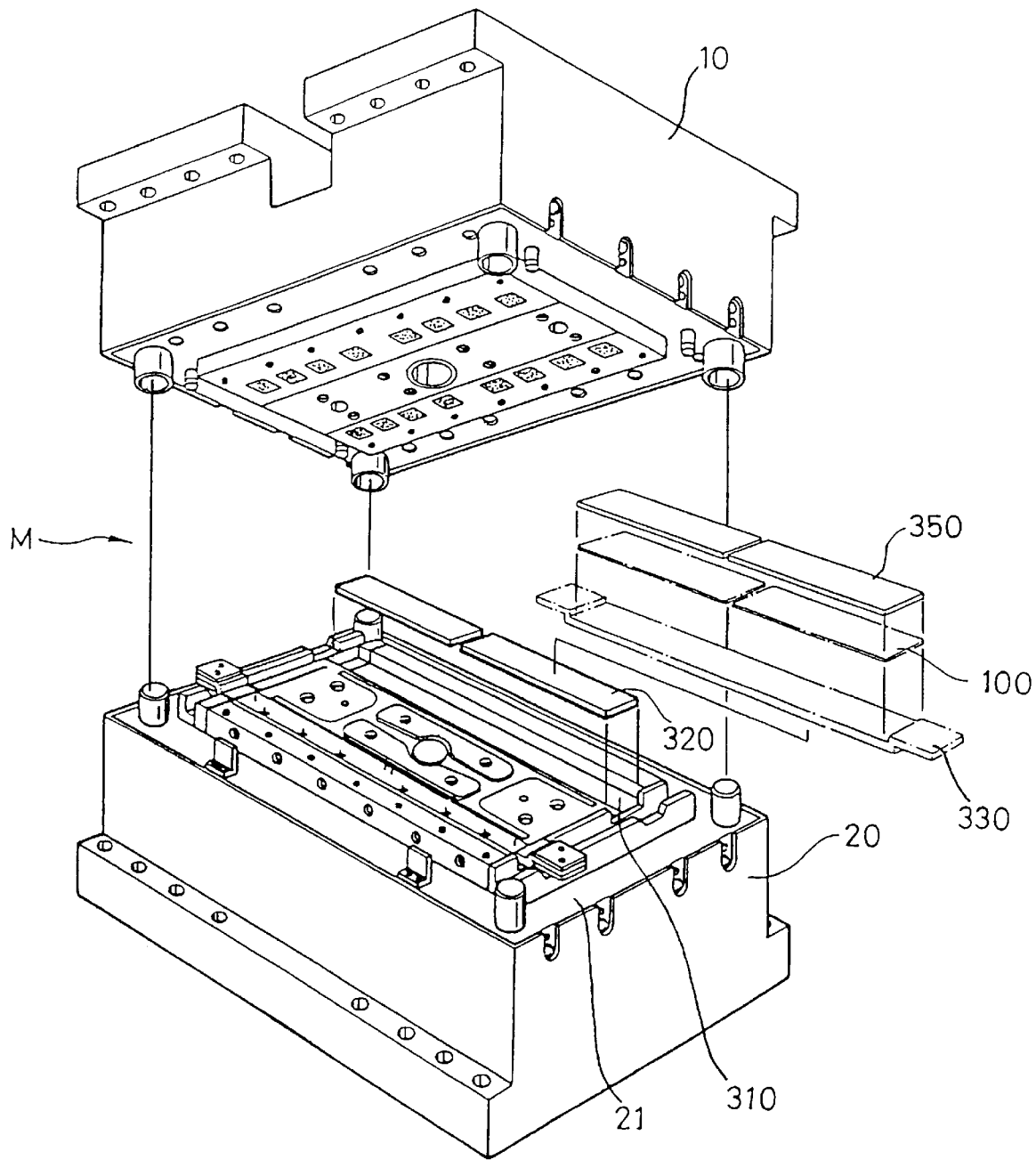
FIG. 24 is an exploded perspective view illustrating a mold including top and bottom molds according to a sixth embodiment of the present invention.
Figure 25:
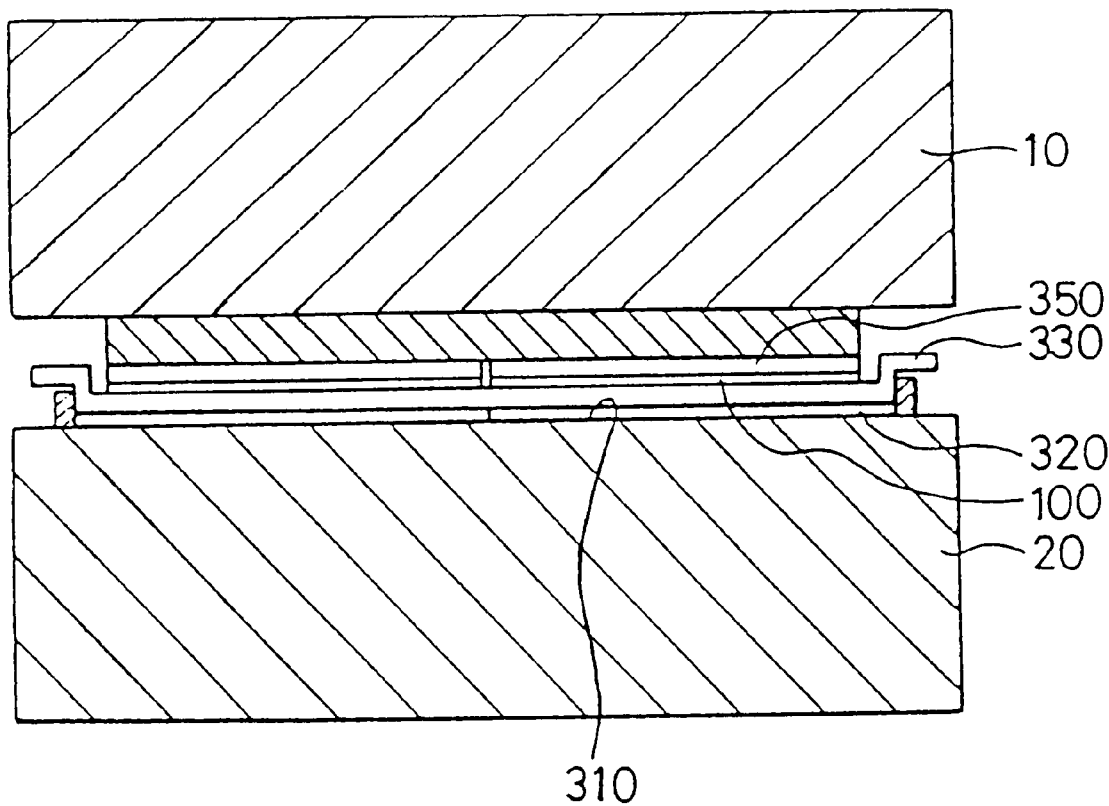
FIG. 25 is a sectional view illustrating a coupled state of the top and bottom molds according to the sixth embodiment of the present invention.

FIG. 24 is an exploded perspective view illustrating a manual transfer type mold M including top and bottom molds 10 and 20 in accordance with a sixth embodiment of the present invention. FIG. 25 is a sectional view illustrating a coupled state of the top and bottom molds 10 and 20 shown in FIG. 24. The mold of the sixth embodiment has the same basic configuration as that of the fifth embodiment shown in FIG. 21, except that liners 320 having a desired thickness are used to control the height of molded resin encapsulants. Accordingly, only the configuration of the sixth embodiment different from that of the fifth embodiment will be described. In this embodiment, constituting elements respectively corresponding to those in the fifth embodiment are denoted by the same reference numerals or characters.

The base of the bottom mold 20 is provided at its upper surface with longitudinally extending recesses 310, as shown in FIGS. 24 and 25. Liners 320 are arranged on the bottom surface of each recess 310. A loading bar 330 is laid on the liners 320 in each recess 310. PCB strips 100 and cavity plates 350 are sequentially laid on the loading bar 330.

Where the above-mentioned liners 200 are used in the mold M, it is possible to control the height of resin encapsulants molded on a PCB strip, in which mounting of semiconductor chips and bonding of wires have been carried out. It is also possible to maintain an optimum clamping pressure between the top and bottom molds 10 and 20 for a variety of PCB strips having various average thicknesses. In order to offset a thickness deviation among different portions of a PCB strip, each liner 320 may have a thickness deviation corresponding to the thickness deviation of the PCB strip. In this case, a uniform clamping pressure can be applied over the whole portion of the PCB strip 100 between the top and bottom mold 10 and 20.

The above-mentioned control for the height of molded resin encapsulants is achieved by preparing a plurality of liners having a variety of thicknesses and appropriately selecting a desired one of the prepared liners capable of molding resin encapsulants having a desired thickness. That is, liners 320, which have a thickness meeting a desired is thickness of resin encapsulants to be molded, are first mounted in the bottom mold 20. On the liners 320, the loading bar 330, PCB strips 100 and cavity plates 350 are sequentially loaded. In this state, the bottom mold 20 is raised to be coupled to the top mold 10. A molding resin is then supplied to cavities, thereby forming resin encapsulants. After curing the resin encapsulants, the packaging process is completed.

Since it is possible not only to easily adjust the height of molded packages by the use of the liners 320, but also to easily select liners 320 having a desired thickness depending on a desired thickness of resin encapsulants to be molded, an improvement in the workability in the molding process and an improvement in the quality of molded PCB strips are obtained.

Where the manual transfer type mold, which includes detachable liners mounted to its bottom mold in accordance with the sixth embodiment of the present invention, is used, it is possible to maintain an optimum clamping pressure between the top and bottom molds for a variety of PCB strips having a thickness deviation among different portions thereof or having various average thicknesses, upon molding resin encapsulants on those PCB strips, thereby achieving an improvement in the workability and an improvement in the quality of finally produced packages while preventing a sweeping phenomenon.

Figure 26:
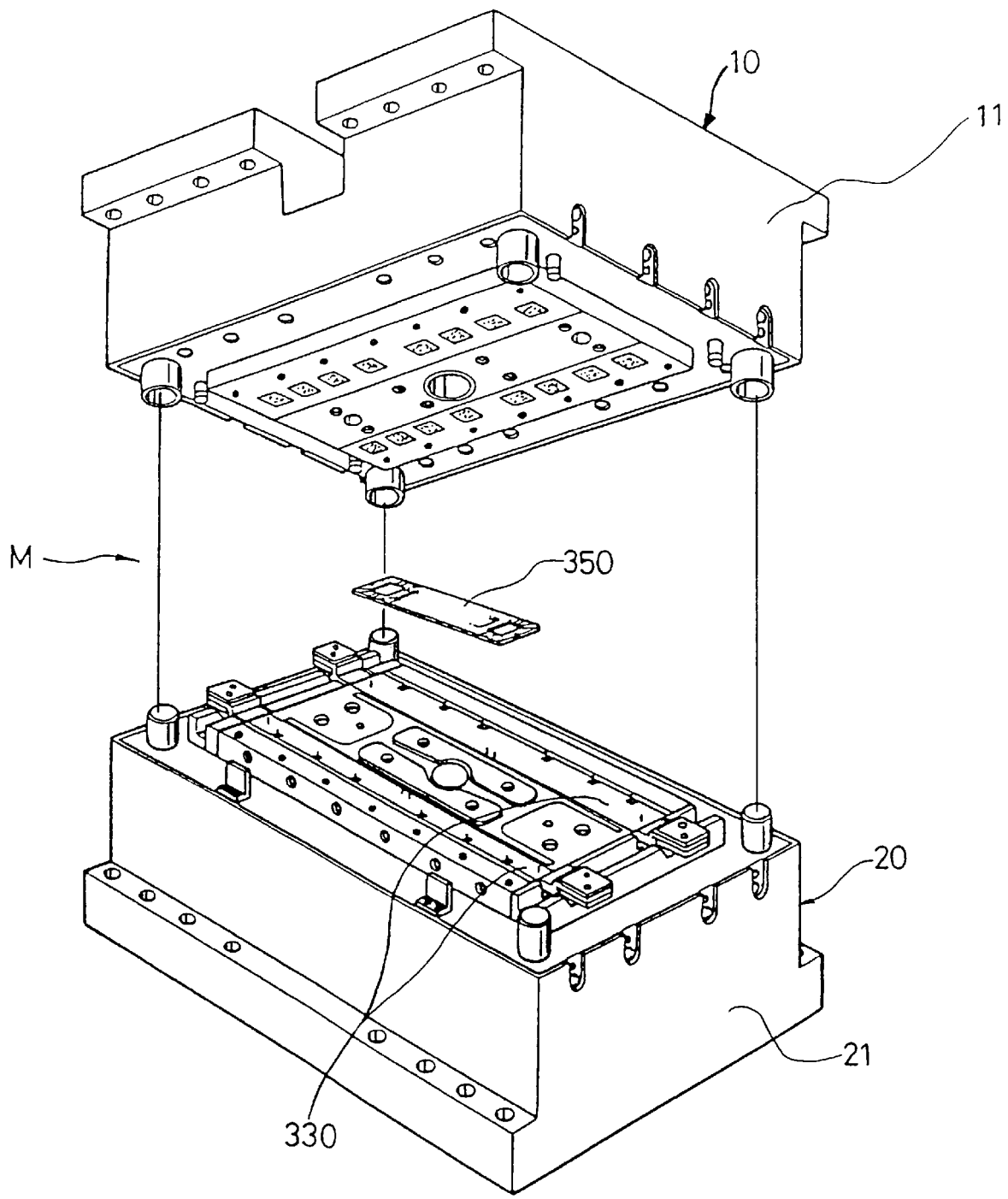
FIG. 26 is an exploded perspective view illustrating a mold including top and bottom molds according to a seventh embodiment of the present invention.
Figure 32:
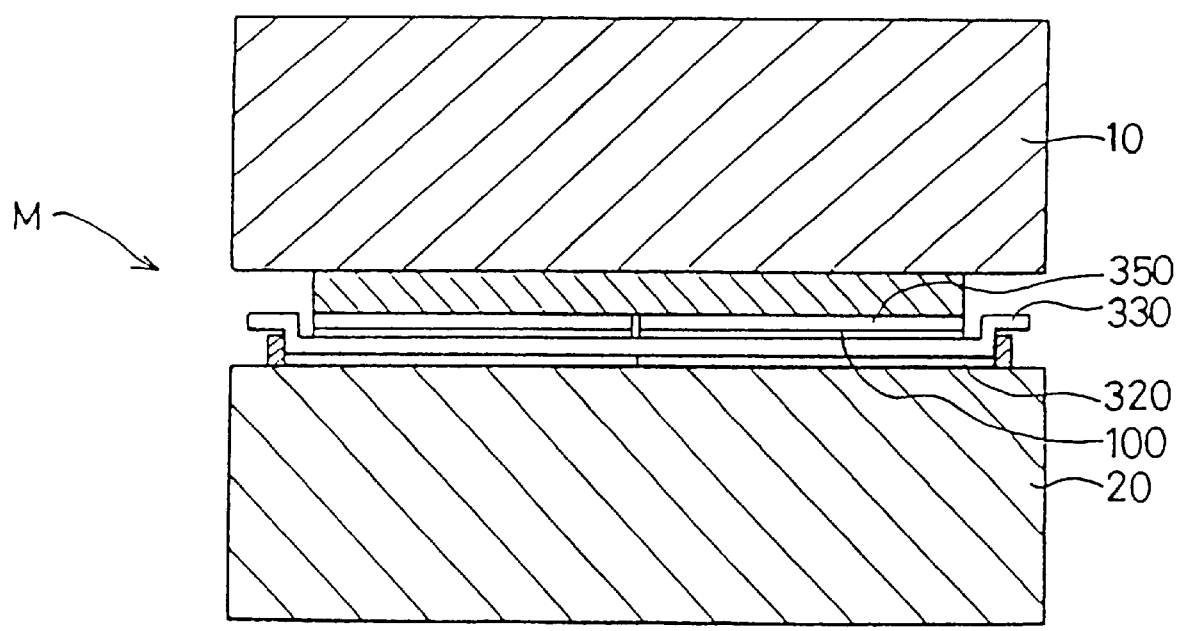
FIG. 32 is a sectional view illustrating a coupled state of the top and bottom molds according to the seventh embodiment of the present invention.
Figure 33:
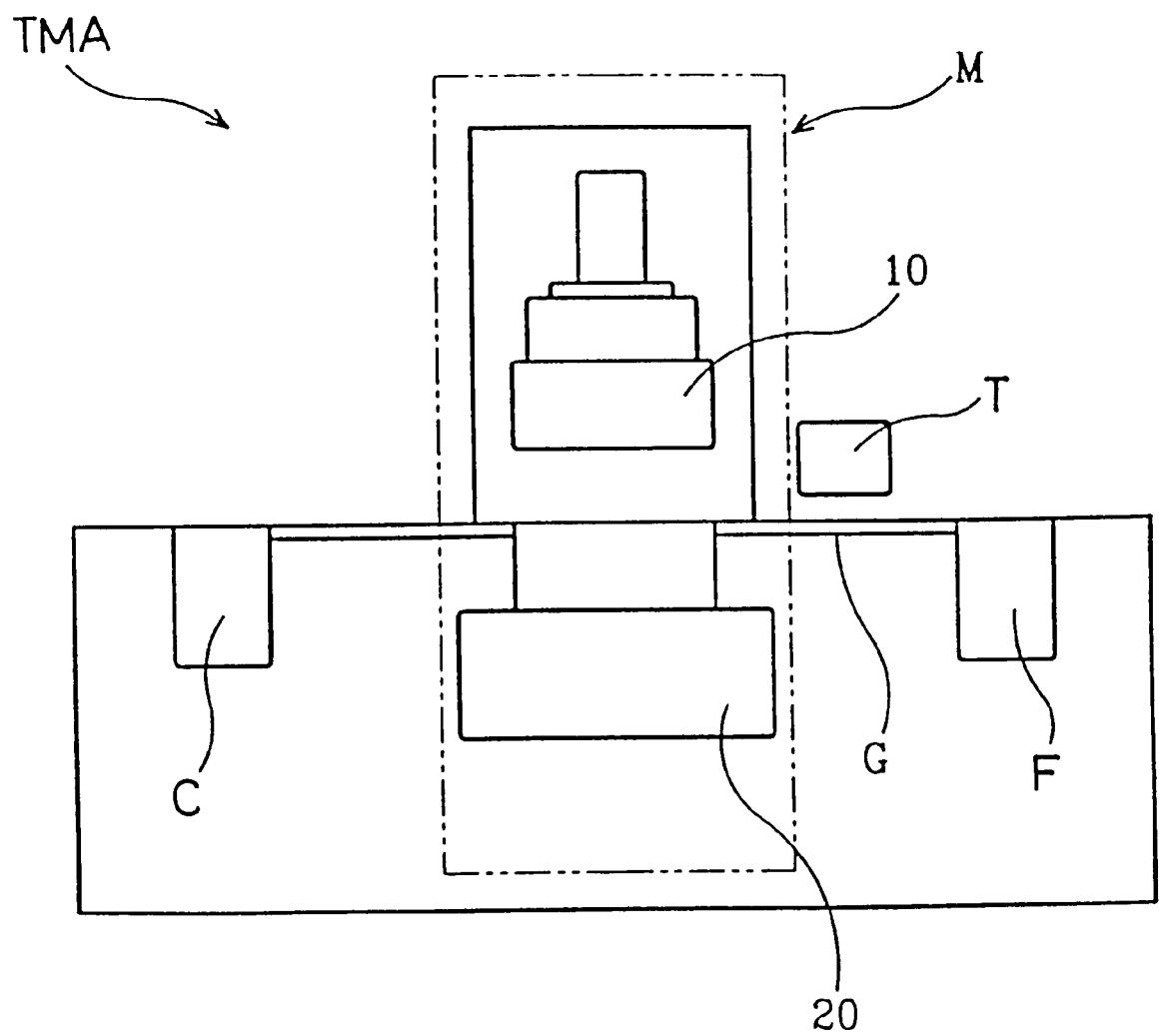
FIG. 33 is a schematic view illustrating a general automatic transfer type molding apparatus having a conventional configuration.
Figures 34A, 34B:
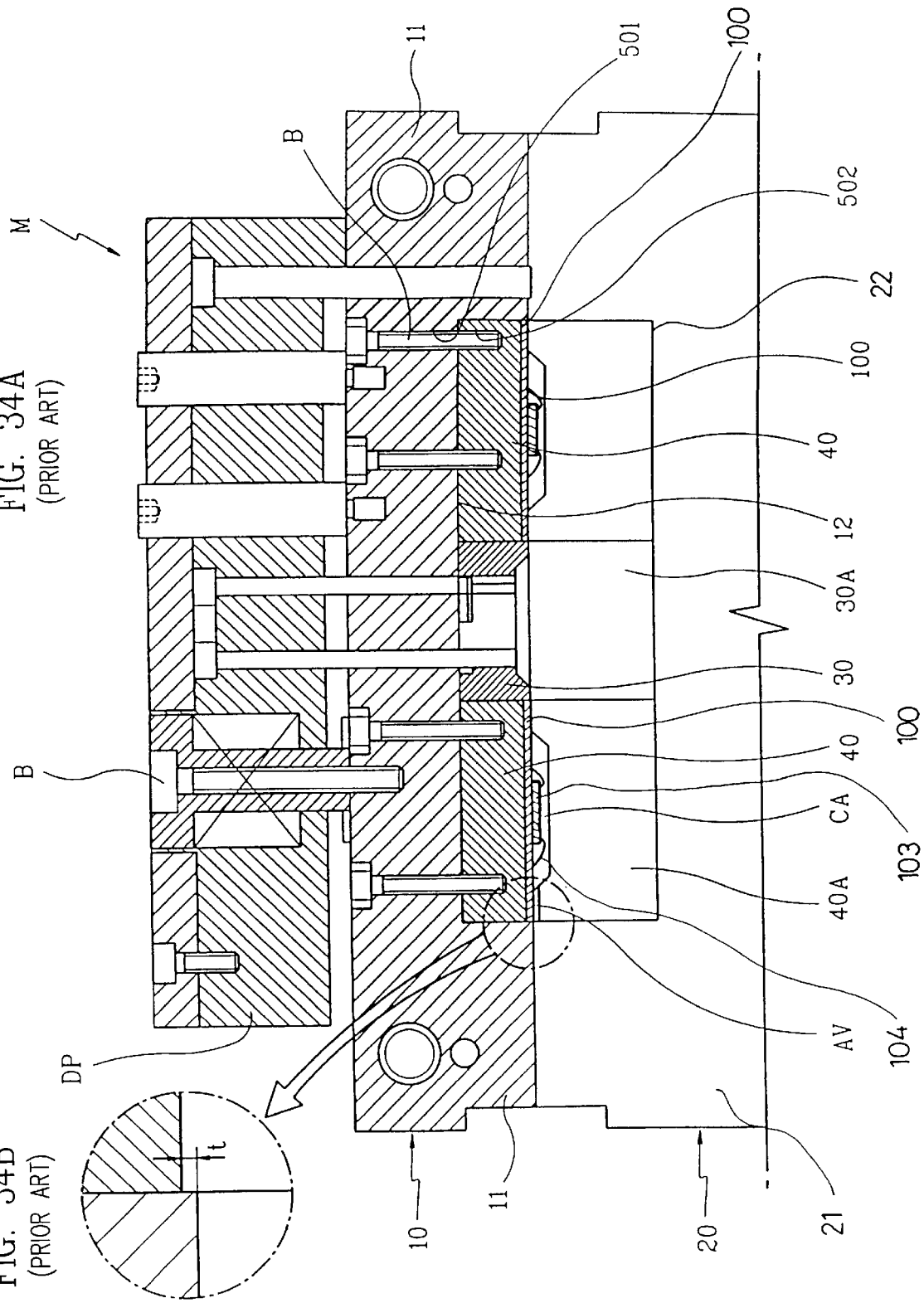
FIG. 34 is a sectional view illustrating coupled state of top and bottom molds included in the conventional automatic transfer type mold.
Figure 35:
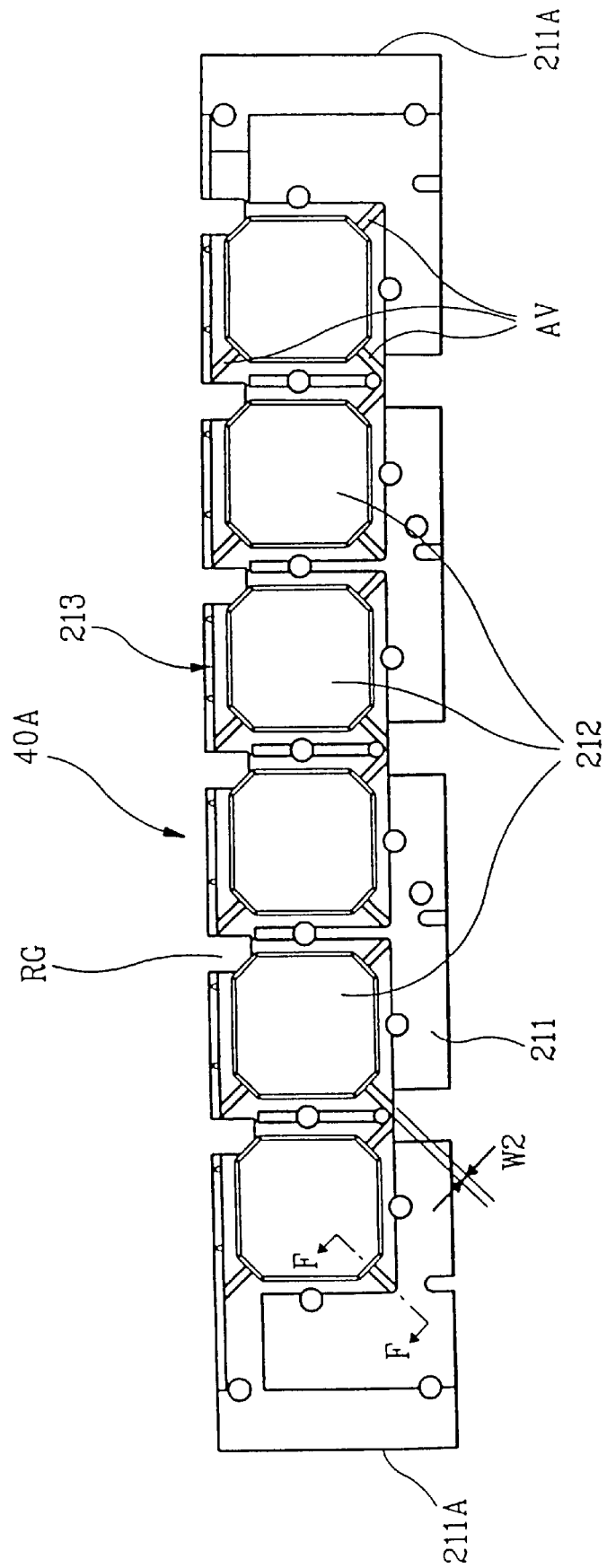
FIG. 35 is a plan view illustrating a the bottom cavity insert mounted in the bottom mold of FIG. 34.
Figure 36:
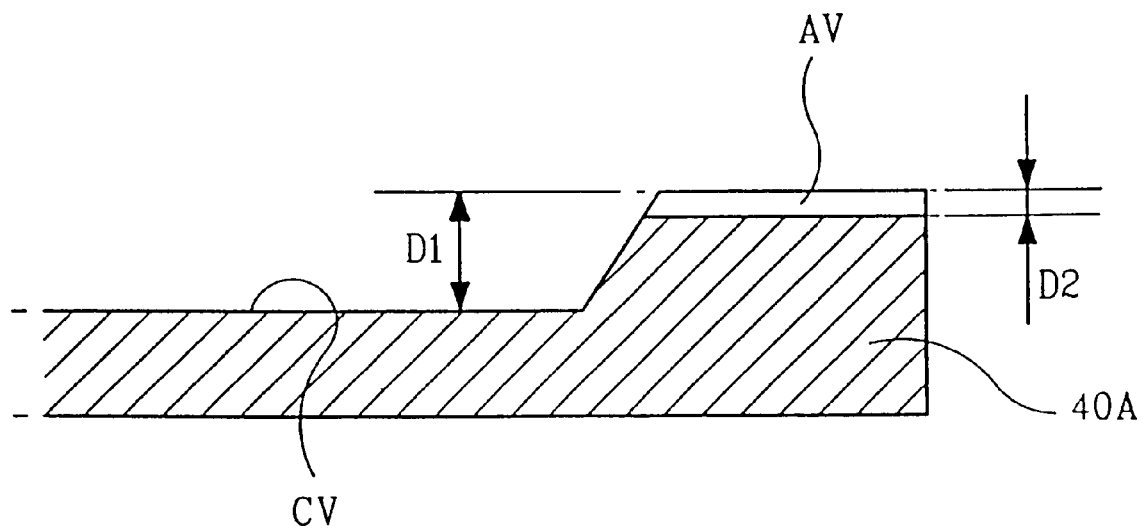
FIG. 36 is a cross-sectional view taken along the line F—F of FIG. 35.
Figure 37:
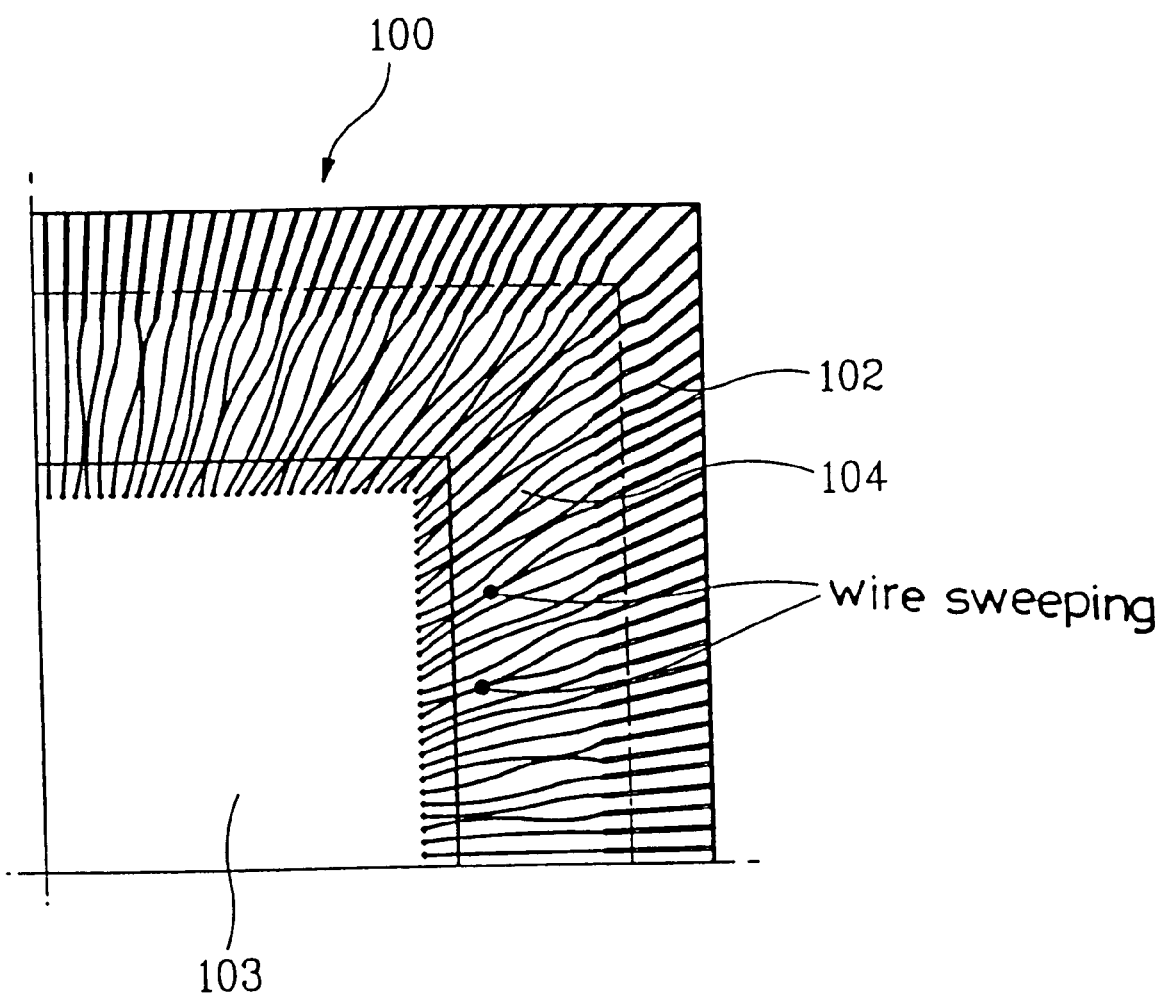
FIG. 37 is a partially-enlarged plan view illustrating, in a perspective manner, a degraded state in a semiconductor package obtained after molding a resin encapsulant using the conventional mold.
Figure 38:
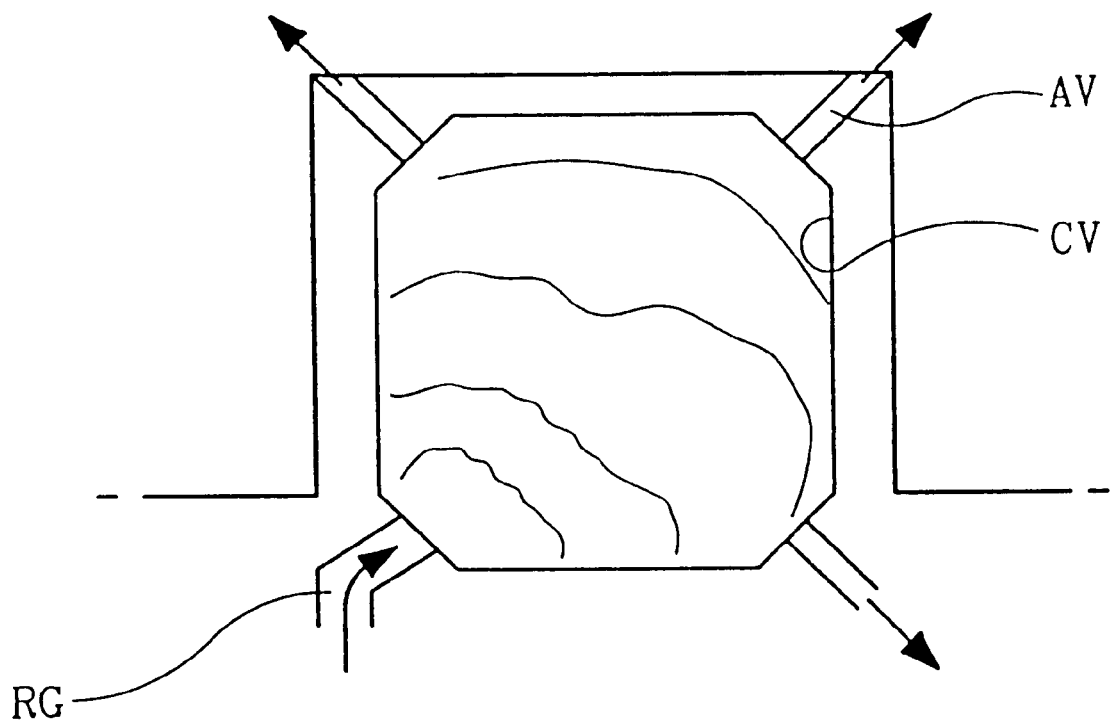
FIG. 38 is a schematic view illustrating a poor resin filling profile exhibited after molding a resin encapsulant by use of the conventional mold of FIG. 34 including the bottom cavity insert of FIG. 34.
Figure 39:
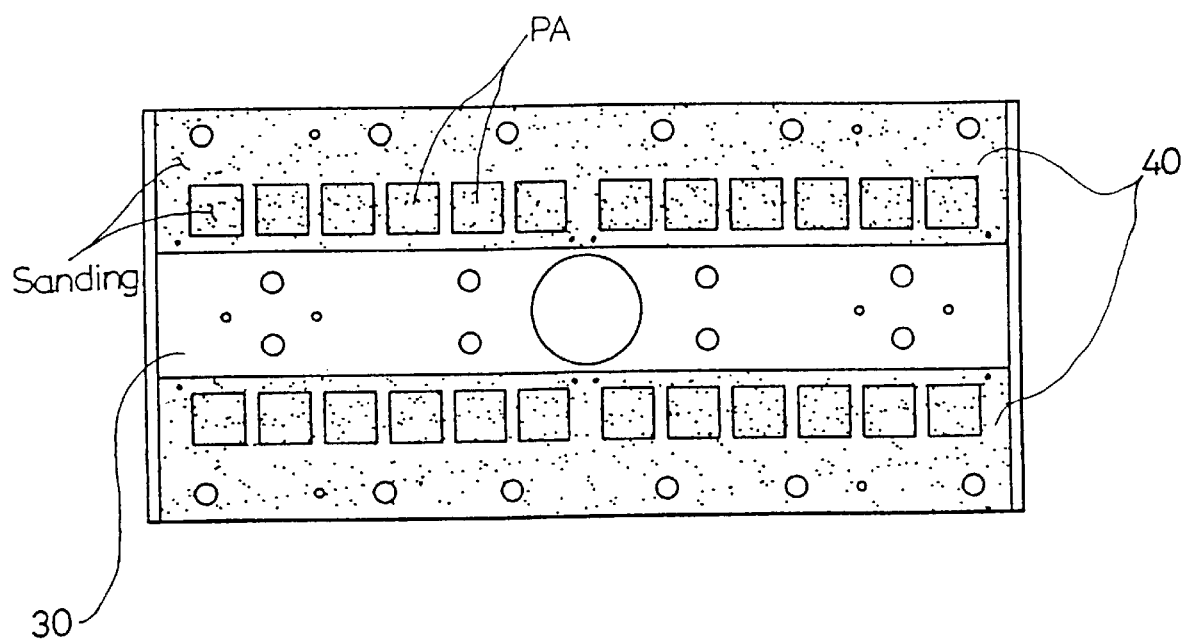
FIG. 39 is a bottom view illustrating a top cavity insert fitted in the recess of another conventional mold and provided with concave portions.
Figure 40:
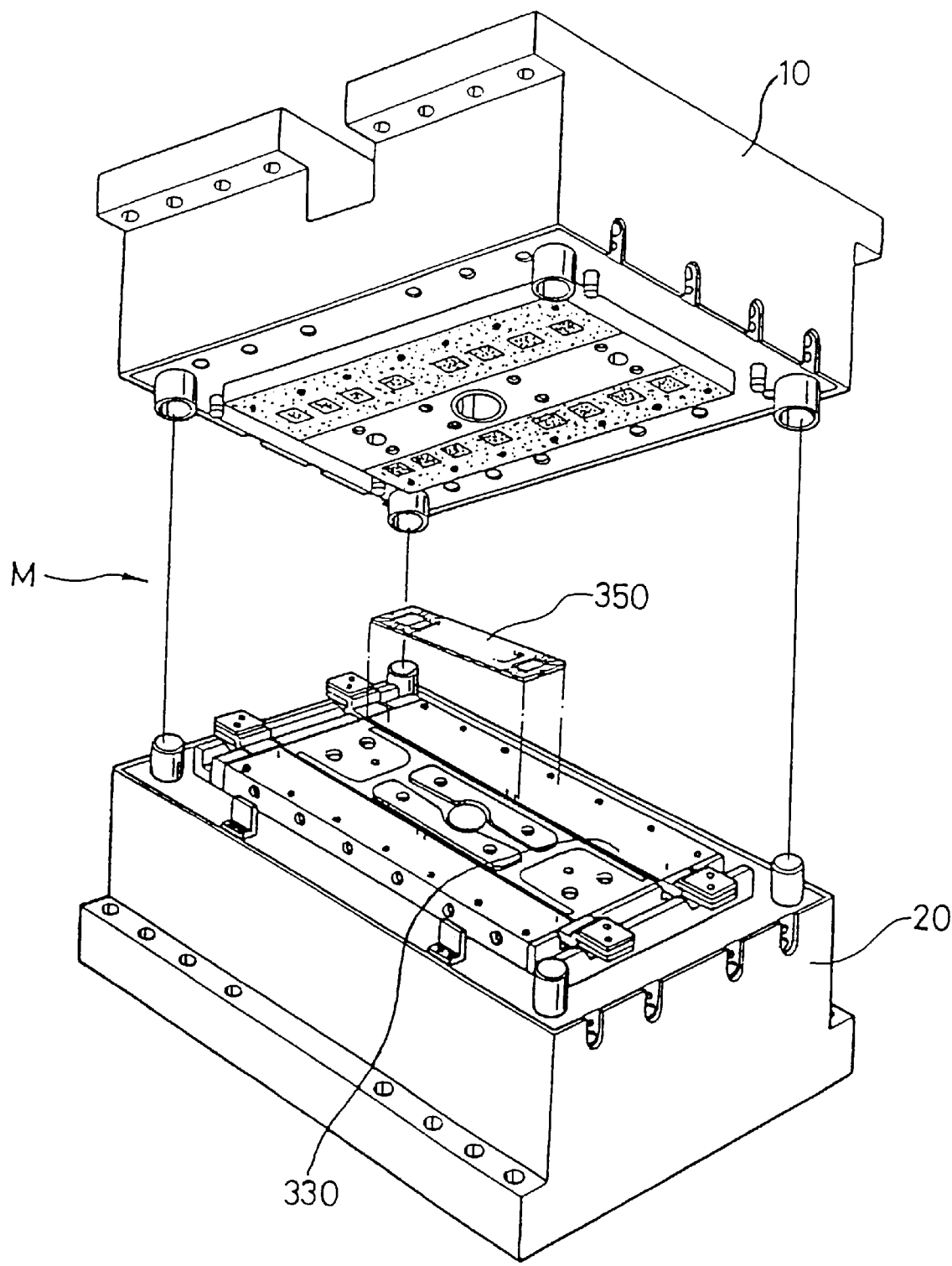
FIG. 40 is an exploded perspective view illustrating top and bottom molds included in another conventional mold.
Figure 41:
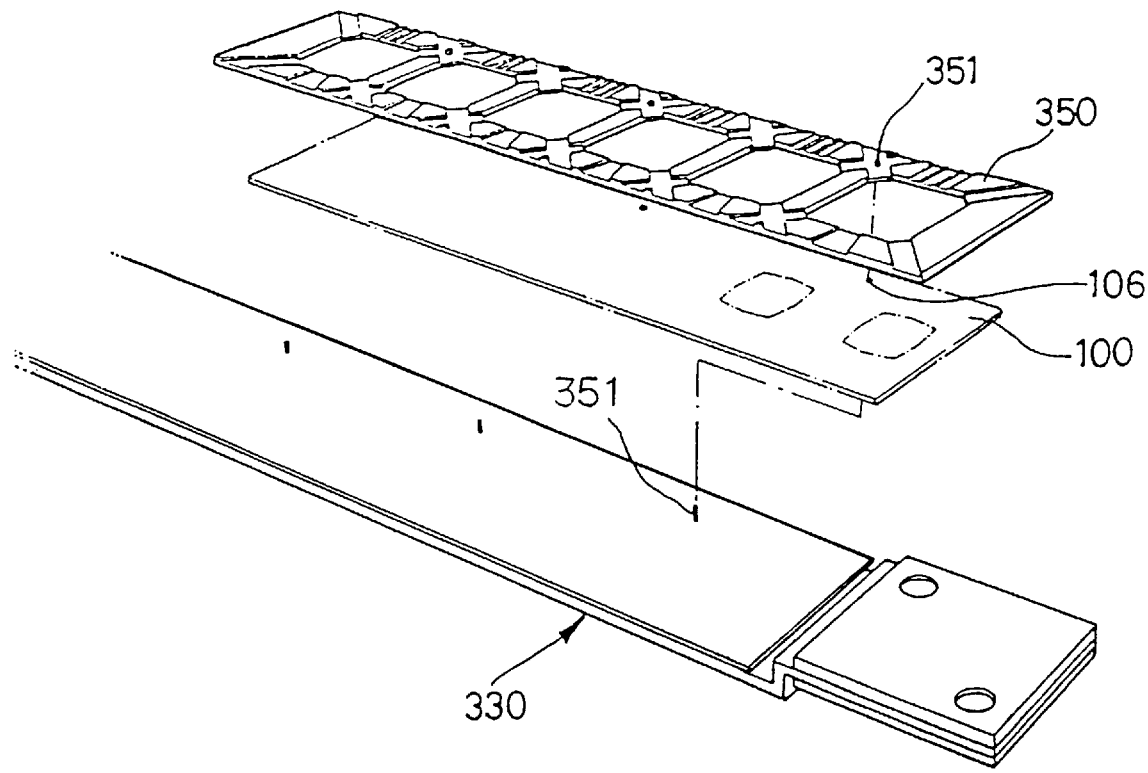
FIG. 41 is an exploded perspective view of a PCB strip interposed between the loading bar and cavity plate in the conventional mold of FIG. 40 upon its molding.
Figure 42:
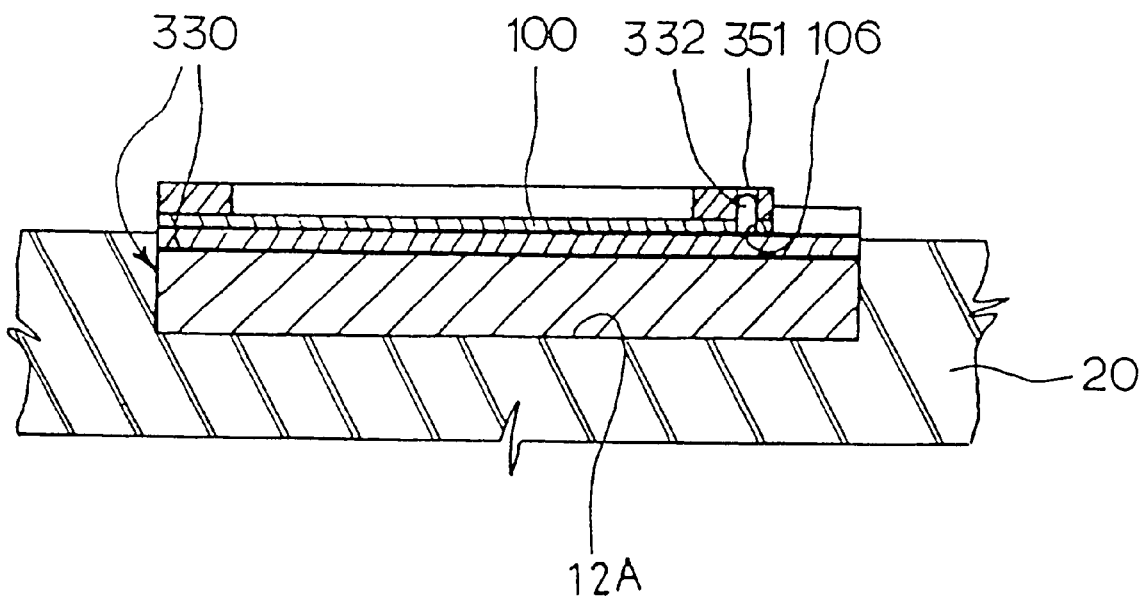
FIG. 42 is a sectional view illustrating a loaded state of the PCB strip shown in FIG. 41 in the conventional mold.

FIG. 26 is an exploded perspective view illustrating a manual transfer type mold M including top and bottom molds 10 and 20 in accordance with a seventh embodiment of the present invention. FIG. 32 is a sectional view illustrating a coupled state of the top and bottom molds 10 and 20 shown in FIG. 26. Since the basic configuration of the mold according to the seventh embodiment is identical to that according to the sixth embodiment, no detailed description thereof will be made.

Figure 27:
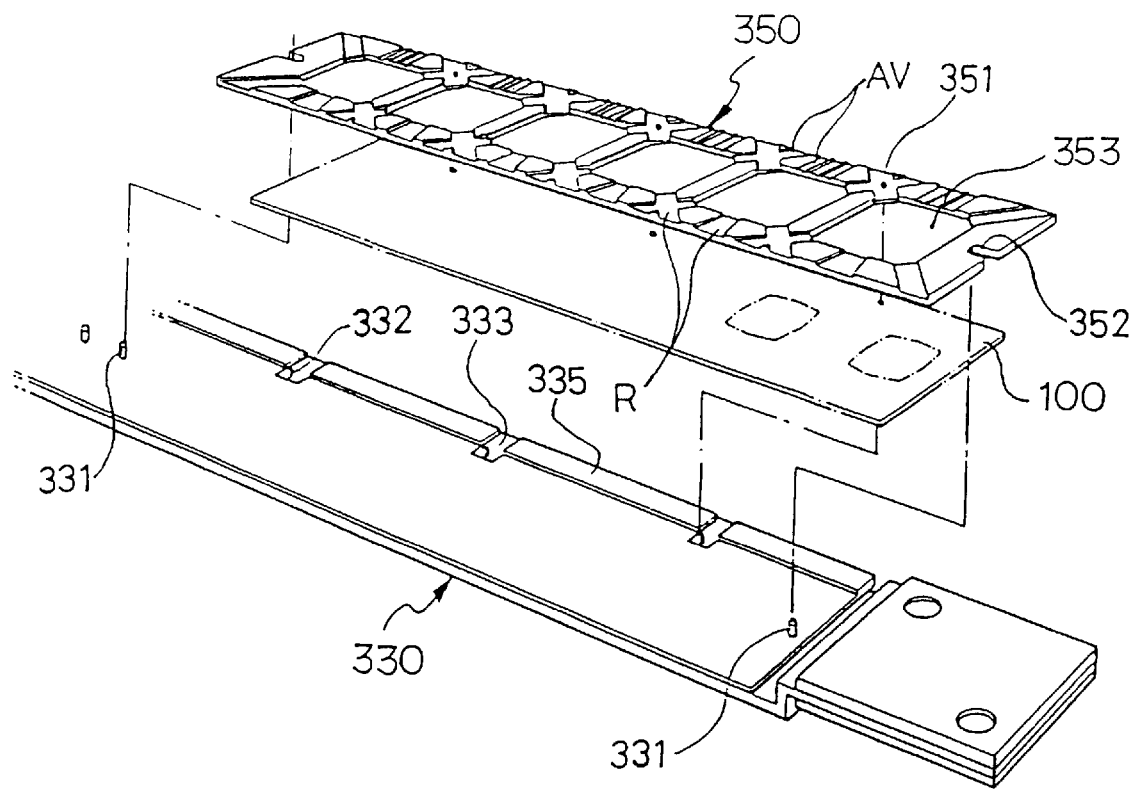
FIG. 27 is an exploded perspective view illustrating a loading bar mounted on the bottom mold according to the seventh embodiment of the present invention, a chip-mounted and wire-bonded PCB strip to be molded, and a cavity plate laid on the PCB strip.
Figure 28:
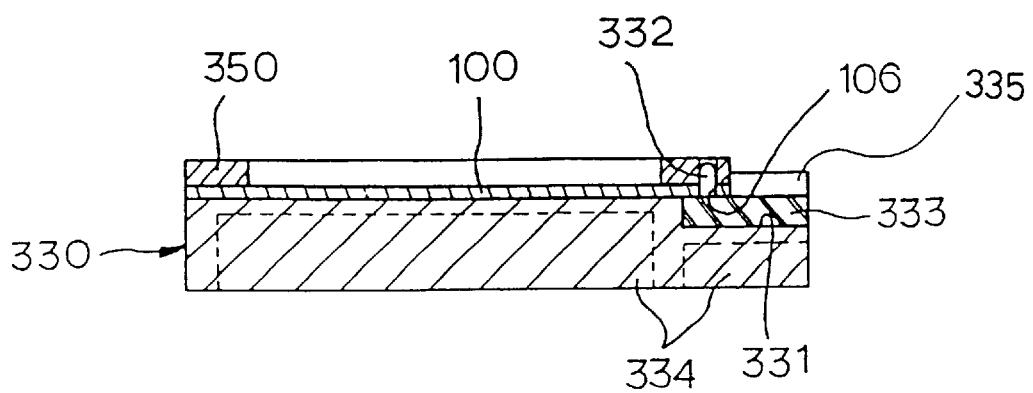
FIG. 28 is a lateral sectional view illustrating a loaded state of the PCB strip shown in FIG. 27.
Figure 29:
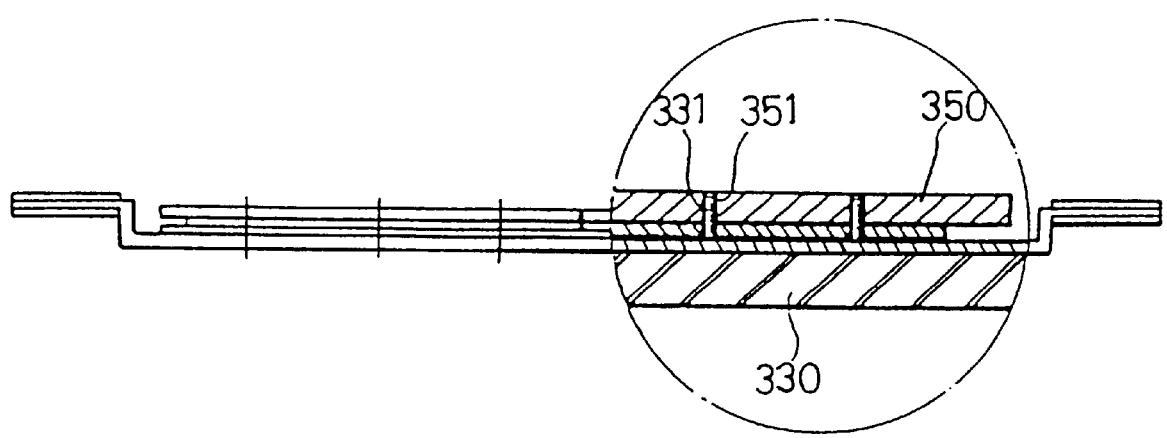
FIG. 29 is a longitudinal sectional view illustrating a loaded state of the PCB strip shown in FIG. 27.

FIG. 27 is an exploded perspective view illustrating a loading bar 330 mounted on the bottom mold 20, a chip-mounted and wire-bonded PCB strip 100 to be molded, and a cavity plate 350 laid on the PCB strip 100. FIGS. 28 and 29 are lateral and longitudinal sectional views respectively illustrating a loaded state of the PCB strip 100 shown in FIG. 27.

As shown in FIG. 27, the loading bar 330 is provided with at least one groove 333 at its upper surface on which a PCB strip 100 is laid. In the illustrated case, a plurality of grooves 333 are longitudinally arranged along one longitudinal edge of the loading bar 330. A fixing pin 332 is upwardly protruded from each groove 333 in order to fix the PCB strip 100 and cavity plate 350. A plurality of support blocks 335 are provided along the longitudinal edge of the loading bar 330 at portions of the loading bar 330 except for the portions where the grooves 333 is disposed. The support blocks 335 serve to guide and support the PCB strip 100. The loading bar 330 is also provided at its lower surface with a plurality of recesses 334. A pair of stoppers 331 are provided at opposite end portions of the upper surface of the loading bar 330.

Figure 31:
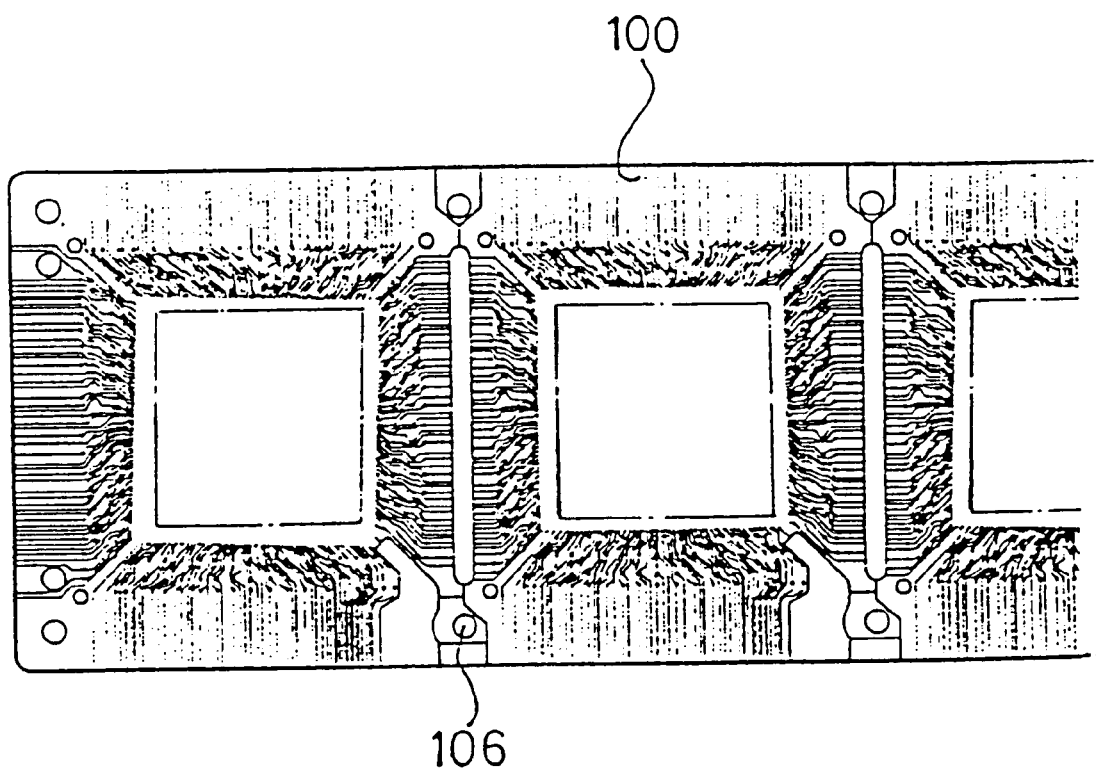
FIG. 31 is a plan view illustrating a PCB strip mounted for a molding thereof.

As shown in FIG. 31, the PCB strip 100 has a plurality of holes 106 adapted to receive the pins 332 of the loading bar 330. In the molding process, the PCB strip 100, in which mounting of semiconductor chips and bonding of wires have been carried out, is loaded on the loading bar 330 in such a manner that its holes 106 receive the associated pins 332 of the loading bar 330, respectively. In this state, the loading bar 330 is fixedly mounted in a manual manner on the bottom mold 20 in which a liner 320 has been mounted.

After mounting the loading bar 330, the cavity plate 350 is laid on the PCB strip 100. In this state, the bottom mold 20 is raised to be coupled to the top mold 10.

Since the loading bar 330 has a plurality of recesses 334, it has a reduced weight while having a function of distributing a clamping pressure applied thereto. Accordingly, it is possible to achieve an improvement in workability while preventing a deformation of the loading bar 330.

Since the pins 332, which are adapted to support the PCB strip 100, are formed on the bottom surfaces of the grooves 333 of the loading bar 330 between adjacent blocks 335, respectively, it is possible to effectively prevent the pins 332 from being damaged. Although the pins 332 are partially damaged, their replacement can be easily carried out. Accordingly, the workability of the loading bar 330 is improved in accordance with the seventh embodiment of the present invention.

Figures 30A, 30B:
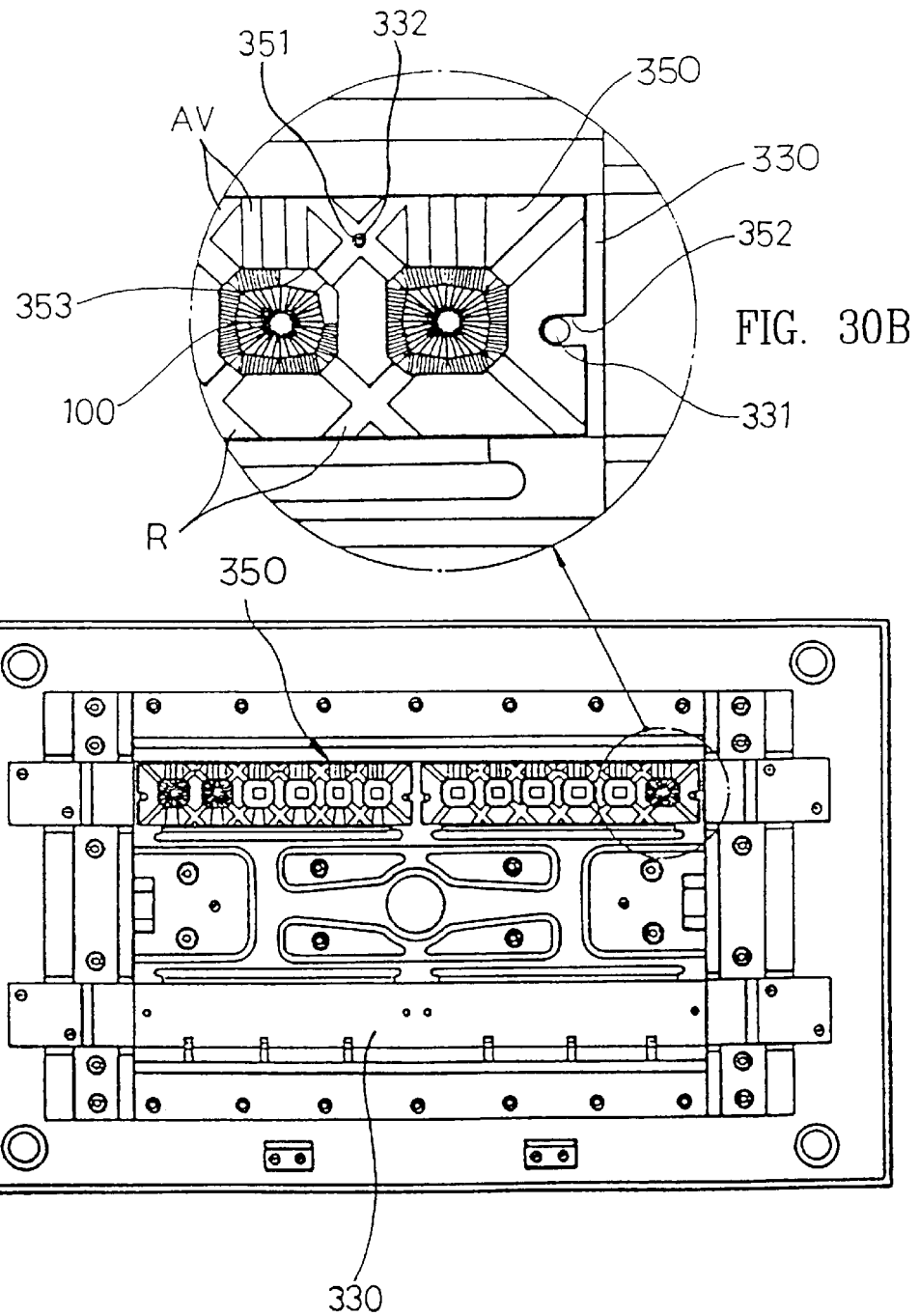
FIG. 30 is a plan view illustrating the mounted states of loading bars, PCB strips and cavity plates on the bottom mold in accordance with the seventh embodiment of the present invention.

FIG. 30 is a plan view illustrating the mounted states of loading bars 330, PCB strips 100 and cavity plates 350 on the bottom mold 20 in accordance with the seventh embodiment of the present invention. As shown in FIG. 30, a pair of stoppers 331 are provided at the opposite ends of each loading bar 330. Each cavity plate 350 has stopper grooves 352 respectively corresponding to the stoppers 331 at the opposite ends thereof. The cavity plate 350 also has a plurality of cavity regions 353 respectively having cavity openings corresponding to the pins 332 formed at one longitudinal edge portion of the loading bar 330. The cavity plate 350 is also provided with holes 351 respectively adapted to receive the pins 332. The holes 351 are arranged along one longitudinal edge of the cavity plate 350. A runner R is formed at one corner of each cavity region 353 of the cavity plate 350. Air vents AV are formed at the remaining corners of each cavity region 353.

In the above-mentioned configuration, a PCB strip 100 is laid on the loading bar 331 in such a manner that the pins 331 of the loading bar 330 extend upwardly through the holes 106 of the PCB strip 100. The cavity plate 350 is then laid on the PCB strip 100 in such a manner that the pins 331 of the loading bar 330 are received in the holes 351 of the cavity plate 350. In this state, the loading bar 330 is fixedly mounted to the bottom mold 20. Thereafter, the bottom mold 20 is raised to be coupled to the top mold 10. In this state, a molding resin is supplied to the cavity regions 353 through the runners R and then cured. Thus, molding of resin encapsulants having a desired shape is completed.

The holes 351 of the cavity plate 350 have a diameter slightly larger than the diameter of the pins 332 of the loading bar 330. Since the stopper grooves 352 formed at the opposite ends of the cavity plate 350 are engaged with the stoppers 331 formed at the opposite ends of the loading bar 330, the cavity plate 350 is firmly supported without any movement during the molding of packages.

Where the mold of the seventh embodiment, which includes a loading bar having longitudinally-extending blocks at the upper surface thereof and wide recesses at the lower surface thereof, and a cavity plate provided with stopper grooves at its opposite ends and adapted to ensure an accurate position setting, is used, it is possible to reduce the weight of the loading bar, thereby achieving an improvement in the workability upon molding resin encapsulants on PCB strips while preventing a deformation of the loading bar.

As apparent from the above description, the present invention provides an automatic or manual transfer type mold which includes a height adjusting member adapted to adjust the height of the top cavity insert of the top mold or the bottom cavity insert of the bottom mold, an elastic member disposed between the height adjusting member and associated insert, clamping regions of different heights formed at its top or bottom cavity insert, or air vents having a width and depth of an optimum ratio to the area and depth of cavities. Accordingly, it is possible to maintain an optimum and uniform clamping pressure between the top and bottom molds for a variety of PCB strips having a thickness deviation among different portions thereof or having various average thicknesses, upon molding resin encapsulants on those PCB strips, thereby achieving an improvement in the quality of finally produced packages while preventing a sweeping phenomenon of bonding wires electrically connecting a semiconductor chip to conductive traces.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A mold for fabricating ball grid array semiconductor packages, the mold including a top mold and a bottom mold to mold resin encapsulants on portions of a printed circuit board (PCB) strip respectively including semiconductor chip mounting regions, the PCB strip being mounted with a plurality of semiconductor chips at the semiconductor chip mounting regions, respectively, and bonded with wires adapted to electrically connect respective circuit patterns of the semiconductor chips to conductive traces, wherein:

the top mold comprises a top mold base provided at a lower surface thereof with a longitudinally extending recess, a top center block centrally disposed in the recess beneath the top mold base, a pair of detachable height adjusting members respectively disposed in the recess in opposite sides of the top center block, the height adjusting members having a flat plate shape, and a pair of top cavity inserts respectively disposed in the recess just beneath the height adjusting members;

each of the top cavity inserts has a lower surface positioned at a higher level than lower surfaces of the top mold and the top center block, thereby forming a step having a desired height;

the bottom mold comprises a bottom mold base provided at an upper surface thereof with a longitudinally extending recess, a bottom center block centrally disposed in the recess on the bottom mold base, and a pair of bottom cavity inserts respectively disposed in the recess in opposite sides of the bottom center block;

the bottom center block has a pot adapted to melt a molding resin, and a runner adapted as an elongated conduit for feeding the melted resin, and each of the bottom cavity inserts is provided at an upper surface thereof with a plurality of concave portions and clamping regions respectively disposed around the concave portions to define the concave portions, each of the concave portions communicating with the runner at one of the corners thereof while having air vents at the remaining corners thereof;

the clamping regions of the bottom cavity insert define, along with a lower surface of the top cavity insert, resin encapsulant molding cavities in which the semiconductor chips mounted on the PCB strip and electrically connected to the conductive traces are received, respectively, when the top and bottom molds are coupled to carry out a molding process; and each of the detachable height adjusting members has a thickness selected to provide the step defined between the lower surface of the top cavity insert and the lower surfaces of the top mold base and the top center block so that an optimum clamping pressure is applied to the PCB strip between the top and bottom molds in the molding process where the PCB strip has a thickness deviation among different portions thereof.

2. The mold in accordance with claim 1, wherein each of the top cavity inserts has a plurality of clamping holes while the top mold base and each of the height adjusting members have a plurality of through holes respectively corresponding to the clamping holes so that the top cavity insert is firmly coupled to the top mold base along with the associated height adjusting member by clamping members extending through the clamping holes and the through holes.

3. The mold in accordance with claim 1, wherein each of the clamping regions comprises clamping region portions having different heights.

4. The mold in accordance with claim 1, wherein each of the clamping regions comprises a first clamping region portion disposed at a portion of the PCB strip near each degating region of the PCB strip, a second clamping region disposed at a portion of the PCB strip facing the degating region, the second clamping region having a height smaller than the height of the first clamping region portion, and a third clamping region disposed at each of opposite lateral end portions of the PCB strip, the third clamping region having a height smaller than the height of the second clamping region, so as to offset a thickness deviation of different portions of the PCB strip, so that a uniform clamping pressure is applied over the whole clamping region in a coupled state of the top and bottom molds.

5. The mold in accordance with claim 1, wherein the air vents have a width corresponding to 3 to 20% of the width of the concave portions and a depth corresponding to 0.5 to 15% of the depth of the concave portions.

6. The mold in accordance with claim 1, wherein each of the bottom cavity inserts has a rough surface at an upper surface portion thereof corresponding to each of the concave portions and a smoothly polished surface portion at the other upper surface portion thereof.

7. The mold in accordance with claim 1, wherein each of the top cavity inserts consists of a plurality of top cavity insert members, and each of the bottom cavity inserts consists of a plurality of bottom cavity insert members.

8. The mold in accordance with claim 1, wherein the runner of each of the bottom cavity inserts has an inward protrusion at one side surface thereof, the inward protrusion serving to prevent the melted resin from being leaked from the runner.

9. The mold in accordance with claim 1, wherein:
the top mold comprises a top mold base provided at a lower surface thereof with a longitudinally extending recess, a top center block centrally disposed in the recess beneath the top mold base, and a pair of top cavity inserts respectively disposed in the recess in opposite sides of the top center block;
the bottom mold comprises a bottom mold base provided at an upper surface thereof with a longitudinally extending recess, a bottom center block centrally disposed in the recess on the bottom mold base, a pair of detachable height adjusting members respectively disposed in the recess in opposite sides of the bottom center block, the height adjusting members having a flat plate shape, and a pair of bottom cavity inserts respectively disposed in the recess just over the height adjusting members;
each of the top cavity inserts is provided at an upper surface thereof with a plurality of concave portions and clamping regions respectively disposed around the concave portions to define the concave portions, each of the concave portions communicating with the runner at one of corners thereof while having air vents at the remaining corners thereof; and
each of the bottom cavity inserts has an upper surface positioned at a lower level than flush upper surfaces of the bottom mold and the bottom center block, thereby forming a step having a desired height.

10. A mold for fabricating ball grid array semiconductor packages, the mold including a top mold and a bottom mold to mold resin encapsulants on portions of a printed circuit board (PCB) strip respectively including semiconductor chip mounting regions, the PCB strip being mounted with a plurality of semiconductor chips at the semiconductor chip mounting regions, respectively, and bonded with wires adapted to electrically connect respective circuit patterns of the semiconductor chips to conductive traces, wherein:
the top mold comprises a top mold base provided at a lower surface thereof with a longitudinally extending recess, a top center block centrally disposed in the recess beneath the top mold base, a pair of detachable height adjusting members respectively disposed in the recess in opposite sides of the top center block, the height adjusting members having a flat plate shape, and a pair of top cavity inserts respectively disposed in the recess just beneath the height adjusting members while being spaced from the height adjusting members, a pair of elastic members respectively disposed in spaces defined between the height adjusting members and the associated top cavity inserts by mounting members, and a plurality of clamping members adapted to mount the top cavity inserts to the top mold base in such a manner that the top cavity inserts are vertically slidable with respect to the top mold base;
each of the top cavity inserts has a lower surface positioned at a higher level than lower surfaces of the top mold and the top center block, thereby forming a step having a desired height;
the bottom mold comprises a bottom mold base provided at an upper surface thereof with a longitudinally extending recess, a bottom center block centrally disposed in the recess on the bottom mold base, and a pair of bottom cavity inserts respectively disposed in the recess in opposite sides of the bottom center block;
the bottom center block has a pot adapted to melt a molding resin, and a runner adapted as an elongated conduit for feeding the melted resin, and each of the bottom cavity inserts is provided at an upper surface thereof with a plurality of concave portions and clamping regions respectively disposed around the concave portions to define the concave portions, each of the concave portions communicating with the runner at one of corners thereof while having air vents at the remaining corners thereof;
the clamping regions of the bottom cavity insert define, along with a lower surface of the top cavity insert, resin encapsulant molding cavities in which the semiconductor chips mounted on the PCB strip and electrically connected to the conductive traces are received, respectively, when the top and bottom molds are coupled to carry out a molding process; and
an optimum and uniform clamping pressure is applied to the PCB strip between the top and bottom molds in the molding process where the PCB strip has a thickness deviation among different portions thereof, by virtue of the step defined between the lower surface of each of the top cavity inserts and the lower surfaces of the top mold base and the top center block by the associated detachable height adjusting member, the clamping members adapted to mount the top cavity inserts to the top mold base in such a manner that the top cavity inserts are vertically slidable with respect to the top mold base, and the mounting and clamping members elastically supporting the top cavity inserts.

11. The mold in accordance with claim 10, wherein:
the top mold base has through holes adapted to couple the top cavity inserts to the top mold base, each of the height adjusting members has first through holes at a portion thereof disposed adjacent to the top center block, and second through holes at a portion thereof disposed apart from the top center block, the second through holes of the height adjusting members corresponding to the through holes of the top mold base, respectively, and the top cavity inserts have clamping holes respectively corresponding to the through holes of the top mold base and the first through holes of the height adjusting members;

each of the mounting members has a head received in an associated one of the first through holes formed in the height adjusting members adjacent to the top center block, and a threaded end threadedly coupled to an associated one of the clamping holes of the top cavity inserts; and each of the clamping members extends through an associated one of the through holes formed in the top mold base and an associated one of the second through holes formed in the height adjusting member and has a threaded end threadedly coupled to an associated one of clamping holes formed in the top cavity inserts.

12. The mold in accordance with claim 11, wherein a washer is interposed between the head of each mounting member and the upper surface portion of each elastic member around each through hole formed in the elastic member, and a bush is interposed between each through hole formed in the elastic member and a portion of the mounting member received in the through hole beneath the washer.

13. The mold in accordance with claim 12, wherein the elastic member is a disc spring.

14. The mold in accordance with claim 11, wherein a spacer is fitted in each of the through holes formed in the top mold base in such a manner that an associated one of the clamping members extends through the spacer.

15. The mold in accordance with claim 10, wherein each of the clamping regions of each bottom cavity insert comprises clamping region portions having different heights.

16. The mold in accordance with claim 15, wherein each of the clamping regions comprises three clamping region portions having different heights, namely, a first clamping region portion disposed at a portion of the PCB strip near each degating region of the PCB strip, a second clamping region disposed at a portion of the PCB strip facing the degating region, the second clamping region having a height smaller than the height of the first clamping region portion, and a third clamping region disposed at each of opposite lateral end portions of the PCB strip, the third clamping region having a height smaller than the height of the second clamping region, so as to offset a thickness deviation of different portions of the PCB strip, so that a uniform clamping pressure is applied over the whole clamping regions in a coupled state of the top and bottom molds.

17. The mold in accordance with claim 10, wherein the air vents have a width corresponding to 3 to 20% of the width of the concave portions and a depth corresponding to 0.5 to 15% of the depth of the concave portions.

18. The mold in accordance with claim 10, wherein each of the bottom cavity inserts has a rough surface at an upper surface portion thereof corresponding to each of the concave portions and a smoothly polished surf ace portion at the other upper surface portion thereof.

19. The mold in accordance with claim 10, wherein each of the top cavity inserts consists of a plurality of top cavity insert members, and each of the bottom cavity inserts consists of a plurality of bottom cavity insert members.

20. The mold in accordance with claim 10, wherein the runner of each of the bottom cavity inserts has an inward protrusion at one side surface thereof, the inward protrusion serving to prevent the melted resin from being leaked from the runner.

21. The mold in accordance with claim 10, wherein:

the top mold comprises a top mold base provided at a lower surface thereof with a longitudinally extending recess, a top center block centrally disposed in the recess beneath the top mold base, and a pair of top cavity inserts respectively disposed in the recess in opposite sides of the top center block;

the bottom mold comprises a bottom mold base provided at an upper surface thereof with a longitudinally extending recess, a bottom center block centrally disposed in the recess on the bottom mold base, a pair of detachable height adjusting members respectively disposed in the recess in opposite sides of the bottom center block, the height adjusting members having a flat plate shape, and a pair of bottom cavity inserts respectively disposed in the recess just over the height adjusting members while being spaced from the height adjusting members, a pair of elastic members respectively disposed in spaces defined between the height adjusting members and the associated bottom cavity inserts by mounting members, and a plurality of clamping members adapted to mount the bottom cavity inserts to the bottom mold base; and each of the bottom cavity inserts has an upper surface positioned at a lower level than flush upper surfaces of the bottom mold and the bottom center block, thereby forming a step having a desired height.

22. A mold for fabricating ball grid array semiconductor packages, the mold including a top mold and a bottom mold to mold resin encapsulants on portions of a printed circuit board (PCB) strip respectively including semiconductor chip mounting regions, the PCB strip being mounted with a plurality of semiconductor chips at the semiconductor chip mounting regions, respectively, and bonded with wires adapted to electrically connect respective circuit patterns of the semiconductor chips to conductive traces, wherein:

the mold comprises the top and bottom molds, loading bars for mounting PCB strips, and cavity plates for supporting the PCB strips in cooperation with the loading bars in such a manner that each of the PCB strips is interposed between the associated loading bar and cavity plate;

the top mold comprises a top mold base provided at a lower surface thereof with a longitudinally extending recess, a top center block centrally disposed in the recess beneath the top mold base, and a pair of top cavity inserts respectively disposed in the recess in opposite sides of the top center block, each of the top cavity inserts having a plurality of packaging regions at a lower surface thereof;

the bottom mold comprises a bottom mold base, a pot centrally disposed on the bottom mold base in such a manner that it extends longitudinally, the pot serving to melt a molding resin, and a runner adapted to feed the melted molding resin;

each of the loading bars is mounted on the bottom mold base in opposite sides of the central portion of the bottom mold base extending in a longitudinal direction, and the loading bar is provided with at least one groove at one longitudinal edge portion of an upper surface thereof, on which a PCB strip is laid, a fixing pin upwardly protruded from a bottom surface of the groove and adapted to fix the PCB strip and the cavity plate laid on the PCB strip, and support blocks arranged along the longitudinal edge portion of the loading bar at portions of the loading bar except for the portion where the groove is disposed;

each of the cavity plates has at least one hole adapted to receive the pin formed on the associated loading bar, and a plurality of cavity regions respectively having cavity openings for molding resin encapsulants, and each of the cavity regions has a runner for feeding the melted molding resin and air vents; and a plurality of cavities, in which resin encapsulants are molded, are defined by the upper surface of the PCB strip mounted on each of the loading bars, surfaces of the associated cavity plate defining the cavity openings, and the packaging regions of the associated top cavity insert, respectively.

23. The mold in accordance with claim 22, wherein each of the top cavity inserts has a rough surface at a lower surface portion thereof corresponding to each of the packaging regions and a smoothly polished surface portion at the other lower surface portion thereof.

24. The mold in accordance with claim 22, wherein each of the top cavity inserts consists of a plurality of top cavity insert members.

25. The mold in accordance with claim 22, wherein the mold further comprises a pair of liners having a desired thickness and disposed beneath the loading bars, respectively, so that an optimum clamping pressure is applied to the PCB strips laid on the loading bars between the top and bottom molds in the molding process where the PCB strips have a variety of average thicknesses.

26. The mold in accordance with claim 25, wherein each of the liners has a thickness deviation for offsetting a thickness deviation of different portions of the PCB strip laid on the associated loading bar, so that a uniform clamping pressure is applied over the whole portion of the PCB strip in a coupled state of the top and bottom molds.

27. The mold in accordance with claim 25, wherein each of the liners comprises a plurality of separate liner portions.

28. The mold in accordance with claim 22, wherein each of the loading bars has at least one recess at a lower surface thereof, so as to achieve a reduction in the weight of the loading bar, a distribution of the clamping pressure, and a deformation of the PCB strip.

29. The mold in accordance with claim 22, wherein each of the loading bars has stoppers at opposite end portions of the upper surface of the loading bar, and each of the cavity plates has stopper grooves at opposite ends thereof, the stopper grooves receiving the stoppers of the associated loading bar, respectively.

* * * * *